(12) United States Patent
Heydari et al.

(10) Patent No.: US 12,575,061 B2
(45) Date of Patent: Mar. 10, 2026

(54) COOLING DISTRIBUTION WITH ADAPTIVE CONTROL VALVES

(71) Applicant: NVIDIA Corporation, Santa Clara, CA (US)

(72) Inventors: Ali Heydari, Albany, CA (US); Pardeep Shahi, Arlington, TX (US)

(73) Assignee: NVIDIA Corporation, Santa Clara, CA (US)

( * ) Notice: Subject to any disclaimer, the term of this patent is extended or adjusted under 35 U.S.C. 154(b) by 814 days.

(21) Appl. No.: 17/864,989

(22) Filed: Jul. 14, 2022

(65) Prior Publication Data

US 2024/0098934 A1 Mar. 21, 2024

(51) Int. Cl.
H05K 7/20 (2006.01)
G01F 1/34 (2006.01)

(52) U.S. Cl.
CPC ........... H05K 7/20272 (2013.01); G01F 1/34 (2013.01); H05K 7/20772 (2013.01); H05K 7/20281 (2013.01)

(58) Field of Classification Search
CPC .......... H05K 7/20272; H05K 7/20772; H05K 7/20281; G01F 1/34
USPC ........................................................ 165/287
See application file for complete search history.

(56) References Cited

U.S. PATENT DOCUMENTS

| | | | |
|---|---|---|---|
| 11,761,660 B2 * | 9/2023 | Drees ...................... | F24F 11/56 |
| | | | 700/276 |
| 2017/0059373 A1 * | 3/2017 | Freund ..................... | F24F 11/74 |
| 2019/0243430 A1 * | 8/2019 | Slaby ...................... | G06F 1/206 |
| 2022/0071063 A1 * | 3/2022 | Heydari ............. | H05K 7/20772 |

* cited by examiner

*Primary Examiner* — Joel M Attey
(74) *Attorney, Agent, or Firm* — Lowenstein Sandler LLP

(57) ABSTRACT

Systems and methods include pressure sensors that measure a pressure differential of coolant between a first coolant line and a second coolant line. Coolant flow control valves control respective valve flow rates. A processor selects a valve from the flow control valves to provide coolant to a coolant output, responsive to the measured pressure differential.

10 Claims, 50 Drawing Sheets

100

DATABASE
114

DATABASE
116

SERVER 112

COMPONENT
118

COMPONENT
120

COMPONENT
122

• • •

NETWORK(S)
110

102

104

106

108

DATA CENTER
200

APPLICATION LAYER 240

APPLICATION(s) 242

SOFTWARE LAYER 230

SOFTWARE 252

FRAMEWORK LAYER 220

JOB SCHEDULER 232 ← CONFIGURATION MANAGER 234

DISTRIBUTED FILE SYSTEM 238

RESOURCE MANAGER 236

DATA CENTER INFRASTRUCTURE LAYER 210

RESOURCE ORCHESTRATOR 212

GROUPED COMPUTING RESOURCES 214

NODE C.R. 216(1)    NODE C.R. 216(2)   • • •   NODE C.R. 216(N)

500C

706N

706B

702

704

706C

706A

1600

GRAPHICS PROCESSOR
2910

GRAPHICS PROCESSOR
2940

COOLING DISTRIBUTION WITH ADAPTIVE CONTROL VALVES

FIELD

The present disclosure generally relates to cooling systems, and, more particularly, to coolant flow controls in data center cooling systems.

BACKGROUND

Liquid cooling of data centers with high heat density equipment, particularly with dynamic heat loads and server configurations, makes use of cooling distribution units that can work in a wide range of operational conditions.

DETAILED DESCRIPTION

Figure 1:
FIG. 1 illustrates a distributed system, in accordance with at least one embodiment.

In the following description, numerous specific details are set forth to provide a more thorough understanding of at least one embodiment. However, it will be apparent to one skilled in the art that the inventive concepts may be practiced without one or more of these specific details.

Within data center cooling systems, different components work together to provide cooling to computing resources. For example, a coolant loop may distribute coolant between computing resources, housed on racks, using any appropriate arrangement of pipes, manifolds, pumps, and valves. This coolant loop may be understood as an internal or "secondary" cooling loop and may transfer heat that is generated by the computing resources.

Another coolant loop may transfer heat from the internal coolant loop to any appropriate heat rejector or chiller. This external or "primary" cooling loop interfaces with the internal cooling loop at a coolant distribution unit (CDU). The CDU may include any appropriate type of heat exchanger, such as a liquid-to-liquid heat exchanger, that can move heat from a relatively warm internal liquid to a relatively cool external liquid.

While CDUs may provide consistent coolant flow and temperature across a wide range of cooling loads, the CDU may have an upper limit and a lower limit in the cooling loads that it can manage. For example, when the load exceeds the capacity of the CDU, then the CDU may not be able to transfer heat from the internal coolant to the external coolant fast enough to keep up with waste heat that is generated in the data server. In another example, when the load falls below a lower capacity limit of the CDU, the CDU may not be able to maintain the temperature of the internal coolant within an expected range (e.g., $\pm 1°$ C.).

The CDU may have particular difficulty in tracking the changing coolant needs for dynamic loads when the coolant flow rate is low. In a data center environment, where there may be many different servers running diverse workloads, changes in local workload at one rack may result in a significant change to the cooling needs of the whole system. While a CDU may have the ability to regulate its own flow rate to compensate for these changing cooling needs, flow control may be handled external to the CDU in a manner that directly accounts for the actual load across the data center. This helps to keep the temperature of the secondary coolant loop from changing as a result of such fluctuations.

In at least some embodiments, a valve system may be used in the external cooling loop to control the flow of external coolant to the CDU. The valve system may include valves that correspond to different respective load regimes (e.g., high load, medium load, low load), and that control flow of the external coolant through the CDU. Thus, even at loads below the CDU's lower capacity limit, the valve system helps to maintain coolant flow through the CDU with low temperature fluctuations.

As the computing resources in the data center respond to their respective workloads, the amount of heat that the computing resources generate may vary. The valve system may detect and respond to these changes in heat generation using pressure sensors on the internal coolant loop, for example by detecting a pressure drop across the racks. A higher pressure drop may indicate a higher load, and so may correspond to a higher flow regime for the valve system.

Correspondingly, a lower pressure drop may indicate a lower load, and so may correspond to a lower flow regime for the valve system.

Servers and Data Centers

The following figures set forth, without limitation, exemplary network server and data center based systems that can be used to implement at least one embodiment.

FIG. 1 illustrates a distributed system 100, in accordance with at least one embodiment. In at least one embodiment, distributed system 100 includes one or more client computing devices 102, 104, 106, and 108, which are configured to execute and operate a client application such as a web browser, proprietary client, and/or variations thereof over one or more network(s) 110. In at least one embodiment, server 112 may be communicatively coupled with remote client computing devices 102, 104, 106, and 108 via network 110.

In at least one embodiment, server 112 may be adapted to run one or more services or software applications such as services and applications that may manage session activity of single sign-on (SSO) access across multiple data centers. In at least one embodiment, server 112 may also provide other services or software applications can include non-virtual and virtual environments. In at least one embodiment, these services may be offered as web-based or cloud services or under a Software as a Service (SaaS) model to users of client computing devices 102, 104, 106, and/or 108. In at least one embodiment, users operating client computing devices 102, 104, 106, and/or 108 may in turn utilize one or more client applications to interact with server 112 to utilize services provided by these components.

In at least one embodiment, software components 118, 120 and 122 of system 100 are implemented on server 112. In at least one embodiment, one or more components of system 100 and/or services provided by these components may also be implemented by one or more of client computing devices 102, 104, 106, and/or 108. In at least one embodiment, users operating client computing devices may then utilize one or more client applications to use services provided by these components. In at least one embodiment, these components may be implemented in hardware, firmware, software, or combinations thereof. It should be appreciated that various different system configurations are possible, which may be different from distributed system 100. The embodiment shown in FIG. 1 is thus one example of a distributed system for implementing an embodiment system and is not intended to be limiting.

In at least one embodiment, client computing devices 102, 104, 106, and/or 108 may include various types of computing systems. In at least one embodiment, a client computing device may include portable handheld devices (e.g., an iPhone®, cellular telephone, an iPad®, computing tablet, a personal digital assistant (PDA)) or wearable devices (e.g., a Google Glass® head mounted display), running software such as Microsoft Windows Mobile®, and/or a variety of mobile operating systems such as iOS, Windows Phone, Android, BlackBerry 10, Palm OS, and/or variations thereof. In at least one embodiment, devices may support various applications such as various Internet-related apps, e-mail, short message service (SMS) applications, and may use various other communication protocols. In at least one embodiment, client computing devices may also include general purpose personal computers including, by way of example, personal computers and/or laptop computers running various versions of Microsoft Windows®, Apple Macintosh®, and/or Linux operating systems. In at least one embodiment, client computing devices can be workstation computers running any of a variety of commercially-available UNIX® or UNIX-like operating systems, including without limitation a variety of GNU/Linux operating systems, such as Google Chrome OS. In at least one embodiment, client computing devices may also include electronic devices such as a thin-client computer, an Internet-enabled gaming system (e.g., a Microsoft Xbox gaming console with or without a Kinect® gesture input device), and/or a personal messaging device, capable of communicating over network(s) 110. Although distributed system 100 in FIG. 1 is shown with four client computing devices, any number of client computing devices may be supported. Other devices, such as devices with sensors, etc., may interact with server 112.

In at least one embodiment, network(s) 110 in distributed system 100 may be any type of network that can support data communications using any of a variety of available protocols, including without limitation TCP/IP (transmission control protocol/Internet protocol), SNA (systems network architecture), IPX (Internet packet exchange), AppleTalk, and/or variations thereof. In at least one embodiment, network(s) 110 can be a local-area network (LAN), networks based on Ethernet, Token-Ring, a wide-area network, Internet, a virtual network, a virtual private network (VPN), an intranet, an extranet, a public switched telephone network (PSTN), an infra-red network, a wireless network (e.g., a network operating under any of the Institute of Electrical and Electronics (IEEE) 802.11 suite of protocols, Bluetooth®, and/or any other wireless protocol), and/or any combination of these and/or other networks.

In at least one embodiment, server 112 may be composed of one or more general purpose computers, specialized server computers (including, by way of example, PC (personal computer) servers, UNIX® servers, mid-range servers, mainframe computers, rack-mounted servers, etc.), server farms, server clusters, or any other appropriate arrangement and/or combination. In at least one embodiment, server 112 can include one or more virtual machines running virtual operating systems, or other computing architectures involving virtualization. In at least one embodiment, one or more flexible pools of logical storage devices can be virtualized to maintain virtual storage devices for a server. In at least one embodiment, virtual networks can be controlled by server 112 using software defined networking. In at least one embodiment, server 112 may be adapted to run one or more services or software applications.

In at least one embodiment, server 112 may run any operating system, as well as any commercially available server operating system. In at least one embodiment, server 112 may also run any of a variety of additional server applications and/or mid-tier applications, including HTTP (hypertext transport protocol) servers, FTP (file transfer protocol) servers, CGI (common gateway interface) servers, JAVA® servers, database servers, and/or variations thereof. In at least one embodiment, exemplary database servers include without limitation those commercially available from Oracle, Microsoft, Sybase, IBM (International Business Machines), and/or variations thereof.

In at least one embodiment, server 112 may include one or more applications to analyze and consolidate data feeds and/or event updates received from users of client computing devices 102, 104, 106, and 108. In at least one embodiment, data feeds and/or event updates may include, but are not limited to, Twitter® feeds, Facebook® updates or real-time updates received from one or more third party information sources and continuous data streams, which may include real-time events related to sensor data applications, financial tickers, network performance measuring tools (e.g., network monitoring and traffic management applications), clickstream analysis tools, automobile traffic monitoring, and/or variations thereof. In at least one embodiment, server 112 may also include one or more applications to display data feeds and/or real-time events via one or more display devices of client computing devices 102, 104, 106, and 108.

In at least one embodiment, distributed system 100 may also include one or more databases 114 and 116. In at least one embodiment, databases may provide a mechanism for storing information such as user interactions information, usage patterns information, adaptation rules information, and other information. In at least one embodiment, databases 114 and 116 may reside in a variety of locations. In at least one embodiment, one or more of databases 114 and 116 may reside on a non-transitory storage medium local to (and/or resident in) server 112. In at least one embodiment, databases 114 and 116 may be remote from server 112 and in communication with server 112 via a network-based or dedicated connection. In at least one embodiment, databases 114 and 116 may reside in a storage-area network (SAN). In at least one embodiment, any necessary files for performing functions attributed to server 112 may be stored locally on server 112 and/or remotely, as appropriate. In at least one embodiment, databases 114 and 116 may include relational databases, such as databases that are adapted to store, update, and retrieve data in response to SQL-formatted commands.

Figure 2:
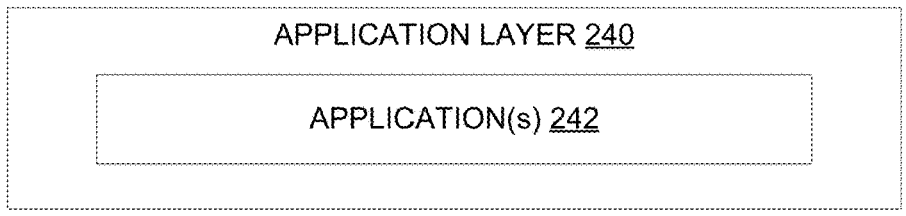
FIG. 2 illustrates an exemplary data center, in accordance with at least one embodiment.
Figure 2:
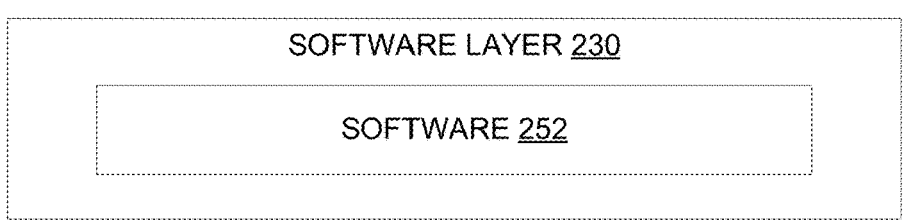
Figure 2:
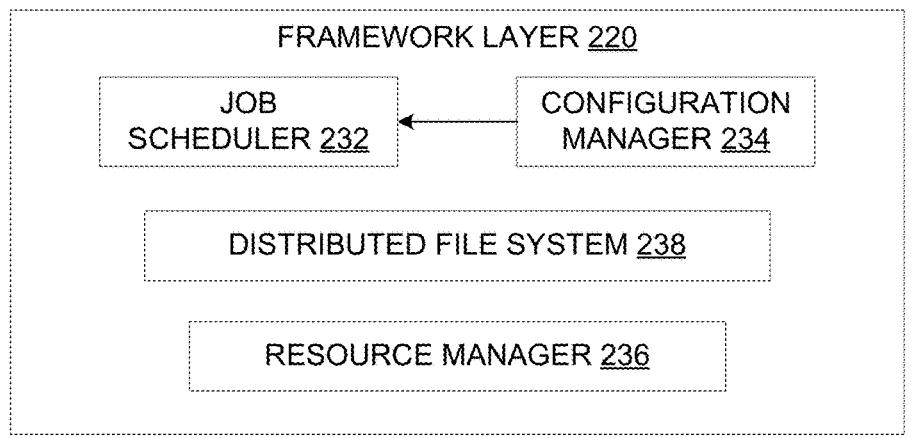
Figure 2:
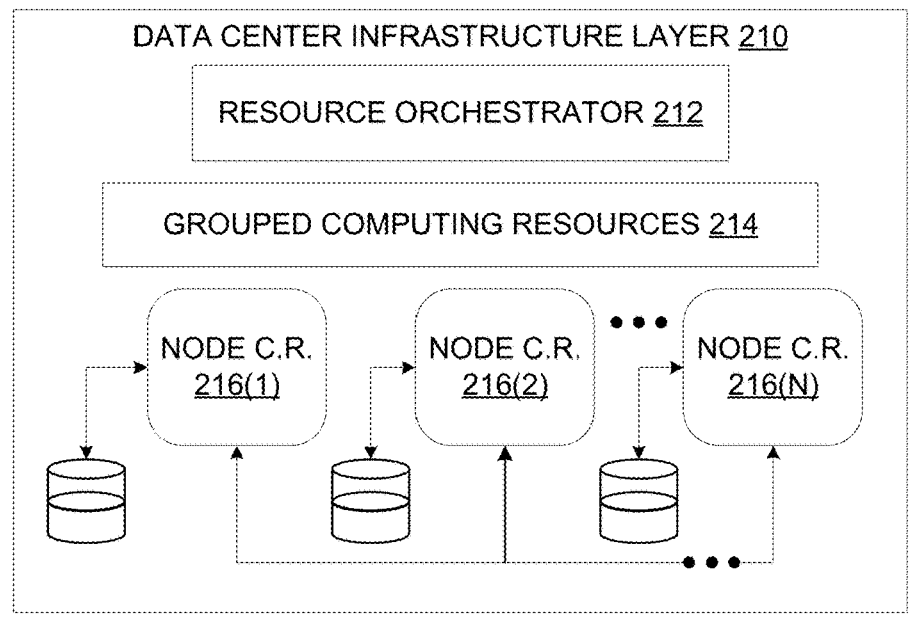

FIG. 2 illustrates an exemplary data center 200, in accordance with at least one embodiment. In at least one embodiment, data center 200 includes, without limitation, a data center infrastructure layer 210, a framework layer 220, a software layer 230 and an application layer 240.

In at least one embodiment, as shown in FIG. 2, data center infrastructure layer 210 may include a resource orchestrator 212, grouped computing resources 214, and node computing resources ("node C.R.s") 216(1)-216(N), where "N" represents any whole, positive integer. In at least one embodiment, node C.R.s 216(1)-216(N) may include, but are not limited to, any number of central processing units ("CPUs") or other processors (including accelerators, field programmable gate arrays ("FPGAs"), graphics processors, etc.), memory devices (e.g., dynamic read-only memory), storage devices (e.g., solid state or disk drives), network input/output ("NW I/O") devices, network switches, virtual machines ("VMs"), power modules, and cooling modules, etc. In at least one embodiment, one or more node C.R.s from among node C.R.s 216(1)-216(N) may be a server having one or more of above-mentioned computing resources.

In at least one embodiment, grouped computing resources 214 may include separate groupings of node C.R.s housed within one or more racks (not shown), or many racks housed in data centers at various geographical locations (also not shown). Separate groupings of node C.R.s within grouped computing resources 214 may include grouped compute, network, memory or storage resources that may be configured or allocated to support one or more workloads. In at least one embodiment, several node C.R.s including CPUs or processors may grouped within one or more racks to provide compute resources to support one or more workloads. In at least one embodiment, one or more racks may also include any number of power modules, cooling modules, and network switches, in any combination.

In at least one embodiment, resource orchestrator 212 may configure or otherwise control one or more node C.R.s 216(1)-216(N) and/or grouped computing resources 214. In at least one embodiment, resource orchestrator 212 may include a software design infrastructure ("SDI") management entity for data center 200. In at least one embodiment, resource orchestrator 212 may include hardware, software or some combination thereof.

In at least one embodiment, as shown in FIG. 2, framework layer 220 includes, without limitation, a job scheduler 232, a configuration manager 234, a resource manager 236 and a distributed file system 238. In at least one embodiment, framework layer 220 may include a framework to support software 252 of software layer 230 and/or one or more application(s) 242 of application layer 240. In at least one embodiment, software 252 or application(s) 242 may respectively include web-based service software or applications, such as those provided by Amazon Web Services, Google Cloud and Microsoft Azure. In at least one embodiment, framework layer 220 may be, but is not limited to, a type of free and open-source software web application framework such as Apache Spark™ (hereinafter "Spark") that may utilize distributed file system 238 for large-scale data processing (e.g., "big data"). In at least one embodiment, job scheduler 232 may include a Spark driver to facilitate scheduling of workloads supported by various layers of data center 200. In at least one embodiment, configuration manager 234 may be capable of configuring different layers such as software layer 230 and framework layer 220, including Spark and distributed file system 238 for supporting large-scale data processing. In at least one embodiment, resource manager 236 may be capable of managing clustered or grouped computing resources mapped to or allocated for support of distributed file system 238 and job scheduler 232. In at least one embodiment, clustered or grouped computing resources may include grouped computing resource 214 at data center infrastructure layer 210. In at least one embodiment, resource manager 236 may coordinate with resource orchestrator 212 to manage these mapped or allocated computing resources.

In at least one embodiment, software 252 included in software layer 230 may include software used by at least portions of node C.R.s 216(1)-216(N), grouped computing resources 214, and/or distributed file system 238 of framework layer 220. One or more types of software may include, but are not limited to, Internet web page search software, e-mail virus scan software, database software, and streaming video content software.

In at least one embodiment, application(s) 242 included in application layer 240 may include one or more types of applications used by at least portions of node C.R.s 216(1)-216(N), grouped computing resources 214, and/or distributed file system 238 of framework layer 220. In at least one or more types of applications may include, without limitation, CUDA applications, 5G network applications, artificial intelligence application, data center applications, and/or variations thereof.

In at least one embodiment, any of configuration manager 234, resource manager 236, and resource orchestrator 212 may implement any number and type of self-modifying actions based on any amount and type of data acquired in any technically feasible fashion. In at least one embodiment, self-modifying actions may relieve a data center operator of data center 200 from making possibly bad configuration decisions and possibly avoiding underutilized and/or poor performing portions of a data center.

Figure 3:
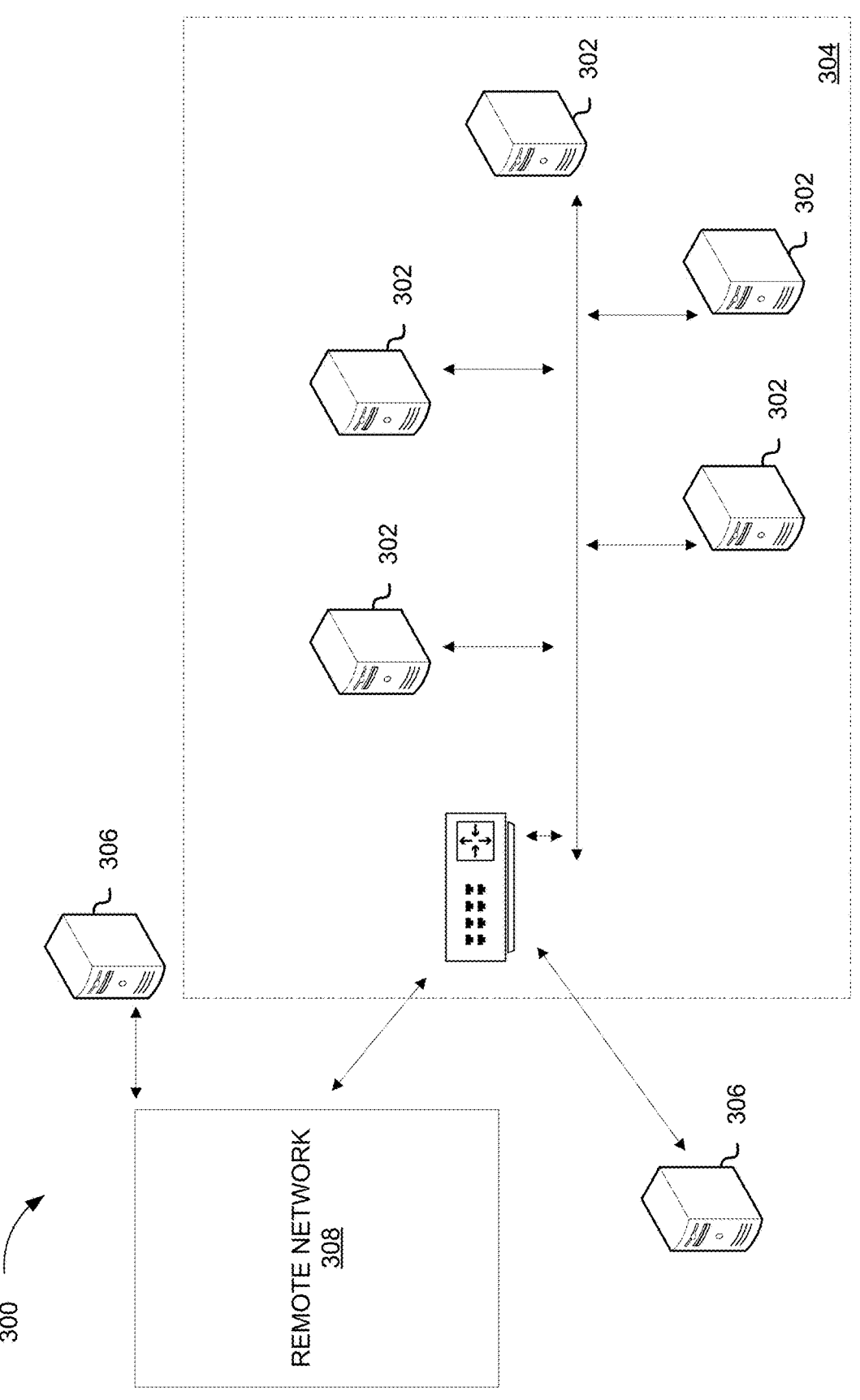
FIG. 3 illustrates a client-server network, in accordance with at least one embodiment.

FIG. 3 illustrates a client-server network 304 formed by a plurality of network server computers 302 which are interlinked, in accordance with at least one embodiment. In at least one embodiment, each network server computer 302 stores data accessible to other network server computers 302 and to client computers 306 and networks 308 which link into a wide area network 304. In at least one embodiment, configuration of a client-server network 304 may change over time as client computers 306 and one or more networks 308 connect and disconnect from a network 304, and as one or more trunk line server computers 302 are added or removed from a network 304. In at least one embodiment, when a client computer 306 and a network 308 are connected with network server computers 302, client-server network includes such client computer 306 and network 308. In at least one embodiment, the term computer includes any device or machine capable of accepting data, applying prescribed processes to data, and supplying results of processes.

In at least one embodiment, client-server network 304 stores information which is accessible to network server computers 302, remote networks 308 and client computers 306. In at least one embodiment, network server computers 302 are formed by main frame computers minicomputers, and/or microcomputers having one or more processors each. In at least one embodiment, server computers 302 are linked together by wired and/or wireless transfer media, such as conductive wire, fiber optic cable, and/or microwave transmission media, satellite transmission media or other conductive, optic or electromagnetic wave transmission media. In at least one embodiment, client computers 306 access a network server computer 302 by a similar wired or a wireless transfer medium. In at least one embodiment, a client computer 306 may link into a client-server network 304 using a modem and a standard telephone communication network. In at least one embodiment, alternative carrier systems such as cable and satellite communication systems also may be used to link into client-server network 304. In at least one embodiment, other private or time-shared carrier systems may be used. In at least one embodiment, network 304 is a global information network, such as the Internet. In at least one embodiment, network is a private intranet using similar protocols as the Internet, but with added security measures and restricted access controls. In at least one embodiment, network 304 is a private, or semi-private network using proprietary communication protocols.

In at least one embodiment, client computer 306 is any end user computer, and may also be a mainframe computer, mini-computer or microcomputer having one or more microprocessors. In at least one embodiment, server computer 302 may at times function as a client computer accessing another server computer 302. In at least one embodiment, remote network 308 may be a local area network, a network added into a wide area network through an independent service provider (ISP) for the Internet, or another group of computers interconnected by wired or wireless transfer media having a configuration which is either fixed or changing over time. In at least one embodiment, client computers 306 may link into and access a network 304 independently or through a remote network 308.

Figure 4:
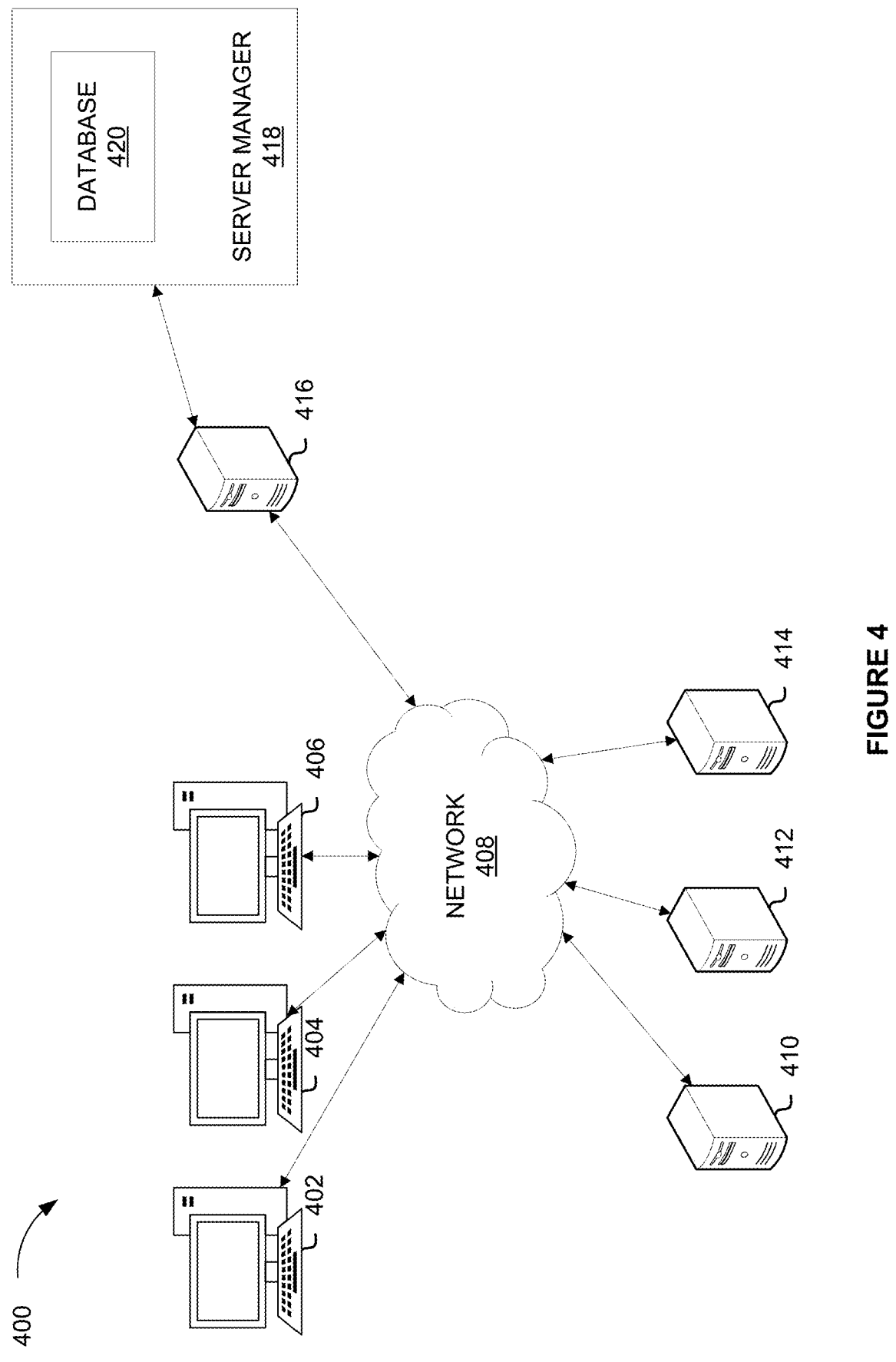
FIG. 4 illustrates a computer network, in accordance with at least one embodiment.

FIG. 4 illustrates a computer network 408 connecting one or more computing machines, in accordance with at least one embodiment. In at least one embodiment, network 408 may be any type of electronically connected group of computers including, for instance, the following networks: Internet, Intranet, Local Area Networks (LAN), Wide Area Networks (WAN) or an interconnected combination of these network types. In at least one embodiment, connectivity within a network 408 may be a remote modem, Ethernet (IEEE 802.3), Token Ring (IEEE 802.5), Fiber Distributed Datalink Interface (FDDI), Asynchronous Transfer Mode (ATM), or any other communication protocol. In at least one embodiment, computing devices linked to a network may be desktop, server, portable, handheld, set-top box, personal digital assistant (PDA), a terminal, or any other desired type or configuration. In at least one embodiment, depending on their functionality, network connected devices may vary widely in processing power, internal memory, and other performance aspects. In at least one embodiment, communications within a network and to or from computing devices connected to a network may be either wired or wireless. In at least one embodiment, network 408 may include, at least in part, the world-wide public Internet which generally connects a plurality of users in accordance with a client-server model in accordance with a transmission control protocol/internet protocol (TCP/IP) specification. In at least one embodiment, client-server network is a dominant model for communicating between two computers. In at least one embodiment, a client computer ("client") issues one or more commands to a server computer ("server"). In at least one embodiment, server fulfills client commands by accessing available network resources and returning information to a client pursuant to client commands. In at least one embodiment, client computer systems and network resources resident on network servers are assigned a network address for identification during communications between elements of a network. In at least one embodiment, communications from other network connected systems to servers will include a network address of a relevant server/network resource as part of communication so that an appropriate destination of a data/request is identified as a recipient. In at least one embodiment, when a network 408 comprises the global Internet, a network address is an IP address in a TCP/IP format which may, at least in part, route data to an e-mail account, a website, or other Internet tool resident on a server. In at least one embodiment, information and services which are resident on network servers may be available to a web browser of a client computer through a domain name (e.g. www.site.com) which maps to an IP address of a network server.

In at least one embodiment, a plurality of clients 402, 404, and 406 are connected to a network 408 via respective communication links. In at least one embodiment, each of these clients may access a network 408 via any desired form of communication, such as via a dial-up modem connection, cable link, a digital subscriber line (DSL), wireless or satellite link, or any other form of communication. In at least one embodiment, each client may communicate using any machine that is compatible with a network 408, such as a personal computer (PC), work station, dedicated terminal, personal data assistant (PDA), or other similar equipment. In at least one embodiment, clients 402, 404, and 406 may or may not be located in a same geographical area.

In at least one embodiment, a plurality of servers 410, 412, and 414 are connected to a network 408 to serve clients that are in communication with a network 408. In at least one embodiment, each server is typically a powerful computer or device that manages network resources and responds to client commands. In at least one embodiment, servers include computer readable data storage media such as hard disk drives and RAM memory that store program instructions and data. In at least one embodiment, servers 410, 412, 414 run application programs that respond to client commands. In at least one embodiment, server 410 may run a web server application for responding to client requests for HTML pages and may also run a mail server application for receiving and routing electronic mail. In at least one embodiment, other application programs, such as an FTP server or a media server for streaming audio/video data to clients may also be running on a server 410. In at least one embodiment, different servers may be dedicated to performing different tasks. In at least one embodiment, server 410 may be a dedicated web server that manages resources relating to web sites for various users, whereas a server 412 may be dedicated to provide electronic mail (email) management. In at least one embodiment, other servers may be dedicated for media (audio, video, etc.), file transfer protocol (FTP), or a combination of any two or more services that are typically available or provided over a network. In at least one embodiment, each server may be in a location that is the same as or different from that of other servers. In at least one embodiment, there may be multiple servers that perform mirrored tasks for users, thereby relieving congestion or minimizing traffic directed to and from a single server. In at least one embodiment, servers 410, 412, 414 are under control of a web hosting provider in a business of maintaining and delivering third party content over a network 408.

In at least one embodiment, web hosting providers deliver services to two different types of clients. In at least one embodiment, one type, which may be referred to as a browser, requests content from servers 410, 412, 414 such as web pages, email messages, video clips, etc. In at least one embodiment, a second type, which may be referred to as a user, hires a web hosting provider to maintain a network resource such as a web site, and to make it available to browsers. In at least one embodiment, users contract with a web hosting provider to make memory space, processor capacity, and communication bandwidth available for their desired network resource in accordance with an amount of server resources a user desires to utilize.

In at least one embodiment, in order for a web hosting provider to provide services for both of these clients, application programs which manage a network resources hosted by servers must be properly configured. In at least one embodiment, program configuration process involves defining a set of parameters which control, at least in part, an application program's response to browser requests and which also define, at least in part, a server resources available to a particular user.

In one embodiment, an intranet server 416 is in communication with a network 408 via a communication link. In at least one embodiment, intranet server 416 is in communication with a server manager 418. In at least one embodiment, server manager 418 comprises a database of an application program configuration parameters which are being utilized in servers 410, 412, 414. In at least one embodiment, users modify a database 420 via an intranet 416, and a server manager 418 interacts with servers 410, 412, 414 to modify application program parameters so that they match a content of a database. In at least one embodiment, a user logs onto an intranet server 416 by connecting to an intranet 416 via computer 402 and entering authentication information, such as a username and password.

In at least one embodiment, when a user wishes to sign up for new service or modify an existing service, an intranet server 416 authenticates a user and provides a user with an interactive screen display/control panel that allows a user to access configuration parameters for a particular application program. In at least one embodiment, a user is presented with a number of modifiable text boxes that describe aspects of a configuration of a user's web site or other network resource. In at least one embodiment, if a user desires to increase memory space reserved on a server for its web site, a user is provided with a field in which a user specifies a desired memory space. In at least one embodiment, in response to receiving this information, an intranet server 416 updates a database 420. In at least one embodiment, server manager 418 forwards this information to an appropriate server, and a new parameter is used during application program operation. In at least one embodiment, an intranet server 416 is configured to provide users with access to configuration parameters of hosted network resources (e.g., web pages, email, FTP sites, media sites, etc.), for which a user has contracted with a web hosting service provider.

Figure 5A:
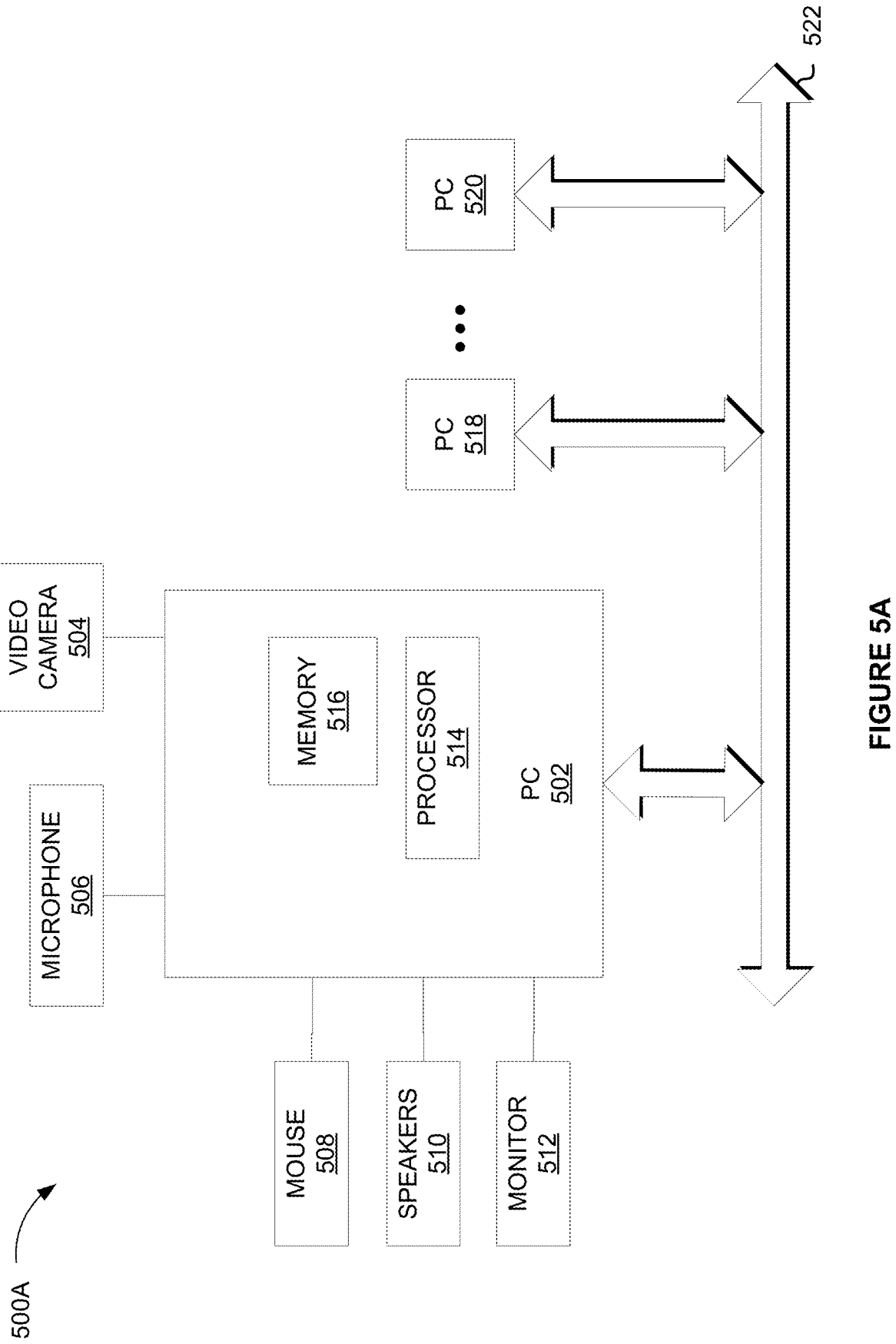
FIG. 5A illustrates a networked computer system, in accordance with at least one embodiment.

FIG. 5A illustrates a networked computer system 500A, in accordance with at least one embodiment. In at least one embodiment, networked computer system 500A comprises a plurality of nodes or personal computers ("PCs") 502, 518, 520. In at least one embodiment, personal computer or node 502 comprises a processor 514, memory 516, video camera 504, microphone 506, mouse 508, speakers 510, and monitor 512. In at least one embodiment, PCs 502, 518, 520 may each run one or more desktop servers of an internal network within a given company, for instance, or may be servers of a general network not limited to a specific environment. In at least one embodiment, there is one server per PC node of a network, so that each PC node of a network represents a particular network server, having a particular network URL address. In at least one embodiment, each server defaults to a default web page for that server's user, which may itself contain embedded URLs pointing to further subpages of that user on that server, or to other servers or pages on other servers on a network.

In at least one embodiment, nodes 502, 518, 520 and other nodes of a network are interconnected via medium 522. In at least one embodiment, medium 522 may be, a communication channel such as an Integrated Services Digital Network ("ISDN"). In at least one embodiment, various nodes of a networked computer system may be connected through a variety of communication media, including local area networks ("LANs"), plain-old telephone lines ("POTS"), sometimes referred to as public switched telephone networks ("PSTN"), and/or variations thereof. In at least one embodiment, various nodes of a network may also constitute computer system users inter-connected via a network such as the Internet. In at least one embodiment, each server on a network (running from a particular node of a network at a given instance) has a unique address or identification within a network, which may be specifiable in terms of an URL.

In at least one embodiment, a plurality of multi-point conferencing units ("MCUs") may thus be utilized to transmit data to and from various nodes or "endpoints" of a conferencing system. In at least one embodiment, nodes and/or MCUs may be interconnected via an ISDN link or through a local area network ("LAN"), in addition to various other communications media such as nodes connected through the Internet. In at least one embodiment, nodes of a conferencing system may, in general, be connected directly to a communications medium such as a LAN or through an MCU, and that a conferencing system may comprise other nodes or elements such as routers, servers, and/or variations thereof.

In at least one embodiment, processor 514 is a general-purpose programmable processor. In at least one embodiment, processors of nodes of networked computer system 500A may also be special-purpose video processors. In at least one embodiment, various peripherals and components of a node such as those of node 502 may vary from those of other nodes. In at least one embodiment, node 518 and node 520 may be configured identically to or differently than node 502. In at least one embodiment, a node may be implemented on any suitable computer system in addition to PC systems.

Figure 5B:
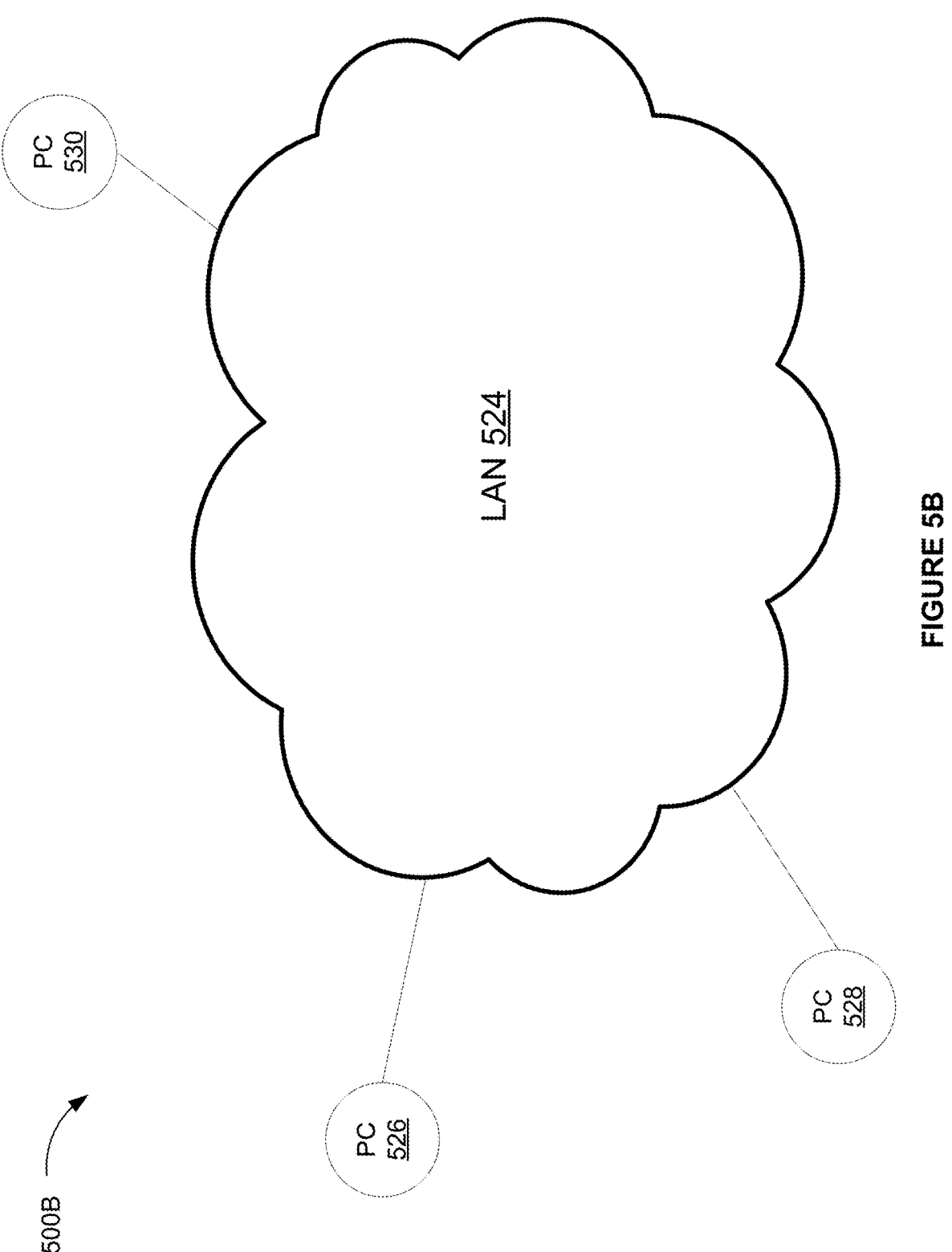
FIG. 5B illustrates a networked computer system, in accordance with at least one embodiment.

FIG. 5B illustrates a networked computer system 500B, in accordance with at least one embodiment. In at least one embodiment, system 500B illustrates a network such as LAN 524, which may be used to interconnect a variety of nodes that may communicate with each other. In at least one embodiment, attached to LAN 524 are a plurality of nodes such as PC nodes 526, 528, 530. In at least one embodiment, a node may also be connected to the LAN via a network server or other means. In at least one embodiment, system 500B comprises other types of nodes or elements, for example including routers, servers, and nodes.

Figure 5C:
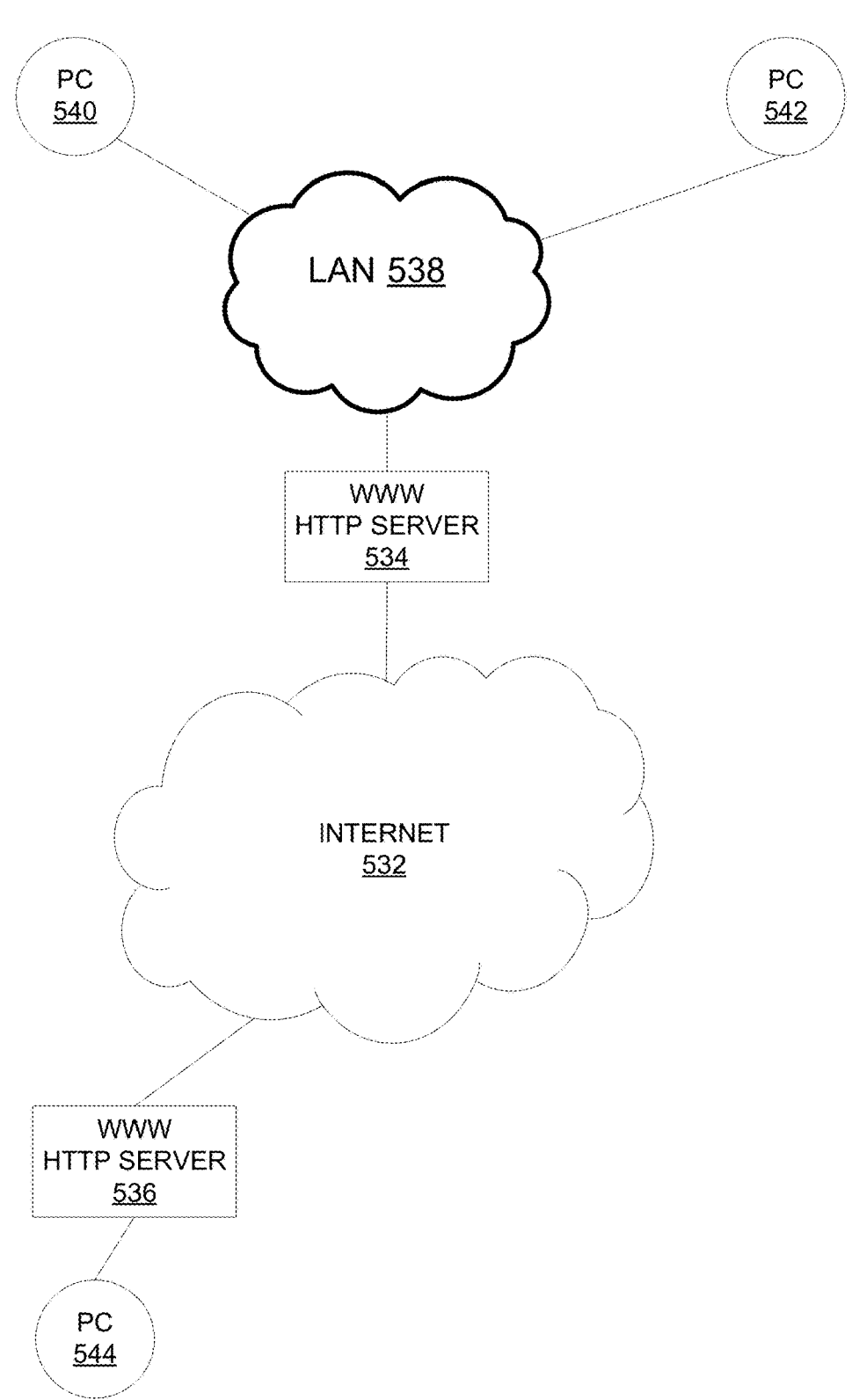
FIG. 5C illustrates a networked computer system, in accordance with at least one embodiment.

FIG. 5C illustrates a networked computer system 500C, in accordance with at least one embodiment. In at least one embodiment, system 500C illustrates a WWW system having communications across a backbone communications network such as Internet 532, which may be used to interconnect a variety of nodes of a network. In at least one embodiment, WWW is a set of protocols operating on top of the Internet, and allows a graphical interface system to operate thereon for accessing information through the Internet. In at least one embodiment, attached to Internet 532 in WWW are a plurality of nodes such as PCs 540, 542, 544. In at least one embodiment, a node is interfaced to other nodes of WWW through a WWW HTTP server such as servers 534, 536. In at least one embodiment, PC 544 may be a PC forming a node of network 532 and itself running its server 536, although PC 544 and server 536 are illustrated separately in FIG. 5C for illustrative purposes.

In at least one embodiment, WWW is a distributed type of application, characterized by WWW HTTP, WWW's protocol, which runs on top of the Internet's transmission control protocol/Internet protocol ("TCP/IP"). In at least one embodiment, WWW may thus be characterized by a set of protocols (i.e., HTTP) running on the Internet as its "backbone."

In at least one embodiment, a web browser is an application running on a node of a network that, in WWW-compatible type network systems, allows users of a particular server or node to view such information and thus allows a user to search graphical and text-based files that are linked together using hypertext links that are embedded in documents or files available from servers on a network that understand HTTP. In at least one embodiment, when a given web page of a first server associated with a first node is retrieved by a user using another server on a network such as the Internet, a document retrieved may have various hypertext links embedded therein and a local copy of a page is created local to a retrieving user. In at least one embodiment, when a user clicks on a hypertext link, locally-stored information related to a selected hypertext link is typically sufficient to allow a user's machine to open a connection across the Internet to a server indicated by a hypertext link.

In at least one embodiment, more than one user may be coupled to each HTTP server, for example through a LAN such as LAN 538 as illustrated with respect to WWW HTTP server 534. In at least one embodiment, system 500C may also comprise other types of nodes or elements. In at least one embodiment, a WWW HTTP server is an application running on a machine, such as a PC. In at least one embodiment, each user may be considered to have a unique "server," as illustrated with respect to PC 544. In at least one embodiment, a server may be considered to be a server such as WWW HTTP server 534, which provides access to a network for a LAN or plurality of nodes or plurality of LANs. In at least one embodiment, there are a plurality of users, each having a desktop PC or node of a network, each desktop PC potentially establishing a server for a user thereof. In at least one embodiment, each server is associated with a particular network address or URL, which, when accessed, provides a default web page for that user. In at least one embodiment, a web page may contain further links (embedded URLs) pointing to further subpages of that user on that server, or to other servers on a network or to pages on other servers on a network.

Cloud Computing and Services

The following figures set forth, without limitation, exemplary cloud-based systems that can be used to implement at least one embodiment.

In at least one embodiment, cloud computing is a style of computing in which dynamically scalable and often virtualized resources are provided as a service over the Internet. In at least one embodiment, users need not have knowledge of, expertise in, or control over technology infrastructure, which can be referred to as "in the cloud," that supports them. In at least one embodiment, cloud computing incorporates infrastructure as a service, platform as a service, software as a service, and other variations that have a common theme of reliance on the Internet for satisfying computing needs of users. In at least one embodiment, a typical cloud deployment, such as in a private cloud (e.g., enterprise network), or a data center (DC) in a public cloud (e.g., Internet) can consist of thousands of servers (or alternatively, VMs), hundreds of Ethernet, Fiber Channel or Fiber Channel over Ethernet (FCoE) ports, switching and storage infrastructure, etc. In at least one embodiment, cloud can also consist of network services infrastructure like IPsec VPN hubs, firewalls, load balancers, wide area network (WAN) optimizers etc. In at least one embodiment, remote subscribers can access cloud applications and services securely by connecting via a VPN tunnel, such as an IPsec VPN tunnel.

In at least one embodiment, cloud computing is a model for enabling convenient, on-demand network access to a shared pool of configurable computing resources (e.g., networks, servers, storage, applications, and services) that can be rapidly provisioned and released with minimal management effort or service provider interaction.

In at least one embodiment, cloud computing is characterized by on-demand self-service, in which a consumer can unilaterally provision computing capabilities, such as server time and network storage, as needed automatically without requiring human inter-action with each service's provider. In at least one embodiment, cloud computing is characterized by broad network access, in which capabilities are available over a network and accessed through standard mechanisms that promote use by heterogeneous thin or thick client platforms (e.g., mobile phones, laptops, and PDAs). In at least one embodiment, cloud computing is characterized by resource pooling, in which a provider's computing resources are pooled to serve multiple consumers using a multi-tenant model, with different physical and virtual resources dynamically as-signed and reassigned according to consumer demand. In at least one embodiment, there is a sense of location independence in that a customer generally has no control or knowledge over an exact location of provided resources, but may be able to specify location at a higher level of abstraction (e.g., country, state, or datacenter). In at least one embodiment, examples of resources include storage, processing, memory, network bandwidth, and virtual machines. In at least one embodiment, cloud computing is characterized by rapid elasticity, in which capabilities can be rapidly and elastically provisioned, in some cases automatically, to quickly scale out and rapidly released to quickly scale in. In at least one embodiment, to a consumer, capabilities available for provisioning often appear to be unlimited and can be purchased in any quantity at any time. In at least one embodiment, cloud computing is characterized by measured service, in which cloud systems automatically control and optimize resource use by leveraging a metering capability at some level of abstraction appropriate to a type of service (e.g., storage, processing, bandwidth, and active user accounts). In at least one embodiment, resource usage can be monitored, controlled, and reported providing transparency for both a provider and consumer of a utilized service.

In at least one embodiment, cloud computing may be associated with various services. In at least one embodiment, cloud Software as a Service (SaaS) may refer to as service in which a capability provided to a consumer is to use a provider's applications running on a cloud infrastructure. In at least one embodiment, applications are accessible from various client devices through a thin client interface such as a web browser (e.g., web-based email). In at least one embodiment, consumer does not manage or control underlying cloud infrastructure including network, servers, operating systems, storage, or even individual application capabilities, with a possible exception of limited user-specific application configuration settings.

In at least one embodiment, cloud Platform as a Service (PaaS) may refer to a service in which a capability provided to a consumer is to deploy onto cloud infrastructure consumer-created or acquired applications created using programming languages and tools supported by a provider. In at least one embodiment, consumer does not manage or control underlying cloud infrastructure including networks, servers, operating systems, or storage, but has control over deployed applications and possibly application hosting environment configurations.

In at least one embodiment, cloud Infrastructure as a Service (IaaS) may refer to a service in which a capability provided to a consumer is to provision processing, storage, networks, and other fundamental computing resources where a consumer is able to deploy and run arbitrary software, which can include operating systems and applications. In at least one embodiment, consumer does not manage or control underlying cloud infrastructure, but has control over operating systems, storage, deployed applications, and possibly limited control of select networking components (e.g., host firewalls).

In at least one embodiment, cloud computing may be deployed in various ways. In at least one embodiment, a private cloud may refer to a cloud infrastructure that is operated solely for an organization. In at least one embodiment, a private cloud may be managed by an organization or a third party and may exist on-premises or off-premises. In at least one embodiment, a community cloud may refer to a cloud infrastructure that is shared by several organizations and supports a specific community that has shared concerns (e.g., mission, security requirements, policy, and compliance considerations). In at least one embodiment, a community cloud may be managed by organizations or a third party and may exist on-premises or off-premises. In at least one embodiment, a public cloud may refer to a cloud infrastructure that is made available to a general public or a large industry group and is owned by an organization providing cloud services. In at least one embodiment, a hybrid cloud may refer to a cloud infrastructure is a composition of two or more clouds (private, community, or public) that remain unique entities, but are bound together by standardized or proprietary technology that enables data and application portability (e.g., cloud bursting for load-balancing between clouds). In at least one embodiment, a cloud computing environment is service oriented with a focus on stateless-ness, low coupling, modularity, and semantic interoperabil-ity.

Figure 6:
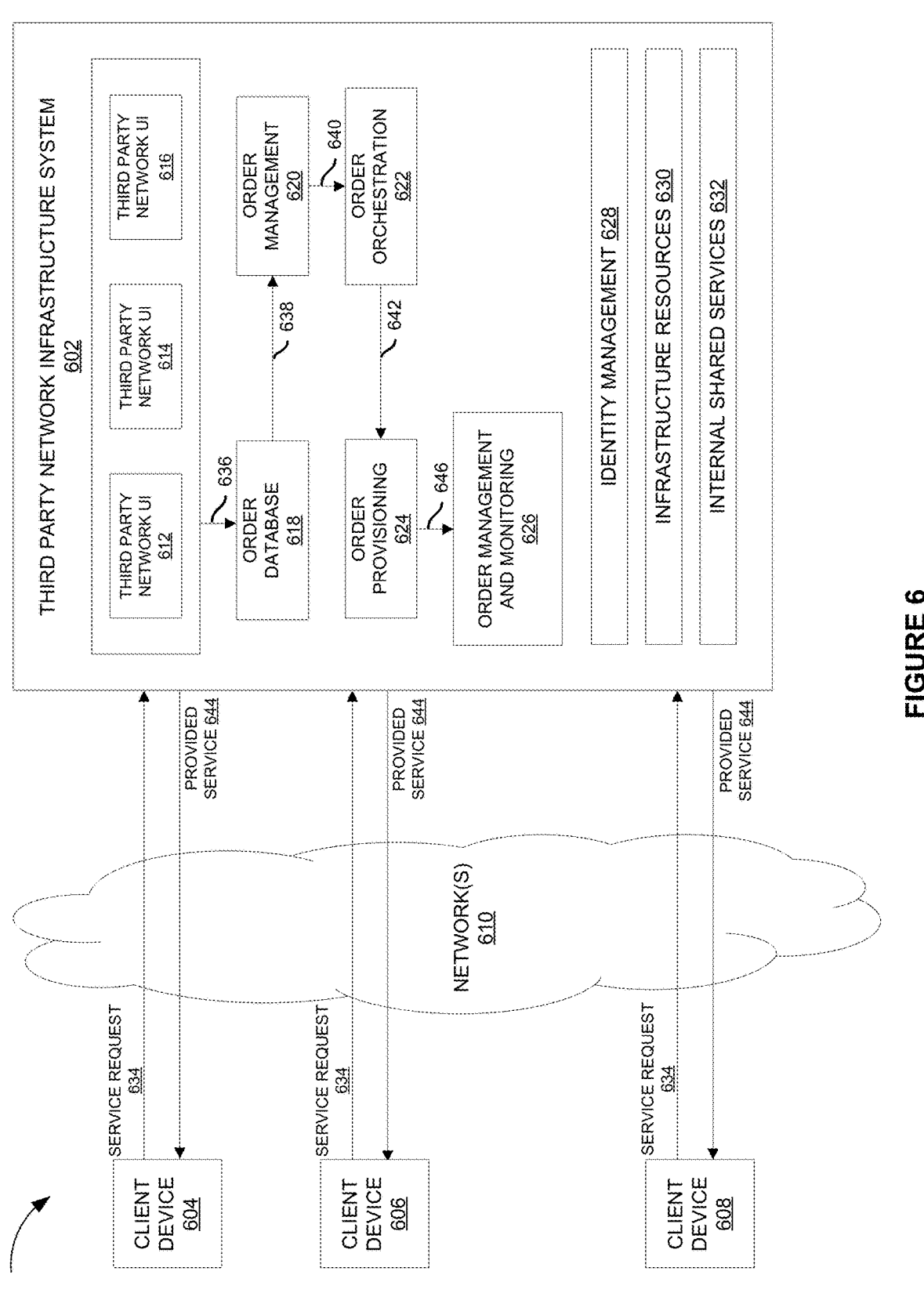
FIG. 6 illustrates one or more components of a system environment in which services may be offered as third party network services, in accordance with at least one embodiment.

FIG. 6 illustrates one or more components of a system environment 600 in which services may be offered as third party network services, in accordance with at least one embodiment. In at least one embodiment, a third party network may be referred to as a cloud, cloud network, cloud computing network, and/or variations thereof. In at least one embodiment, system environment 600 includes one or more client computing devices 604, 606, and 608 that may be used by users to interact with a third party network infrastructure system 602 that provides third party network services, which may be referred to as cloud computing services. In at least one embodiment, third party network infrastructure system 602 may comprise one or more computers and/or servers.

It should be appreciated that third party network infra-structure system 602 depicted in FIG. 6 may have other components than those depicted. Further, FIG. 6 depicts an embodiment of a third party network infrastructure system. In at least one embodiment, third party network infrastruc-ture system 602 may have more or fewer components than depicted in FIG. 6, may combine two or more components, or may have a different configuration or arrangement of components.

In at least one embodiment, client computing devices 604, 606, and 608 may be configured to operate a client appli-cation such as a web browser, a proprietary client applica-tion, or some other application, which may be used by a user of a client computing device to interact with third party network infrastructure system 602 to use services provided by third party network infrastructure system 602. Although exemplary system environment 600 is shown with three client computing devices, any number of client computing devices may be supported. In at least one embodiment, other devices such as devices with sensors, etc. may interact with third party network infrastructure system 602. In at least one embodiment, network(s) 610 may facilitate communications and exchange of data between client computing devices 604, 606, and 608 and third party network infrastructure system 602.

In at least one embodiment, services provided by third party network infrastructure system 602 may include a host of services that are made available to users of a third party network infrastructure system on demand. In at least one embodiment, various services may also be offered including without limitation online data storage and backup solutions, Web-based e-mail services, hosted office suites and docu-ment collaboration services, database management and pro-cessing, managed technical support services, and/or varia-tions thereof. In at least one embodiment, services provided by a third party network infrastructure system can dynami-cally scale to meet needs of its users.

In at least one embodiment, a specific instantiation of a service provided by third party network infrastructure sys-tem 602 may be referred to as a "service instance." In at least one embodiment, in general, any service made available to a user via a communication network, such as the Internet, from a third party network service provider's system is referred to as a "third party network service." In at least one embodiment, in a public third party network environment, servers and systems that make up a third party network service provider's system are different from a customer's own on-premises servers and systems. In at least one embodiment, a third party network service provider's sys-tem may host an application, and a user may, via a com-munication network such as the Internet, on demand, order and use an application.

In at least one embodiment, a service in a computer network third party network infrastructure may include protected computer network access to storage, a hosted database, a hosted web server, a software application, or other service provided by a third party network vendor to a user. In at least one embodiment, a service can include password-protected access to remote storage on a third party network through the Internet. In at least one embodiment, a service can include a web service-based hosted relational database and a script-language middleware engine for pri-vate use by a networked developer. In at least one embodi-ment, a service can include access to an email software application hosted on a third party network vendor's web site.

In at least one embodiment, third party network infra-structure system 602 may include a suite of applications, middleware, and database service offerings that are deliv-ered to a customer in a self-service, subscription-based, elastically scalable, reliable, highly available, and secure manner. In at least one embodiment, third party network infrastructure system 602 may also provide "big data" related computation and analysis services. In at least one embodiment, term "big data" is generally used to refer to extremely large data sets that can be stored and manipulated by analysts and researchers to visualize large amounts of data, detect trends, and/or otherwise interact with data. In at least one embodiment, big data and related applications can be hosted and/or manipulated by an infrastructure system on many levels and at different scales. In at least one embodi-ment, tens, hundreds, or thousands of processors linked in parallel can act upon such data in order to present it or simulate external forces on data or what it represents. In at least one embodiment, these data sets can involve structured data, such as that organized in a database or otherwise according to a structured model, and/or unstructured data (e.g., emails, images, data blobs (binary large objects), web pages, complex event processing). In at least one embodi-ment, by leveraging an ability of an embodiment to rela-tively quickly focus more (or fewer) computing resources upon an objective, a third party network infrastructure system may be better available to carry out tasks on large data sets based on demand from a business, government agency, research organization, private individual, group of like-minded individuals or organizations, or other entity.

In at least one embodiment, third party network infra-structure system 602 may be adapted to automatically pro-vision, manage and track a customer's subscription to ser-vices offered by third party network infrastructure system 602. In at least one embodiment, third party network infra-structure system 602 may provide third party network ser-vices via different deployment models. In at least one embodiment, services may be provided under a public third party network model in which third party network infra-structure system 602 is owned by an organization selling third party network services and services are made available to a general public or different industry enterprises. In at least one embodiment, services may be provided under a private third party network model in which third party network infrastructure system 602 is operated solely for a single organization and may provide services for one or more entities within an organization. In at least one embodiment, third party network services may also be provided under a community third party network model in which third party network infrastructure system 602 and services provided by third party network infrastructure system 602 are shared by several organizations in a related community. In at least one embodiment, third party network services may also be provided under a hybrid third party network model, which is a combination of two or more different models.

In at least one embodiment, services provided by third party network infrastructure system 602 may include one or more services provided under Software as a Service (SaaS) category, Platform as a Service (PaaS) category, Infrastructure as a Service (IaaS) category, or other categories of services including hybrid services. In at least one embodiment, a customer, via a subscription order, may order one or more services provided by third party network infrastructure system 602. In at least one embodiment, third party network infrastructure system 602 then performs processing to provide services in a customer's subscription order.

In at least one embodiment, services provided by third party network infrastructure system 602 may include, without limitation, application services, platform services and infrastructure services. In at least one embodiment, application services may be provided by a third party network infrastructure system via a SaaS platform. In at least one embodiment, SaaS platform may be configured to provide third party network services that fall under a SaaS category. In at least one embodiment, SaaS platform may provide capabilities to build and deliver a suite of on-demand applications on an integrated development and deployment platform. In at least one embodiment, SaaS platform may manage and control underlying software and infrastructure for providing SaaS services. In at least one embodiment, by utilizing services provided by a SaaS platform, customers can utilize applications executing on a third party network infrastructure system. In at least one embodiment, customers can acquire an application services without a need for customers to purchase separate licenses and support. In at least one embodiment, various different SaaS services may be provided. In at least one embodiment, examples include, without limitation, services that provide solutions for sales performance management, enterprise integration, and business flexibility for large organizations.

In at least one embodiment, platform services may be provided by third party network infrastructure system 602 via a PaaS platform. In at least one embodiment, PaaS platform may be configured to provide third party network services that fall under a PaaS category. In at least one embodiment, examples of platform services may include without limitation services that enable organizations to consolidate existing applications on a shared, common architecture, as well as an ability to build new applications that leverage shared services provided by a platform. In at least one embodiment, PaaS platform may manage and control underlying software and infrastructure for providing PaaS services. In at least one embodiment, customers can acquire PaaS services provided by third party network infrastructure system 602 without a need for customers to purchase separate licenses and support.

In at least one embodiment, by utilizing services provided by a PaaS platform, customers can employ programming languages and tools supported by a third party network infrastructure system and also control deployed services. In at least one embodiment, platform services provided by a third party network infrastructure system may include database third party network services, middleware third party network services and third party network services. In at least one embodiment, database third party network services may support shared service deployment models that enable organizations to pool database resources and offer customers a Database as a Service in a form of a database third party network. In at least one embodiment, middleware third party network services may provide a platform for customers to develop and deploy various business applications, and third party network services may provide a platform for customers to deploy applications, in a third party network infrastructure system.

In at least one embodiment, various different infrastructure services may be provided by an IaaS platform in a third party network infrastructure system. In at least one embodiment, infrastructure services facilitate management and control of underlying computing resources, such as storage, networks, and other fundamental computing resources for customers utilizing services provided by a SaaS platform and a PaaS platform.

In at least one embodiment, third party network infrastructure system 602 may also include infrastructure resources 630 for providing resources used to provide various services to customers of a third party network infrastructure system. In at least one embodiment, infrastructure resources 630 may include pre-integrated and optimized combinations of hardware, such as servers, storage, and networking resources to execute services provided by a Paas platform and a Saas platform, and other resources.

In at least one embodiment, resources in third party network infrastructure system 602 may be shared by multiple users and dynamically re-allocated per demand. In at least one embodiment, resources may be allocated to users in different time zones. In at least one embodiment, third party network infrastructure system 602 may enable a first set of users in a first time zone to utilize resources of a third party network infrastructure system for a specified number of hours and then enable a re-allocation of same resources to another set of users located in a different time zone, thereby maximizing utilization of resources.

In at least one embodiment, a number of internal shared services 632 may be provided that are shared by different components or modules of third party network infrastructure system 602 to enable provision of services by third party network infrastructure system 602. In at least one embodiment, these internal shared services may include, without limitation, a security and identity service, an integration service, an enterprise repository service, an enterprise manager service, a virus scanning and white list service, a high availability, backup and recovery service, service for enabling third party network support, an email service, a notification service, a file transfer service, and/or variations thereof.

In at least one embodiment, third party network infrastructure system 602 may provide comprehensive management of third party network services (e.g., SaaS, PaaS, and IaaS services) in a third party network infrastructure system. In at least one embodiment, third party network management functionality may include capabilities for provisioning, managing and tracking a customer's subscription received by third party network infrastructure system 602, and/or variations thereof.

In at least one embodiment, as depicted in FIG. 6, third party network management functionality may be provided by one or more modules, such as an order management module 620, an order orchestration module 622, an order provisioning module 624, an order management and monitoring module 626, and an identity management module 628. In at least one embodiment, these modules may include or be provided using one or more computers and/or servers, which may be general purpose computers, specialized server computers, server farms, server clusters, or any other appropriate arrangement and/or combination.

In at least one embodiment, at step 634, a customer using a client device, such as client computing devices 604, 606 or 608, may interact with third party network infrastructure system 602 by requesting one or more services provided by third party network infrastructure system 602 and placing an order for a subscription for one or more services offered by third party network infrastructure system 602. In at least one embodiment, a customer may access a third party network User Interface (UI) such as third party network UI 612, third party network UI 614 and/or third party network UI 616 and place a subscription order via these UIs. In at least one embodiment, order information received by third party network infrastructure system 602 in response to a customer placing an order may include information identifying a customer and one or more services offered by a third party network infrastructure system 602 that a customer intends to subscribe to.

In at least one embodiment, at step 636, an order information received from a customer may be stored in an order database 618. In at least one embodiment, if this is a new order, a new record may be created for an order. In at least one embodiment, order database 618 can be one of several databases operated by third party network infrastructure system 618 and operated in conjunction with other system elements.

In at least one embodiment, at step 638, an order information may be forwarded to an order management module 620 that may be configured to perform billing and accounting functions related to an order, such as verifying an order, and upon verification, booking an order.

In at least one embodiment, at step 640, information regarding an order may be communicated to an order orchestration module 622 that is configured to orchestrate provisioning of services and resources for an order placed by a customer. In at least one embodiment, order orchestration module 622 may use services of order provisioning module 624 for provisioning. In at least one embodiment, order orchestration module 622 enables management of business processes associated with each order and applies business logic to determine whether an order should proceed to provisioning.

In at least one embodiment, at step 642, upon receiving an order for a new subscription, order orchestration module 622 sends a request to order provisioning module 624 to allocate resources and configure resources needed to fulfill a subscription order. In at least one embodiment, order provisioning module 624 enables an allocation of resources for services ordered by a customer. In at least one embodiment, order provisioning module 624 provides a level of abstraction between third party network services provided by third party network infrastructure system 600 and a physical implementation layer that is used to provision resources for providing requested services. In at least one embodiment, this enables order orchestration module 622 to be isolated from implementation details, such as whether or not services and resources are actually provisioned in real-time or pre-provisioned and only allocated/assigned upon request.

In at least one embodiment, at step 644, once services and resources are provisioned, a notification may be sent to subscribing customers indicating that a requested service is now ready for use. In at least one embodiment, information (e.g. a link) may be sent to a customer that enables a customer to start using requested services.

In at least one embodiment, at step 646, a customer's subscription order may be managed and tracked by an order management and monitoring module 626. In at least one embodiment, order management and monitoring module 626 may be configured to collect usage statistics regarding a customer use of subscribed services. In at least one embodiment, statistics may be collected for an amount of storage used, an amount data transferred, a number of users, and an amount of system up time and system down time, and/or variations thereof.

In at least one embodiment, third party network infrastructure system 600 may include an identity management module 628 that is configured to provide identity services, such as access management and authorization services in third party network infrastructure system 600. In at least one embodiment, identity management module 628 may control information about customers who wish to utilize services provided by third party network infrastructure system 602. In at least one embodiment, such information can include information that authenticates identities of such customers and information that describes which actions those customers are authorized to perform relative to various system resources (e.g., files, directories, applications, communication ports, memory segments, etc.). In at least one embodiment, identity management module 628 may also include management of descriptive information about each customer and about how and by whom that descriptive information can be accessed and modified.

Figure 7:
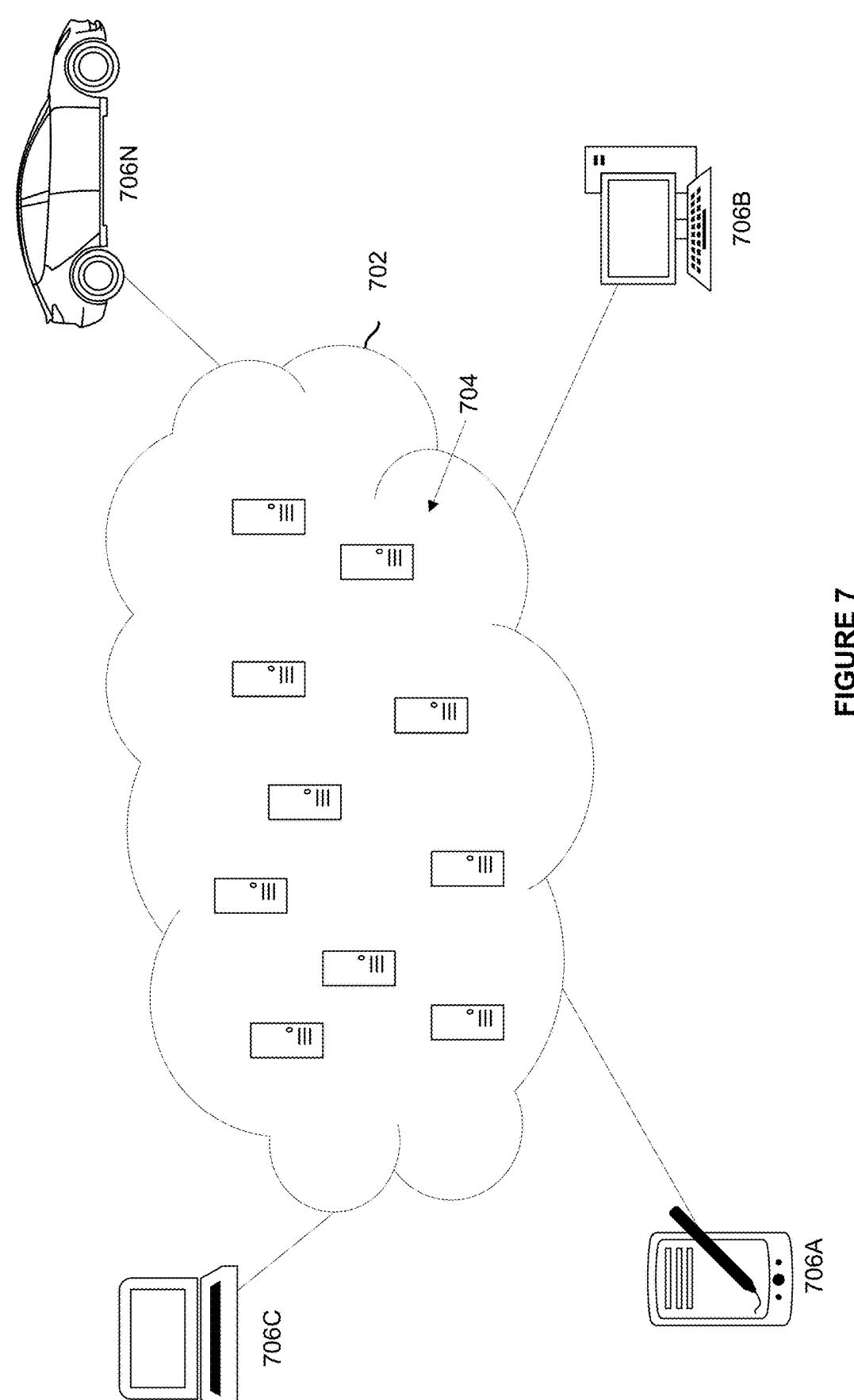
FIG. 7 illustrates a cloud computing environment, in accordance with at least one embodiment.

FIG. 7 illustrates a cloud computing environment 702, in accordance with at least one embodiment. In at least one embodiment, cloud computing environment 702 comprises one or more computer system/servers 704 with which computing devices such as, personal digital assistant (PDA) or cellular telephone 706A, desktop computer 706B, laptop computer 706C, and/or automobile computer system 706N communicate. In at least one embodiment, this allows for infrastructure, platforms and/or software to be offered as services from cloud computing environment 702, so as to not require each client to separately maintain such resources. It is understood that types of computing devices 706A-N shown in FIG. 7 are intended to be illustrative only and that cloud computing environment 702 can communicate with any type of computerized device over any type of network and/or network/addressable connection (e.g., using a web browser).

In at least one embodiment, a computer system/server 704, which can be denoted as a cloud computing node, is operational with numerous other general purpose or special purpose computing system environments or configurations. In at least one embodiment, examples of computing systems, environments, and/or configurations that may be suitable for use with computer system/server 704 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and/or variations thereof.

In at least one embodiment, computer system/server 704 may be described in a general context of computer system-executable instructions, such as program modules, being executed by a computer system. In at least one embodiment, program modules include routines, programs, objects, components, logic, data structures, and so on, that perform particular tasks or implement particular abstract data types. In at least one embodiment, exemplary computer system/server 704 may be practiced in distributed loud computing environments where tasks are performed by remote processing devices that are linked through a communications network. In at least one embodiment, in a distributed cloud computing environment, program modules may be located in both local and remote computer system storage media including memory storage devices.

Figure 8:
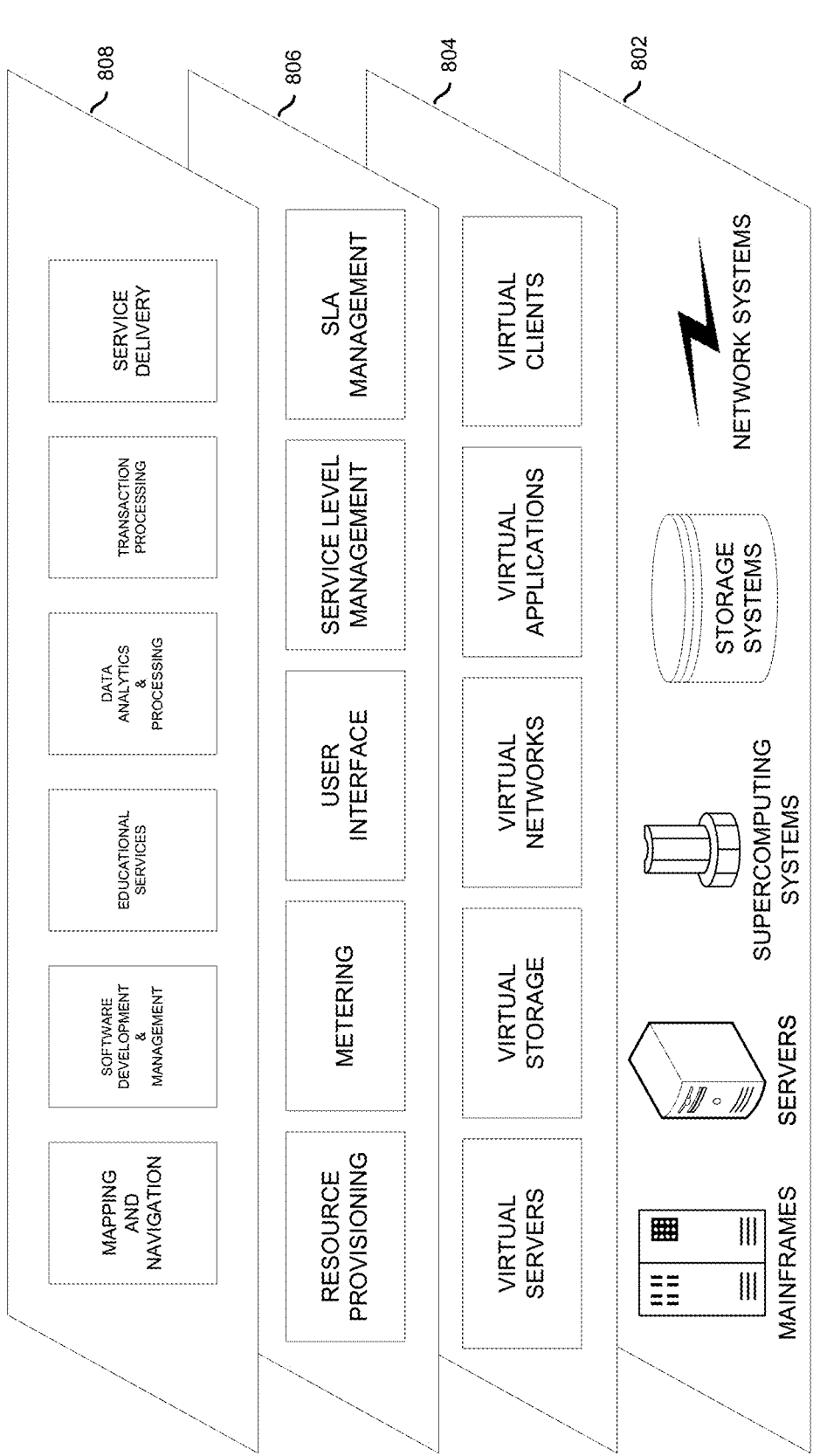
FIG. 8 illustrates a set of functional abstraction layers provided by a cloud computing environment, in accordance with at least one embodiment.

FIG. 8 illustrates a set of functional abstraction layers provided by cloud computing environment 702 (FIG. 7), in accordance with at least one embodiment. It should be understood in advance that components, layers, and functions shown in FIG. 8 are intended to be illustrative only, and components, layers, and functions may vary.

In at least one embodiment, hardware and software layer 802 includes hardware and software components. In at least one embodiment, examples of hardware components include mainframes, various RISC (Reduced Instruction Set Computer) architecture based servers, various computing systems, supercomputing systems, storage devices, networks, networking components, and/or variations thereof. In at least one embodiment, examples of software components include network application server software, various application server software, various database software, and/or variations thereof.

In at least one embodiment, virtualization layer 804 provides an abstraction layer from which following exemplary virtual entities may be provided: virtual servers, virtual storage, virtual networks, including virtual private networks, virtual applications, virtual clients, and/or variations thereof.

In at least one embodiment, management layer 806 provides various functions. In at least one embodiment, resource provisioning provides dynamic procurement of computing resources and other resources that are utilized to perform tasks within a cloud computing environment. In at least one embodiment, metering provides usage tracking as resources are utilized within a cloud computing environment, and billing or invoicing for consumption of these resources. In at least one embodiment, resources may comprise application software licenses. In at least one embodiment, security provides identity verification for users and tasks, as well as protection for data and other resources. In at least one embodiment, user interface provides access to a cloud computing environment for both users and system administrators. In at least one embodiment, service level management provides cloud computing resource allocation and management such that required service levels are met. In at least one embodiment, Service Level Agreement (SLA) management provides pre-arrangement for, and procurement of, cloud computing resources for which a future requirement is anticipated in accordance with an SLA.

In at least one embodiment, workloads layer 808 provides functionality for which a cloud computing environment is utilized. In at least one embodiment, examples of workloads and functions which may be provided from this layer include: mapping and navigation, software development and management, educational services, data analytics and processing, transaction processing, and service delivery.

Supercomputing

The following figures set forth, without limitation, exemplary supercomputer-based systems that can be used to implement at least one embodiment.

In at least one embodiment, a supercomputer may refer to a hardware system exhibiting substantial parallelism and comprising at least one chip, where chips in a system are interconnected by a network and are placed in hierarchically organized enclosures. In at least one embodiment, a large hardware system filling a machine room, with several racks, each containing several boards/rack modules, each containing several chips, all interconnected by a scalable network, is one particular example of a supercomputer. In at least one embodiment, a single rack of such a large hardware system is another example of a supercomputer. In at least one embodiment, a single chip exhibiting substantial parallelism and containing several hardware components can equally be considered to be a supercomputer, since as feature sizes may decrease, an amount of hardware that can be incorporated in a single chip may also increase.

Figure 9:
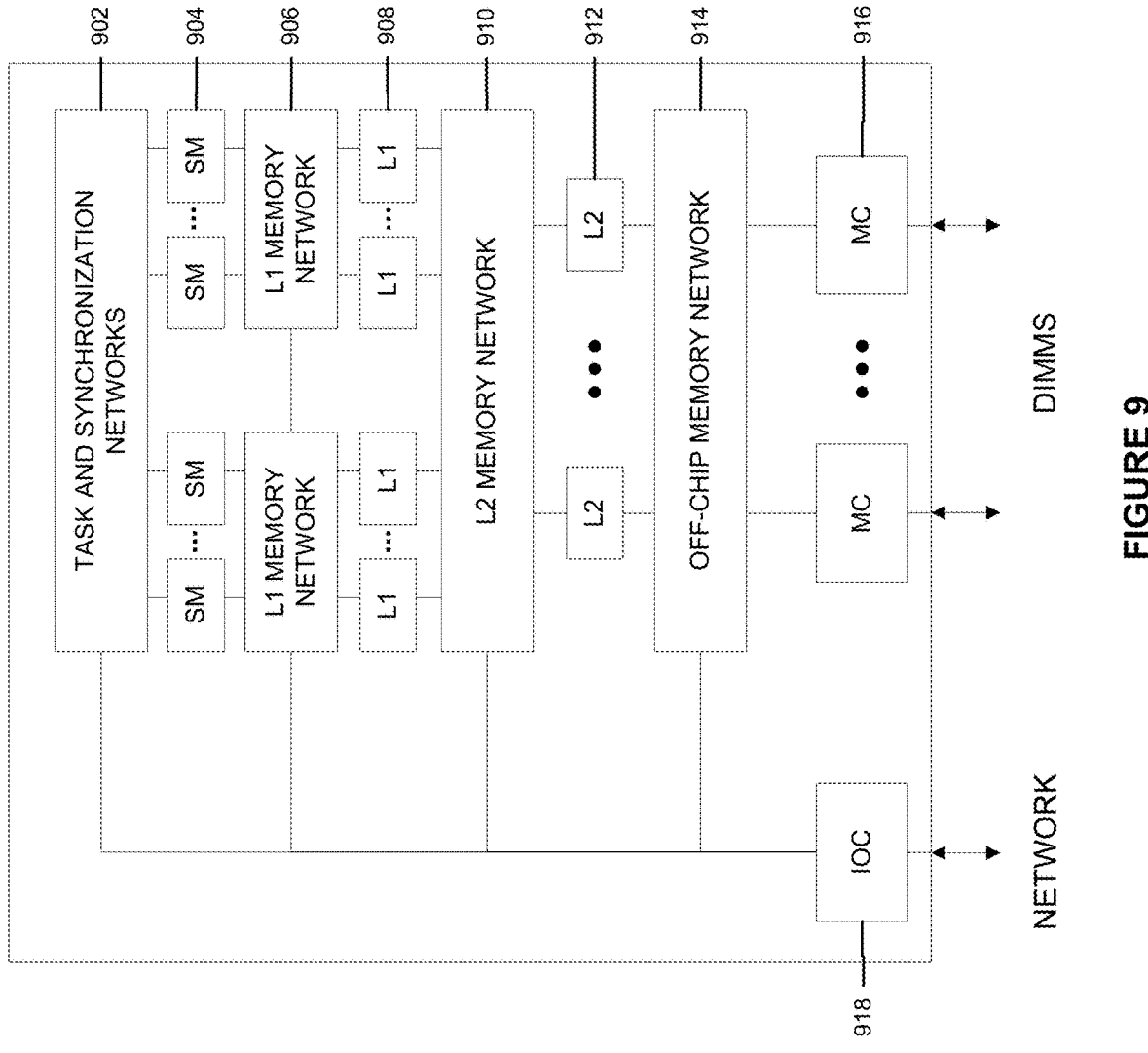
FIG. 9 illustrates a supercomputer at a chip level, in accordance with at least one embodiment.

FIG. 9 illustrates a supercomputer at a chip level, in accordance with at least one embodiment. In at least one embodiment, inside an FPGA or ASIC chip, main computation is performed within finite state machines (904) called thread units. In at least one embodiment, task and synchronization networks (902) connect finite state machines and are used to dispatch threads and execute operations in correct order. In at least one embodiment, a multi-level partitioned on-chip cache hierarchy (908, 912) is accessed using memory networks (906, 910). In at least one embodiment, off-chip memory is accessed using memory controllers (916) and an off-chip memory network (914). In at least one embodiment, I/O controller (918) is used for cross-chip communication when a design does not fit in a single logic chip.

Figure 10:
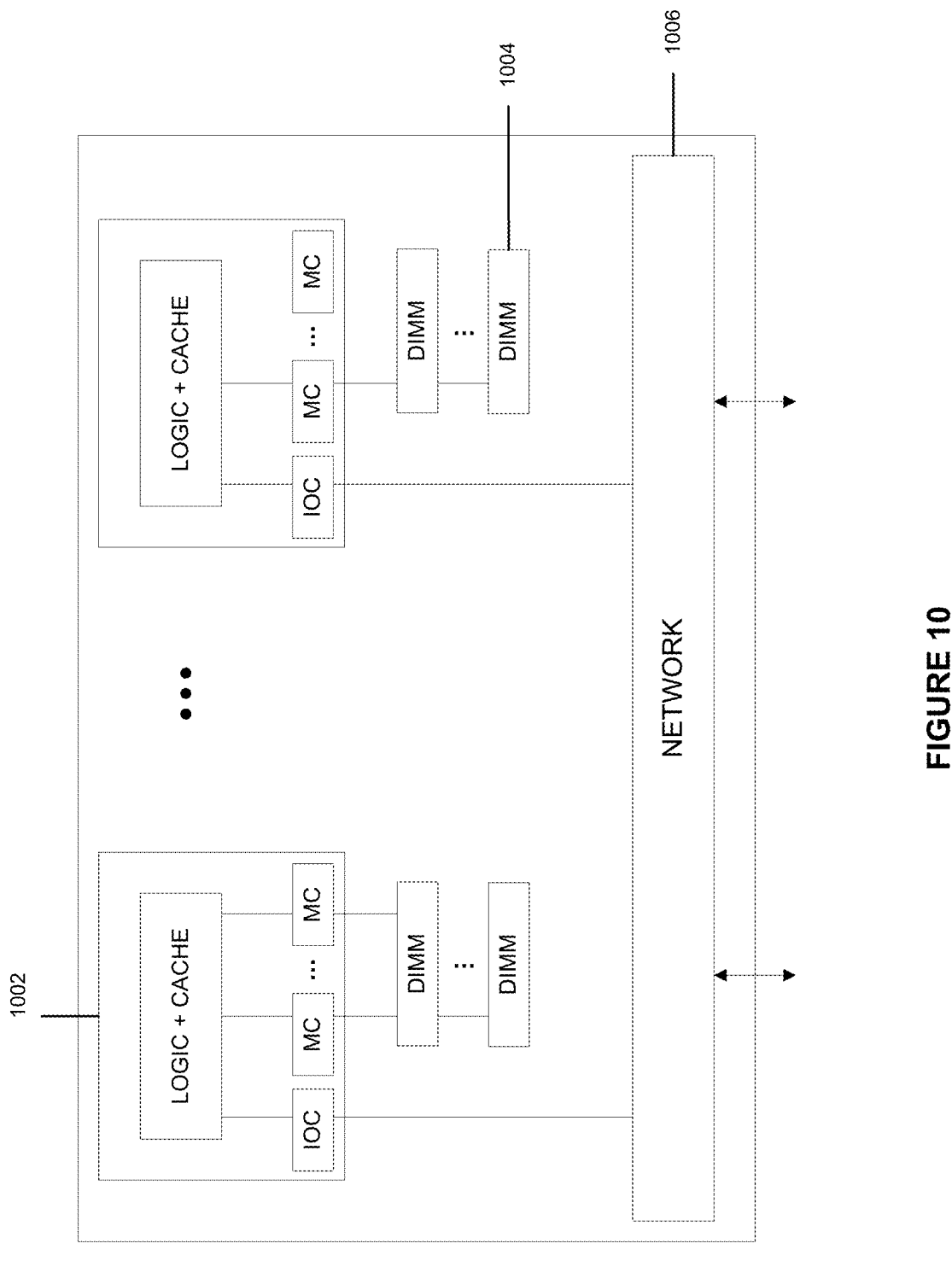
FIG. 10 illustrates a supercomputer at a rack module level, in accordance with at least one embodiment.

FIG. 10 illustrates a supercomputer at a rock module level, in accordance with at least one embodiment. In at least one embodiment, within a rack module, there are multiple FPGA or ASIC chips (1002) that are connected to one or more DRAM units (1004) which constitute main accelerator memory. In at least one embodiment, each FPGA/ASIC chip is connected to its neighbor FPGA/ASIC chip using wide busses on a board, with differential high speed signaling (1006). In at least one embodiment, each FPGA/ASIC chip is also connected to at least one high-speed serial communication cable.

Figure 11:
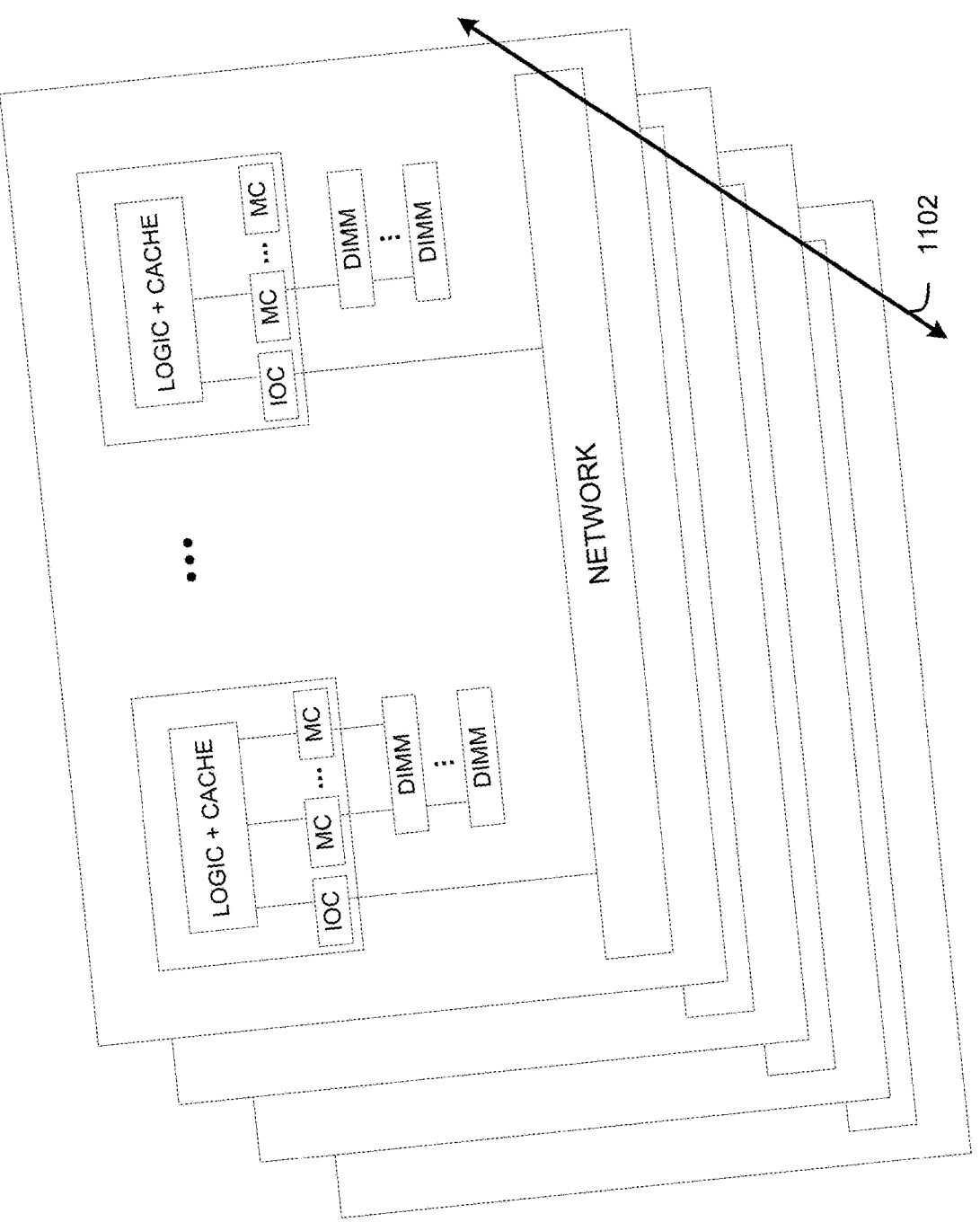
FIG. 11 illustrates a supercomputer at a rack level, in accordance with at least one embodiment.
Figure 12:
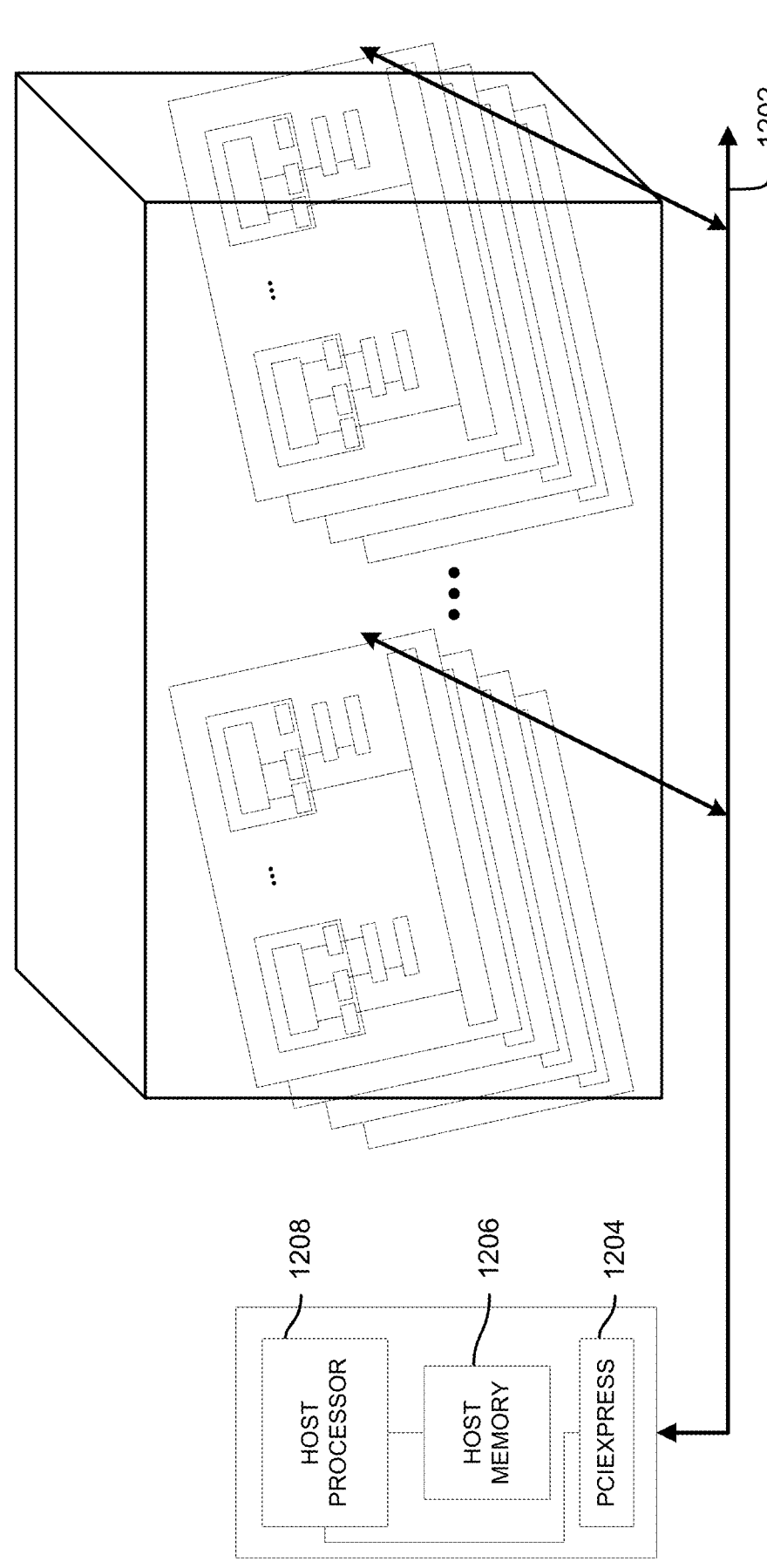
FIG. 12 illustrates a supercomputer at a whole system level, in accordance with at least one embodiment.

FIG. 11 illustrates a supercomputer at a rack level, in accordance with at least one embodiment. FIG. 12 illustrates a supercomputer at a whole system level, in accordance with at least one embodiment. In at least one embodiment, referring to FIG. 11 and FIG. 12, between rack modules in a rack and across racks throughout an entire system, high-speed serial optical or copper cables (1102, 1202) are used to realize a scalable, possibly incomplete hypercube network. In at least one embodiment, one of FPGA/ASIC chips of an accelerator is connected to a host system through a PCI-Express connection (1204). In at least one embodiment, host system comprises a host microprocessor (1208) that a software part of an application runs on and a memory consisting of one or more host memory DRAM units (1206) that is kept coherent with memory on an accelerator. In at least one embodiment, host system can be a separate module on one of racks, or can be integrated with one of a supercomputer's modules. In at least one embodiment, cube-connected cycles topology provide communication links to create a hypercube network for a large supercomputer. In at least one embodiment, a small group of FPGA/ASIC chips on a rack module can act as a single hypercube node, such that a total number of external links of each group is increased, compared to a single chip. In at least one embodiment, a group contains chips A, B, C and D on a rack module with internal wide differential busses connecting A, B, C and D in a torus organization. In at least one embodiment, there are 12 serial communication cables connecting a rack module to an outside world. In at least one embodiment, chip A on a rack module connects to serial communication cables 0, 1, 2. In at least one embodiment, chip B connects to cables 3, 4, 5. In at least one embodiment, chip C connects to 6, 7, 8. In at least one embodiment, chip D connects to 9, 10, 11. In at least one embodiment, an entire group {A, B, C, D} constituting a rack module can form a hypercube node within a supercomputer system, with up to 212=4096 rack modules (16384 FPGA/ASIC chips). In at least one embodiment, for chip A to send a message out on link 4 of group {A, B, C, D}, a message has to be routed first to chip B with an on-board differential wide bus connection. In at least one embodiment, a message arriving into a group {A, B, C, D} on link 4 (i.e., arriving at B) destined to chip A, also has to be routed first to a correct destination chip (A) internally within a group {A, B, C, D}. In at least one embodiment, parallel supercomputer systems of other sizes may also be implemented.

Artificial Intelligence

The following figures set forth, without limitation, exemplary artificial intelligence-based systems that can be used to implement at least one embodiment.

Figure 13A:
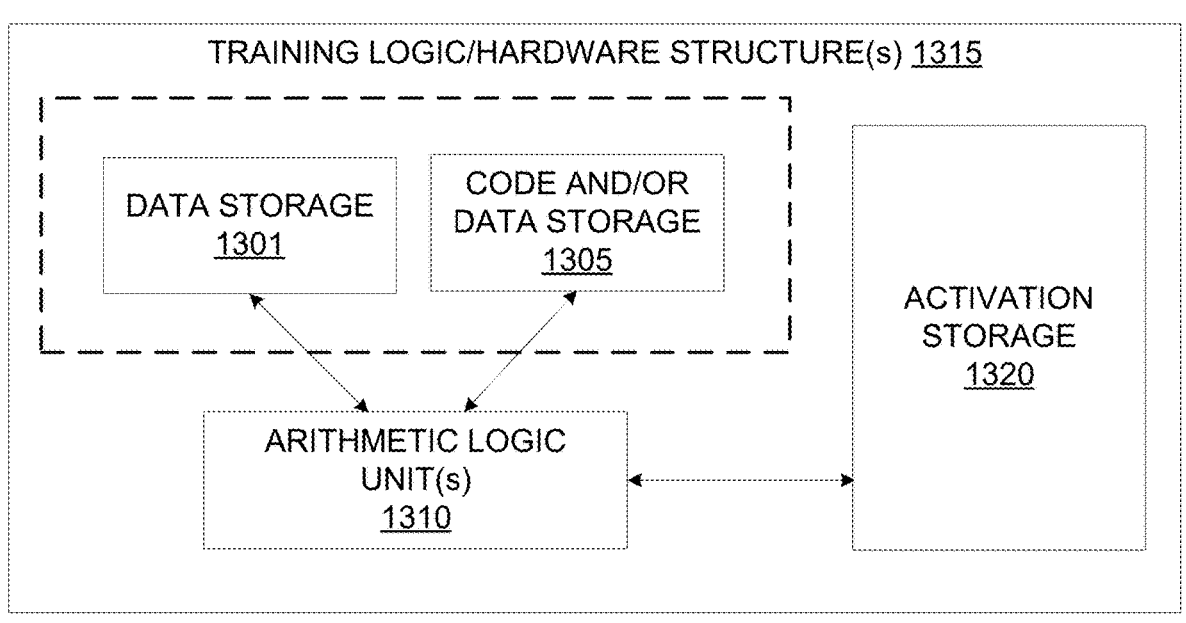
FIG. 13A illustrates inference and/or training logic, in accordance with at least one embodiment.

FIG. 13A illustrates inference and/or training logic 1315 used to perform inferencing and/or training operations associated with one or more embodiments. Details regarding inference and/or training logic 1315 are provided below in conjunction with FIGS. 13A and/or 13B.

In at least one embodiment, inference and/or training logic 1315 may include, without limitation, code and/or data storage 1301 to store forward and/or output weight and/or input/output data, and/or other parameters to configure neurons or layers of a neural network trained and/or used for inferencing in aspects of one or more embodiments. In at least one embodiment, training logic 1315 may include, or be coupled to code and/or data storage 1301 to store graph code or other software to control timing and/or order, in which weight and/or other parameter information is to be loaded to configure, logic, including integer and/or floating point units (collectively, arithmetic logic units (ALUs)). In at least one embodiment, code, such as graph code, loads weight or other parameter information into processor ALUs based on an architecture of a neural network to which such code corresponds. In at least one embodiment code and/or data storage 1301 stores weight parameters and/or input/output data of each layer of a neural network trained or used in conjunction with one or more embodiments during forward propagation of input/output data and/or weight parameters during training and/or inferencing using aspects of one or more embodiments. In at least one embodiment, any portion of code and/or data storage 1301 may be included with other on-chip or off-chip data storage, including a processor's L1, L2, or L3 cache or system memory.

In at least one embodiment, any portion of code and/or data storage 1301 may be internal or external to one or more processors or other hardware logic devices or circuits. In at least one embodiment, code and/or code and/or data storage 1301 may be cache memory, dynamic randomly addressable memory ("DRAM"), static randomly addressable memory ("SRAM"), non-volatile memory (e.g., flash memory), or other storage. In at least one embodiment, a choice of whether code and/or code and/or data storage 1301 is internal or external to a processor, for example, or comprising DRAM, SRAM, flash or some other storage type may depend on available storage on-chip versus off-chip, latency requirements of training and/or inferencing functions being performed, batch size of data used in inferencing and/or training of a neural network, or some combination of these factors.

In at least one embodiment, inference and/or training logic 1315 may include, without limitation, a code and/or data storage 1305 to store backward and/or output weight and/or input/output data corresponding to neurons or layers of a neural network trained and/or used for inferencing in aspects of one or more embodiments. In at least one embodiment, code and/or data storage 1305 stores weight parameters and/or input/output data of each layer of a neural network trained or used in conjunction with one or more embodiments during backward propagation of input/output data and/or weight parameters during training and/or inferencing using aspects of one or more embodiments. In at least one embodiment, training logic 1315 may include, or be coupled to code and/or data storage 1305 to store graph code or other software to control timing and/or order, in which weight and/or other parameter information is to be loaded to configure, logic, including integer and/or floating point units (collectively, arithmetic logic units (ALUs)).

In at least one embodiment, code, such as graph code, causes loading of weight or other parameter information into processor ALUs based on an architecture of a neural network to which such code corresponds. In at least one embodiment, any portion of code and/or data storage 1305 may be included with other on-chip or off-chip data storage, including a processor's L1, L2, or L3 cache or system memory. In at least one embodiment, any portion of code and/or data storage 1305 may be internal or external to one or more processors or other hardware logic devices or circuits. In at least one embodiment, code and/or data storage 1305 may be cache memory, DRAM, SRAM, non-volatile memory (e.g., flash memory), or other storage. In at least one embodiment, a choice of whether code and/or data storage 1305 is internal or external to a processor, for example, or comprising DRAM, SRAM, flash memory or some other storage type may depend on available storage on-chip versus off-chip, latency requirements of training and/or inferencing functions being performed, batch size of data used in inferencing and/or training of a neural network, or some combination of these factors.

In at least one embodiment, code and/or data storage 1301 and code and/or data storage 1305 may be separate storage structures. In at least one embodiment, code and/or data storage 1301 and code and/or data storage 1305 may be a combined storage structure. In at least one embodiment, code and/or data storage 1301 and code and/or data storage 1305 may be partially combined and partially separate. In at least one embodiment, any portion of code and/or data storage 1301 and code and/or data storage 1305 may be included with other on-chip or off-chip data storage, including a processor's L1, L2, or L3 cache or system memory.

In at least one embodiment, inference and/or training logic 1315 may include, without limitation, one or more arithmetic logic unit(s) ("ALU(s)") 1310, including integer and/or floating point units, to perform logical and/or mathematical operations based, at least in part on, or indicated by, training and/or inference code (e.g., graph code), a result of which may produce activations (e.g., output values from layers or neurons within a neural network) stored in an activation storage 1320 that are functions of input/output and/or weight parameter data stored in code and/or data storage 1301 and/or code and/or data storage 1305. In at least one embodiment, activations stored in activation storage 1320 are generated according to linear algebraic and or matrix-based mathematics performed by ALU(s) 1310 in response to performing instructions or other code, wherein weight values stored in code and/or data storage 1305 and/or data storage 1301 are used as operands along with other values, such as bias values, gradient information, momentum values, or other parameters or hyperparameters, any or all of which may be stored in code and/or data storage 1305 or code and/or data storage 1301 or another storage on or off-chip.

In at least one embodiment, ALU(s) 1310 are included within one or more processors or other hardware logic devices or circuits, whereas in another embodiment, ALU(s) 1310 may be external to a processor or other hardware logic device or circuit that uses them (e.g., a co-processor). In at least one embodiment, ALUs 1310 may be included within a processor's execution units or otherwise within a bank of ALUs accessible by a processor's execution units either within same processor or distributed between different processors of different types (e.g., central processing units, graphics processing units, fixed function units, etc.). In at least one embodiment, code and/or data storage 1301, code and/or data storage 1305, and activation storage 1320 may share a processor or other hardware logic device or circuit, whereas in another embodiment, they may be in different processors or other hardware logic devices or circuits, or some combination of same and different processors or other hardware logic devices or circuits. In at least one embodiment, any portion of activation storage 1320 may be included with other on-chip or off-chip data storage, including a processor's L1, L2, or L3 cache or system memory. Furthermore, inferencing and/or training code may be stored with other code accessible to a processor or other hardware logic or circuit and fetched and/or processed using a processor's fetch, decode, scheduling, execution, retirement and/or other logical circuits.

In at least one embodiment, activation storage 1320 may be cache memory, DRAM, SRAM, non-volatile memory (e.g., flash memory), or other storage. In at least one embodiment, activation storage 1320 may be completely or partially within or external to one or more processors or other logical circuits. In at least one embodiment, a choice of whether activation storage 1320 is internal or external to a processor, for example, or comprising DRAM, SRAM, flash memory or some other storage type may depend on available storage on-chip versus off-chip, latency requirements of training and/or inferencing functions being performed, batch size of data used in inferencing and/or training of a neural network, or some combination of these factors.

In at least one embodiment, inference and/or training logic 1315 illustrated in FIG. 13A may be used in conjunction with an application-specific integrated circuit ("ASIC"), such as a TensorFlow® Processing Unit from Google, an inference processing unit (IPU) from Graphcore™, or a Nervana® (e.g., "Lake Crest") processor from Intel Corp. In at least one embodiment, inference and/or training logic 1315 illustrated in FIG. 13A may be used in conjunction with central processing unit ("CPU") hardware, graphics processing unit ("GPU") hardware or other hardware, such as field programmable gate arrays ("FPGAs").

Figure 13B:
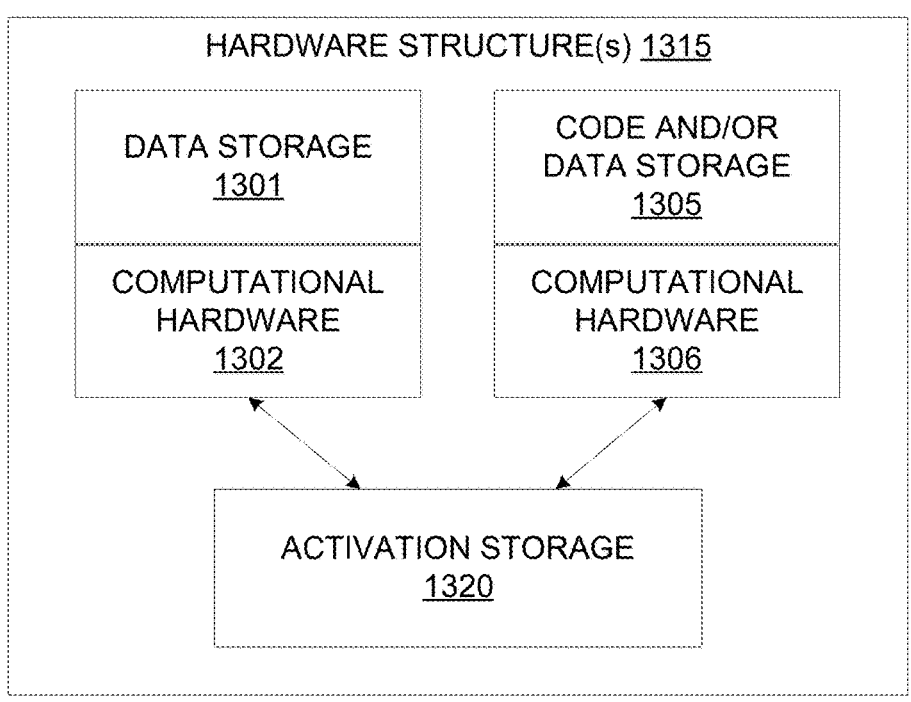
FIG. 13B illustrates inference and/or training logic, in accordance with at least one embodiment.

FIG. 13B illustrates inference and/or training logic 1315, according to at least one embodiment. In at least one embodiment, inference and/or training logic 1315 may include, without limitation, hardware logic in which computational resources are dedicated or otherwise exclusively used in conjunction with weight values or other information corresponding to one or more layers of neurons within a neural network. In at least one embodiment, inference and/or training logic 1315 illustrated in FIG. 13B may be used in conjunction with an application-specific integrated circuit (ASIC), such as TensorFlow® Processing Unit from Google, an inference processing unit (IPU) from Graphcore™, or a Nervana® (e.g., "Lake Crest") processor from Intel Corp. In at least one embodiment, inference and/or training logic 1315 illustrated in FIG. 13B may be used in conjunction with central processing unit (CPU) hardware, graphics processing unit (GPU) hardware or other hardware, such as field programmable gate arrays (FPGAs). In at least one embodiment, inference and/or training logic 1315 includes, without limitation, code and/or data storage 1301 and code and/or data storage 1305, which may be used to store code (e.g., graph code), weight values and/or other information, including bias values, gradient information, momentum values, and/or other parameter or hyperparameter information. In at least one embodiment illustrated in FIG. 13B, each of code and/or data storage 1301 and code and/or data storage 1305 is associated with a dedicated computational resource, such as computational hardware 1302 and computational hardware 1306, respectively. In at least one embodiment, each of computational hardware 1302 and computational hardware 1306 comprises one or more ALUs that perform mathematical functions, such as linear algebraic functions, only on information stored in code and/or data storage 1301 and code and/or data storage 1305, respectively, result of which is stored in activation storage 1320.

In at least one embodiment, each of code and/or data storage 1301 and 1305 and corresponding computational hardware 1302 and 1306, respectively, correspond to different layers of a neural network, such that resulting activation from one storage/computational pair 1301/1302 of code and/or data storage 1301 and computational hardware 1302 is provided as an input to a next storage/computational pair 1305/1306 of code and/or data storage 1305 and computational hardware 1306, in order to mirror a conceptual organization of a neural network. In at least one embodiment, each of storage/computational pairs 1301/1302 and 1305/1306 may correspond to more than one neural network layer. In at least one embodiment, additional storage/computation pairs (not shown) subsequent to or in parallel with storage/computation pairs 1301/1302 and 1305/1306 may be included in inference and/or training logic 1315.

Figure 14:
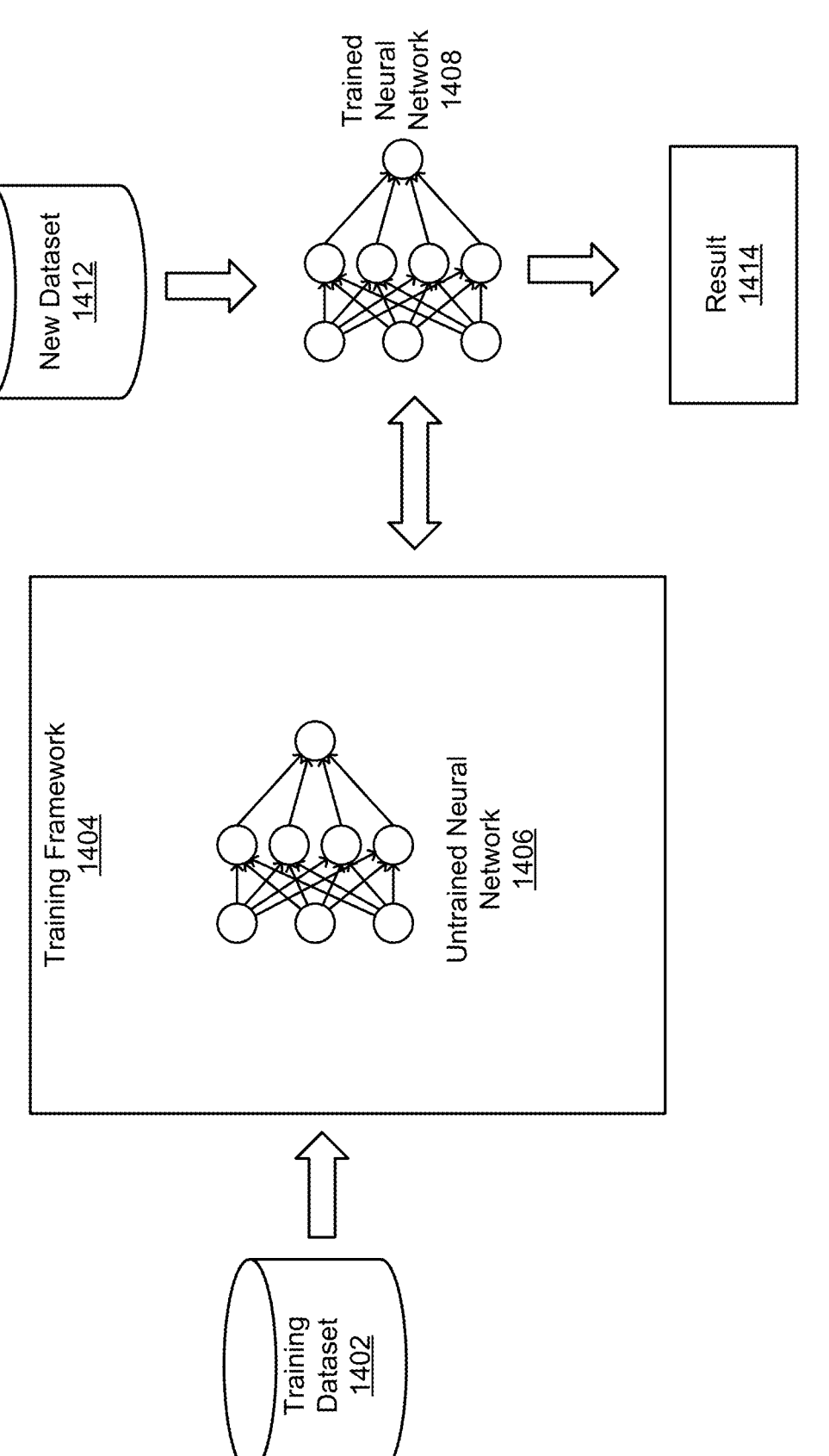
FIG. 14 illustrates training and deployment of a neural network, in accordance with at least one embodiment.

FIG. 14 illustrates training and deployment of a deep neural network, according to at least one embodiment. In at least one embodiment, untrained neural network 1406 is trained using a training dataset 1402. In at least one embodiment, training framework 1404 is a PyTorch framework, whereas in other embodiments, training framework 1404 is a TensorFlow, Boost, Caffe, Microsoft Cognitive Toolkit/CNTK, MXNet, Chainer, Keras, Deeplearning4j, or other training framework. In at least one embodiment, training framework 1404 trains an untrained neural network 1406 and enables it to be trained using processing resources described herein to generate a trained neural network 1408. In at least one embodiment, weights may be chosen randomly or by pre-training using a deep belief network. In at least one embodiment, training may be performed in either a supervised, partially supervised, or unsupervised manner.

In at least one embodiment, untrained neural network 1406 is trained using supervised learning, wherein training dataset 1402 includes an input paired with a desired output for an input, or where training dataset 1402 includes input having a known output and an output of neural network 1406 is manually graded. In at least one embodiment, untrained neural network 1406 is trained in a supervised manner and processes inputs from training dataset 1402 and compares resulting outputs against a set of expected or desired outputs. In at least one embodiment, errors are then propagated back through untrained neural network 1406. In at least one embodiment, training framework 1404 adjusts weights that control untrained neural network 1406. In at least one embodiment, training framework 1404 includes tools to monitor how well untrained neural network 1406 is converging towards a model, such as trained neural network 1408, suitable to generating correct answers, such as in result 1414, based on input data such as a new dataset 1412. In at least one embodiment, training framework 1404 trains untrained neural network 1406 repeatedly while adjust weights to refine an output of untrained neural network 1406 using a loss function and adjustment algorithm, such as stochastic gradient descent. In at least one embodiment, training framework 1404 trains untrained neural network 1406 until untrained neural network 1406 achieves a desired accuracy. In at least one embodiment, trained neural network 1408 can then be deployed to implement any number of machine learning operations.

In at least one embodiment, untrained neural network 1406 is trained using unsupervised learning, wherein untrained neural network 1406 attempts to train itself using unlabeled data. In at least one embodiment, unsupervised learning training dataset 1402 will include input data without any associated output data or "ground truth" data. In at least one embodiment, untrained neural network 1406 can learn groupings within training dataset 1402 and can determine how individual inputs are related to untrained dataset 1402. In at least one embodiment, unsupervised training can be used to generate a self-organizing map in trained neural network 1408 capable of performing operations useful in reducing dimensionality of new dataset 1412. In at least one embodiment, unsupervised training can also be used to perform anomaly detection, which allows identification of data points in new dataset 1412 that deviate from normal patterns of new dataset 1412.

In at least one embodiment, semi-supervised learning may be used, which is a technique in which in training dataset 1402 includes a mix of labeled and unlabeled data. In at least one embodiment, training framework 1404 may be used to perform incremental learning, such as through transferred learning techniques. In at least one embodiment, incremental learning enables trained neural network 1408 to adapt to new dataset 1412 without forgetting knowledge instilled within trained neural network 1408 during initial training.

5G Networks

The following figures set forth, without limitation, exemplary 5G network-based systems that can be used to implement at least one embodiment.

Figure 15:
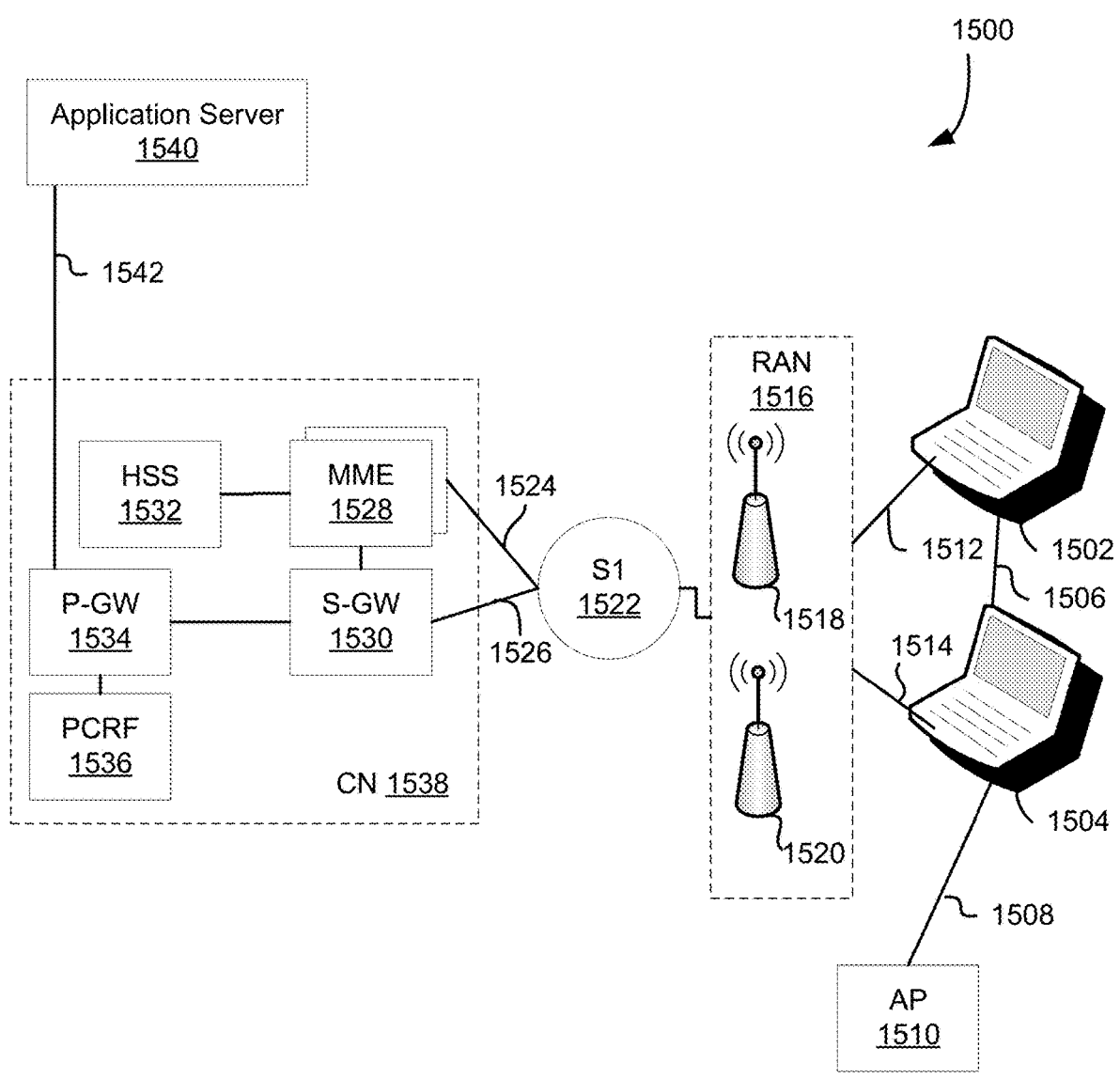
FIG. 15 illustrates an architecture of a system of a network, in accordance with at least one embodiment.

FIG. 15 illustrates an architecture of a system 1500 of a network, in accordance with at least one embodiment. In at least one embodiment, system 1500 is shown to include a user equipment (UE) 1502 and a UE 1504. In at least one embodiment, UEs 1502 and 1504 are illustrated as smartphones (e.g., handheld touchscreen mobile computing devices connectable to one or more cellular networks) but may also comprise any mobile or non-mobile computing device, such as Personal Data Assistants (PDAs), pagers, laptop computers, desktop computers, wireless handsets, or any computing device including a wireless communications interface.

In at least one embodiment, any of UEs 1502 and 1504 can comprise an Internet of Things (IoT) UE, which can comprise a network access layer designed for low-power IoT applications utilizing short-lived UE connections. In at least one embodiment, an IoT UE can utilize technologies such as machine-to-machine (M2M) or machine-type communications (MTC) for exchanging data with an MTC server or device via a public land mobile network (PLMN), Proximity-Based Service (ProSe) or device-to-device (D2D) communication, sensor networks, or IoT networks. In at least one embodiment, a M2M or MTC exchange of data may be a machine-initiated exchange of data. In at least one embodiment, an IoT network describes interconnecting IoT UEs, which may include uniquely identifiable embedded computing devices (within Internet infrastructure), with short-lived connections. In at least one embodiment, an IoT UEs may execute background applications (e.g., keep alive messages, status updates, etc.) to facilitate connections of an IoT network.

In at least one embodiment, UEs 1502 and 1504 may be configured to connect, e.g., communicatively couple, with a radio access network (RAN) 1516. In at least one embodiment, RAN 1516 may be, for example, an Evolved Universal Mobile Telecommunications System (UMTS) Terrestrial Radio Access Network (E-UTRAN), a NextGen RAN (NG RAN), or some other type of RAN. In at least one embodiment, UEs 1502 and 1504 utilize connections 1512 and 1514, respectively, each of which comprises a physical communications interface or layer. In at least one embodiment, connections 1512 and 1514 are illustrated as an air interface to enable communicative coupling, and can be consistent with cellular communications protocols, such as a Global System for Mobile Communications (GSM) protocol, a code-division multiple access (CDMA) network protocol, a Push-to-Talk (PTT) protocol, a PTT over Cellular (POC) protocol, a Universal Mobile Telecommunications System (UMTS) protocol, a 3GPP Long Term Evolution (LTE) protocol, a fifth generation (5G) protocol, a New Radio (NR) protocol, and variations thereof.

In at least one embodiment, UEs 1502 and 1504 may further directly exchange communication data via a ProSe interface 1506. In at least one embodiment, ProSe interface 1506 may alternatively be referred to as a sidelink interface comprising one or more logical channels, including but not limited to a Physical Sidelink Control Channel (PSCCH), a Physical Sidelink Shared Channel (PSSCH), a Physical Sidelink Discovery Channel (PSDCH), and a Physical Sidelink Broadcast Channel (PSBCH).

In at least one embodiment, UE 1504 is shown to be configured to access an access point (AP) 1510 via connection 1508. In at least one embodiment, connection 1508 can comprise a local wireless connection, such as a connection consistent with any IEEE 802.11 protocol, wherein AP 1510 would comprise a wireless fidelity (WiFi®) router. In at least one embodiment, AP 1510 is shown to be connected to an Internet without connecting to a core network of a wireless system.

In at least one embodiment, RAN 1516 can include one or more access nodes that enable connections 1512 and 1514. In at least one embodiment, these access nodes (ANs) can be referred to as base stations (BSs), NodeBs, evolved NodeBs (eNBs), next Generation NodeBs (gNB), RAN nodes, and so forth, and can comprise ground stations (e.g., terrestrial access points) or satellite stations providing coverage within a geographic area (e.g., a cell). In at least one embodiment, RAN 1516 may include one or more RAN nodes for providing macrocells, e.g., macro RAN node 1518, and one or more RAN nodes for providing femtocells or picocells (e.g., cells having smaller coverage areas, smaller user capacity, or higher bandwidth compared to macrocells), e.g., low power (LP) RAN node 1520.

In at least one embodiment, any of RAN nodes 1518 and 1520 can terminate an air interface protocol and can be a first point of contact for UEs 1502 and 1504. In at least one embodiment, any of RAN nodes 1518 and 1520 can fulfill various logical functions for RAN 1516 including, but not limited to, radio network controller (RNC) functions such as radio bearer management, uplink and downlink dynamic radio resource management and data packet scheduling, and mobility management.

In at least one embodiment, UEs 1502 and 1504 can be configured to communicate using Orthogonal Frequency-Division Multiplexing (OFDM) communication signals with each other or with any of RAN nodes 1518 and 1520 over a multi-carrier communication channel in accordance various communication techniques, such as, but not limited to, an Orthogonal Frequency Division Multiple Access (OFDMA) communication technique (e.g., for downlink communications) or a Single Carrier Frequency Division Multiple Access (SC-FDMA) communication technique (e.g., for uplink and ProSe or sidelink communications), and/or variations thereof. In at least one embodiment, OFDM signals can comprise a plurality of orthogonal sub-carriers.

In at least one embodiment, a downlink resource grid can be used for downlink transmissions from any of RAN nodes 1518 and 1520 to UEs 1502 and 1504, while uplink transmissions can utilize similar techniques. In at least one embodiment, a grid can be a time frequency grid, called a resource grid or time-frequency resource grid, which is a physical resource in a downlink in each slot. In at least one embodiment, such a time frequency plane representation is a common practice for OFDM systems, which makes it intuitive for radio resource allocation. In at least one embodiment, each column and each row of a resource grid corresponds to one OFDM symbol and one OFDM subcarrier, respectively. In at least one embodiment, a duration of a resource grid in a time domain corresponds to one slot in a radio frame. In at least one embodiment, a smallest time-frequency unit in a resource grid is denoted as a resource element. In at least one embodiment, each resource grid comprises a number of resource blocks, which describe a mapping of certain physical channels to resource elements. In at least one embodiment, each resource block comprises a collection of resource elements. In at least one embodiment, in a frequency domain, this may represent a smallest quantity of resources that currently can be allocated. In at least one embodiment, there are several different physical downlink channels that are conveyed using such resource blocks.

In at least one embodiment, a physical downlink shared channel (PDSCH) may carry user data and higher-layer signaling to UEs 1502 and 1504. In at least one embodiment, a physical downlink control channel (PDCCH) may carry information about a transport format and resource allocations related to PDSCH channel, among other things. In at least one embodiment, it may also inform UEs 1502 and 1504 about a transport format, resource allocation, and HARQ (Hybrid Automatic Repeat Request) information related to an uplink shared channel. In at least one embodiment, typically, downlink scheduling (assigning control and shared channel resource blocks to UE 1502 within a cell) may be performed at any of RAN nodes 1518 and 1520 based on channel quality information fed back from any of UEs 1502 and 1504. In at least one embodiment, downlink resource assignment information may be sent on a PDCCH used for (e.g., assigned to) each of UEs 1502 and 1504.

In at least one embodiment, a PDCCH may use control channel elements (CCEs) to convey control information. In at least one embodiment, before being mapped to resource elements, PDCCH complex valued symbols may first be organized into quadruplets, which may then be permuted using a sub-block interleaver for rate matching. In at least one embodiment, each PDCCH may be transmitted using one or more of these CCEs, where each CCE may correspond to nine sets of four physical resource elements known as resource element groups (REGs). In at least one embodiment, four Quadrature Phase Shift Keying (QPSK) symbols may be mapped to each REG. In at least one embodiment, PDCCH can be transmitted using one or more CCEs, depending on a size of a downlink control information (DCI) and a channel condition. In at least one embodiment, there can be four or more different PDCCH formats defined in LTE with different numbers of CCEs (e.g., aggregation level, L=1, 2, 4, or 8).

In at least one embodiment, an enhanced physical downlink control channel (EPDCCH) that uses PDSCH resources may be utilized for control information transmission. In at least one embodiment, EPDCCH may be transmitted using one or more enhanced control channel elements (ECCEs). In at least one embodiment, each ECCE may correspond to nine sets of four physical resource elements known as an enhanced resource element groups (EREGs). In at least one embodiment, an ECCE may have other numbers of EREGs in some situations.

In at least one embodiment, RAN 1516 is shown to be communicatively coupled to a core network (CN) 1538 via an S1 interface 1522. In at least one embodiment, CN 1538 may be an evolved packet core (EPC) network, a NextGen Packet Core (NPC) network, or some other type of CN. In at least one embodiment, S1 interface 1522 is split into two parts: S1-U interface 1526, which carries traffic data between RAN nodes 1518 and 1520 and serving gateway (S-GW) 1530, and a S1-mobility management entity (MME) interface 1524, which is a signaling interface between RAN nodes 1518 and 1520 and MMEs 1528.

In at least one embodiment, CN 1538 comprises MMEs 1528, S-GW 1530, Packet Data Network (PDN) Gateway (P-GW) 1534, and a home subscriber server (HSS) 1532. In at least one embodiment, MMEs 1528 may be similar in function to a control plane of legacy Serving General Packet Radio Service (GPRS) Support Nodes (SGSN). In at least one embodiment, MMEs 1528 may manage mobility aspects in access such as gateway selection and tracking area list management. In at least one embodiment, HSS 1532 may comprise a database for network users, including subscription related information to support a network entities' handling of communication sessions. In at least one embodiment, CN 1538 may comprise one or several HSSs 1532, depending on a number of mobile subscribers, on a capacity of an equipment, on an organization of a network, etc. In at least one embodiment, HSS 1532 can provide support for routing/roaming, authentication, authorization, naming/addressing resolution, location dependencies, etc.

In at least one embodiment, S-GW 1530 may terminate a S1 interface 1522 towards RAN 1516, and routes data packets between RAN 1516 and CN 1538. In at least one embodiment, S-GW 1530 may be a local mobility anchor point for inter-RAN node handovers and also may provide an anchor for inter-3GPP mobility. In at least one embodiment, other responsibilities may include lawful intercept, charging, and some policy enforcement.

In at least one embodiment, P-GW 1534 may terminate an SGi interface toward a PDN. In at least one embodiment, P-GW 1534 may route data packets between an EPC network 1538 and external networks such as a network including application server 1540 (alternatively referred to as application function (AF)) via an Internet Protocol (IP) interface 1542. In at least one embodiment, application server 1540 may be an element offering applications that use IP bearer resources with a core network (e.g., UMTS Packet Services (PS) domain, LTE PS data services, etc.). In at least one embodiment, P-GW 1534 is shown to be communicatively coupled to an application server 1540 via an IP communications interface 1542. In at least one embodiment, application server 1540 can also be configured to support one or more communication services (e.g., Voice-over-Internet Protocol (VoIP) sessions, PTT sessions, group communication sessions, social networking services, etc.) for UEs 1502 and 1504 via CN 1538.

In at least one embodiment, P-GW 1534 may further be a node for policy enforcement and charging data collection. In at least one embodiment, policy and Charging Enforcement Function (PCRF) 1536 is a policy and charging control element of CN 1538. In at least one embodiment, in a non-roaming scenario, there may be a single PCRF in a Home Public Land Mobile Network (HPLMN) associated with a UE's Internet Protocol Connectivity Access Network (IP-CAN) session. In at least one embodiment, in a roaming scenario with local breakout of traffic, there may be two PCRFs associated with a UE's IP-CAN session: a Home PCRF (H-PCRF) within a HPLMN and a Visited PCRF (V-PCRF) within a Visited Public Land Mobile Network (VPLMN). In at least one embodiment, PCRF 1536 may be communicatively coupled to application server 1540 via P-GW 1534. In at least one embodiment, application server 1540 may signal PCRF 1536 to indicate a new service flow and select an appropriate Quality of Service (QoS) and charging parameters. In at least one embodiment, PCRF 1536 may provision this rule into a Policy and Charging Enforcement Function (PCEF) (not shown) with an appropriate traffic flow template (TFT) and QoS class of identifier (QCI), which commences a QoS and charging as specified by application server 1540.

Figure 16:
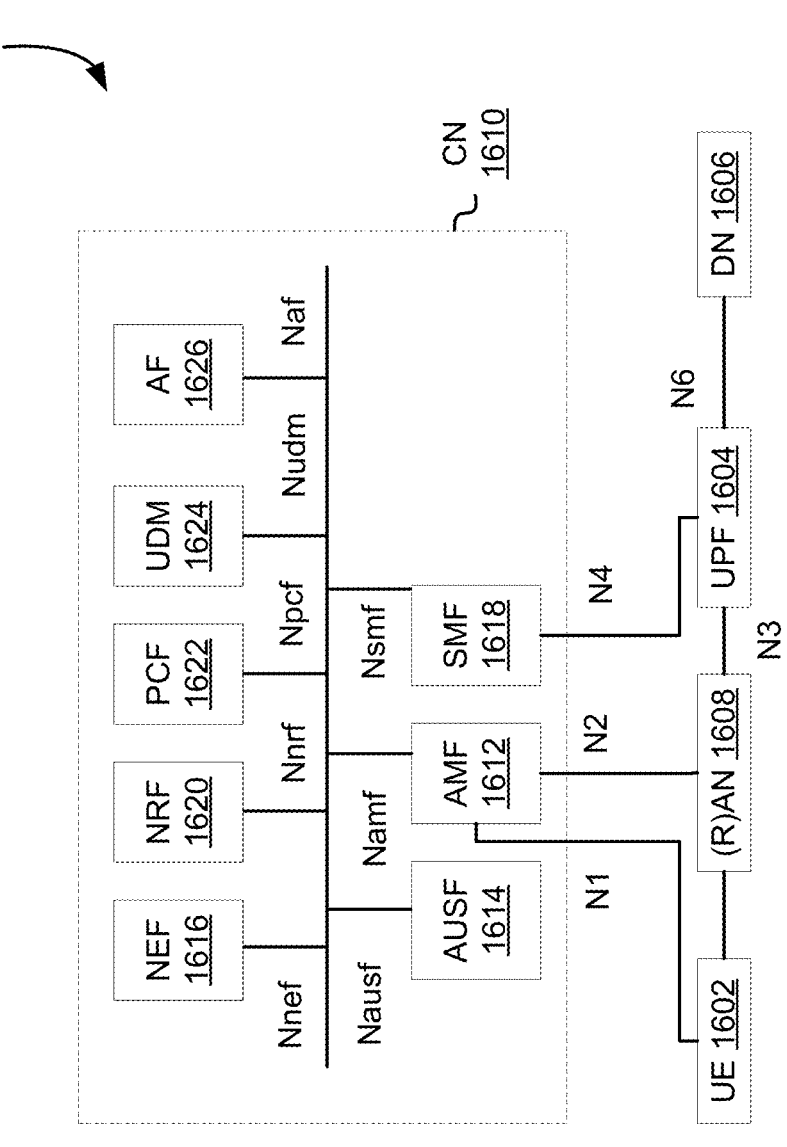
FIG. 16 illustrates an architecture of a system of a network, in accordance with at least one embodiment.

FIG. 16 illustrates an architecture of a system 1600 of a network in accordance with some embodiments. In at least one embodiment, system 1600 is shown to include a UE 1602, a 5G access node or RAN node (shown as (R)AN node 1608), a User Plane Function (shown as UPF 1604), a Data Network (DN 1606), which may be, for example, operator services, Internet access or 3rd party services, and a 5G Core Network (5GC) (shown as CN 1610).

In at least one embodiment, CN 1610 includes an Authentication Server Function (AUSF 1614); a Core Access and Mobility Management Function (AMF 1612); a Session Management Function (SMF 1618); a Network Exposure Function (NEF 1616); a Policy Control Function (PCF 1622); a Network Function (NF) Repository Function (NRF 1620); a Unified Data Management (UDM 1624); and an Application Function (AF 1626). In at least one embodiment, CN 1610 may also include other elements that are not shown, such as a Structured Data Storage network function (SDSF), an Unstructured Data Storage network function (UDSF), and variations thereof.

In at least one embodiment, UPF 1604 may act as an anchor point for intra-RAT and inter-RAT mobility, an external PDU session point of interconnect to DN 1606, and a branching point to support multi-homed PDU session. In at least one embodiment, UPF 1604 may also perform packet routing and forwarding, packet inspection, enforce user plane part of policy rules, lawfully intercept packets (UP collection); traffic usage reporting, perform QoS handling for user plane (e.g. packet filtering, gating, UL/DL rate enforcement), perform Uplink Traffic verification (e.g., SDF to QoS flow mapping), transport level packet marking in uplink and downlink, and downlink packet buffering and downlink data notification triggering. In at least one embodiment, UPF 1604 may include an uplink classifier to support routing traffic flows to a data network. In at least one embodiment, DN 1606 may represent various network operator services, Internet access, or third party services.

In at least one embodiment, AUSF 1614 may store data for authentication of UE 1602 and handle authentication related functionality. In at least one embodiment, AUSF 1614 may facilitate a common authentication framework for various access types.

In at least one embodiment, AMF 1612 may be responsible for registration management (e.g., for registering UE 1602, etc.), connection management, reachability management, mobility management, and lawful interception of AMF-related events, and access authentication and authorization. In at least one embodiment, AMF 1612 may provide transport for SM messages for SMF 1618, and act as a transparent proxy for routing SM messages. In at least one embodiment, AMF 1612 may also provide transport for short message service (SMS) messages between UE 1602 and an SMS function (SMSF) (not shown by FIG. 16). In at least one embodiment, AMF 1612 may act as Security Anchor Function (SEA), which may include interaction with AUSF 1614 and UE 1602 and receipt of an intermediate key that was established as a result of UE 1602 authentication process. In at least one embodiment, where USIM based authentication is used, AMF 1612 may retrieve security material from AUSF 1614. In at least one embodiment, AMF 1612 may also include a Security Context Management (SCM) function, which receives a key from SEA that it uses to derive access-network specific keys. In at least one embodiment, furthermore, AMF 1612 may be a termination point of RAN CP interface (N2 reference point), a termination point of NAS (NI) signaling, and perform NAS ciphering and integrity protection.

In at least one embodiment, AMF 1612 may also support NAS signaling with a UE 1602 over an N3 interworking-function (IWF) interface. In at least one embodiment, N3IWF may be used to provide access to untrusted entities. In at least one embodiment, N3IWF may be a termination point for N2 and N3 interfaces for control plane and user plane, respectively, and as such, may handle N2 signaling from SMF and AMF for PDU sessions and QoS, encapsulate/de-encapsulate packets for IPSec and N3 tunneling, mark N3 user-plane packets in uplink, and enforce QoS corresponding to N3 packet marking taking into account QoS requirements associated to such marking received over N2. In at least one embodiment, N3IWF may also relay uplink and downlink control-plane NAS (NI) signaling between UE 1602 and AMF 1612, and relay uplink and downlink user-plane packets between UE 1602 and UPF 1604. In at least one embodiment, N3IWF also provides mechanisms for IPsec tunnel establishment with UE 1602.

In at least one embodiment, SMF 1618 may be responsible for session management (e.g., session establishment, modify and release, including tunnel maintain between UPF and AN node); UE IP address allocation & management (including optional Authorization); Selection and control of UP function; Configures traffic steering at UPF to route traffic to proper destination; termination of interfaces towards Policy control functions; control part of policy enforcement and QoS; lawful intercept (for SM events and interface to LI System); termination of SM parts of NAS messages; downlink Data Notification; initiator of AN specific SM information, sent via AMF over N2 to AN; determine SSC mode of a session. In at least one embodiment, SMF 1618 may include following roaming functionality: handle local enforcement to apply QoS SLAB (VPLMN); charging data collection and charging interface (VPLMN); lawful intercept (in VPLMN for SM events and interface to LI System); support for interaction with external DN for transport of signaling for PDU session authorization/authentication by external DN.

In at least one embodiment, NEF 1616 may provide means for securely exposing services and capabilities provided by 3GPP network functions for third party, internal exposure/re-exposure, Application Functions (e.g., AF 1626), edge computing or fog computing systems, etc. In at least one embodiment, NEF 1616 may authenticate, authorize, and/or throttle AFs. In at least one embodiment, NEF 1616 may also translate information exchanged with AF 1626 and information exchanged with internal network functions. In at least one embodiment, NEF 1616 may translate between an AF-Service-Identifier and an internal 5GC information. In at least one embodiment, NEF 1616 may also receive information from other network functions (NFs) based on exposed capabilities of other network functions. In at least one embodiment, this information may be stored at NEF 1616 as structured data, or at a data storage NF using a standardized interfaces. In at least one embodiment, stored information can then be re-exposed by NEF 1616 to other NFs and AFs, and/or used for other purposes such as analytics.

In at least one embodiment, NRF 1620 may support service discovery functions, receive NF Discovery Requests from NF instances, and provide information of discovered NF instances to NF instances. In at least one embodiment, NRF 1620 also maintains information of available NF instances and their supported services.

In at least one embodiment, PCF 1622 may provide policy rules to control plane function(s) to enforce them, and may also support unified policy framework to govern network behavior. In at least one embodiment, PCF 1622 may also implement a front end (FE) to access subscription information relevant for policy decisions in a UDR of UDM 1624.

In at least one embodiment, UDM 1624 may handle subscription-related information to support a network entities' handling of communication sessions, and may store subscription data of UE 1602. In at least one embodiment, UDM 1624 may include two parts, an application FE and a User Data Repository (UDR). In at least one embodiment, UDM may include a UDM FE, which is in charge of processing of credentials, location management, subscription management and so on. In at least one embodiment, several different front ends may serve a same user in different transactions. In at least one embodiment, UDM-FE accesses subscription information stored in an UDR and performs authentication credential processing; user identification handling; access authorization; registration/mobility management; and subscription management. In at least one embodiment, UDR may interact with PCF 1622. In at least one embodiment, UDM 1624 may also support SMS management, wherein an SMS-FE implements a similar application logic as discussed previously.

In at least one embodiment, AF 1626 may provide application influence on traffic routing, access to a Network Capability Exposure (NCE), and interact with a policy framework for policy control. In at least one embodiment, NCE may be a mechanism that allows a 5GC and AF 1626 to provide information to each other via NEF 1616, which may be used for edge computing implementations. In at least one embodiment, network operator and third party services may be hosted close to UE 1602 access point of attachment to achieve an efficient service delivery through a reduced end-to-end latency and load on a transport network. In at least one embodiment, for edge computing implementations, 5GC may select a UPF 1604 close to UE 1602 and execute traffic steering from UPF 1604 to DN 1606 via N6 interface. In at least one embodiment, this may be based on UE subscription data, UE location, and information provided by AF 1626. In at least one embodiment, AF 1626 may influence UPF (re)selection and traffic routing. In at least one embodiment, based on operator deployment, when AF 1626 is considered to be a trusted entity, a network operator may permit AF 1626 to interact directly with relevant NFs.

In at least one embodiment, CN 1610 may include an SMSF, which may be responsible for SMS subscription checking and verification, and relaying SM messages to/from UE 1602 to/from other entities, such as an SMS-GMSC/IWMSC/SMS-router. In at least one embodiment, SMS may also interact with AMF 1612 and UDM 1624 for notification procedure that UE 1602 is available for SMS transfer (e.g., set a UE not reachable flag, and notifying UDM 1624 when UE 1602 is available for SMS).

In at least one embodiment, system 1600 may include following service-based interfaces: Namf: Service-based interface exhibited by AMF; Nsmf: Service-based interface exhibited by SMF; Nnef: Service-based interface exhibited by NEF; Npcf: Service-based interface exhibited by PCF; Nudm: Service-based interface exhibited by UDM; Naf: Service-based interface exhibited by AF; Nnrf: Service-based interface exhibited by NRF; and Nausf: Service-based interface exhibited by AUSF.

In at least one embodiment, system 1600 may include following reference points: N1: Reference point between UE and AMF; N2: Reference point between (R)AN and AMF; N3: Reference point between (R)AN and UPF; N4: Reference point between SMF and UPF; and N6: Reference point between UPF and a Data Network. In at least one embodiment, there may be many more reference points and/or service-based interfaces between a NF services in NFs, however, these interfaces and reference points have been omitted for clarity. In at least one embodiment, an NS reference point may be between a PCF and AF; an N7 reference point may be between PCF and SMF; an N11 reference point between AMF and SMF; etc. In at least one embodiment, CN 1610 may include an Nx interface, which is an inter-CN interface between MME and AMF 1612 in order to enable interworking between CN 1610 and CN 7216.

In at least one embodiment, system 1600 may include multiple RAN nodes (such as (R)AN node 1608) wherein an Xn interface is defined between two or more (R)AN node 1608 (e.g., gNBs) that connecting to 5GC 410, between a (R)AN node 1608 (e.g., gNB) connecting to CN 1610 and an eNB (e.g., a macro RAN node), and/or between two eNBs connecting to CN 1610.

In at least one embodiment, Xn interface may include an Xn user plane (Xn-U) interface and an Xn control plane (Xn-C) interface. In at least one embodiment, Xn-U may provide non-guaranteed delivery of user plane PDUs and support/provide data forwarding and flow control functionality. In at least one embodiment, Xn-C may provide management and error handling functionality, functionality to manage a Xn-C interface; mobility support for UE 1602 in a connected mode (e.g., CM-CONNECTED) including functionality to manage UE mobility for connected mode between one or more (R)AN node 1608. In at least one embodiment, mobility support may include context transfer from an old (source) serving (R)AN node 1608 to new (target) serving (R)AN node 1608; and control of user plane tunnels between old (source) serving (R)AN node 1608 to new (target) serving (R)AN node 1608.

In at least one embodiment, a protocol stack of a Xn-U may include a transport network layer built on Internet Protocol (IP) transport layer, and a GTP-U layer on top of a UDP and/or IP layer(s) to carry user plane PDUs. In at least one embodiment, Xn-C protocol stack may include an application layer signaling protocol (referred to as Xn Application Protocol (Xn-AP)) and a transport network layer that is built on an SCTP layer. In at least one embodiment, SCTP layer may be on top of an IP layer. In at least one embodiment, SCTP layer provides a guaranteed delivery of application layer messages. In at least one embodiment, in a transport IP layer point-to-point transmission is used to deliver signaling PDUs. In at least one embodiment, Xn-U protocol stack and/or a Xn-C protocol stack may be same or similar to an user plane and/or control plane protocol stack(s) shown and described herein.

Figure 17:
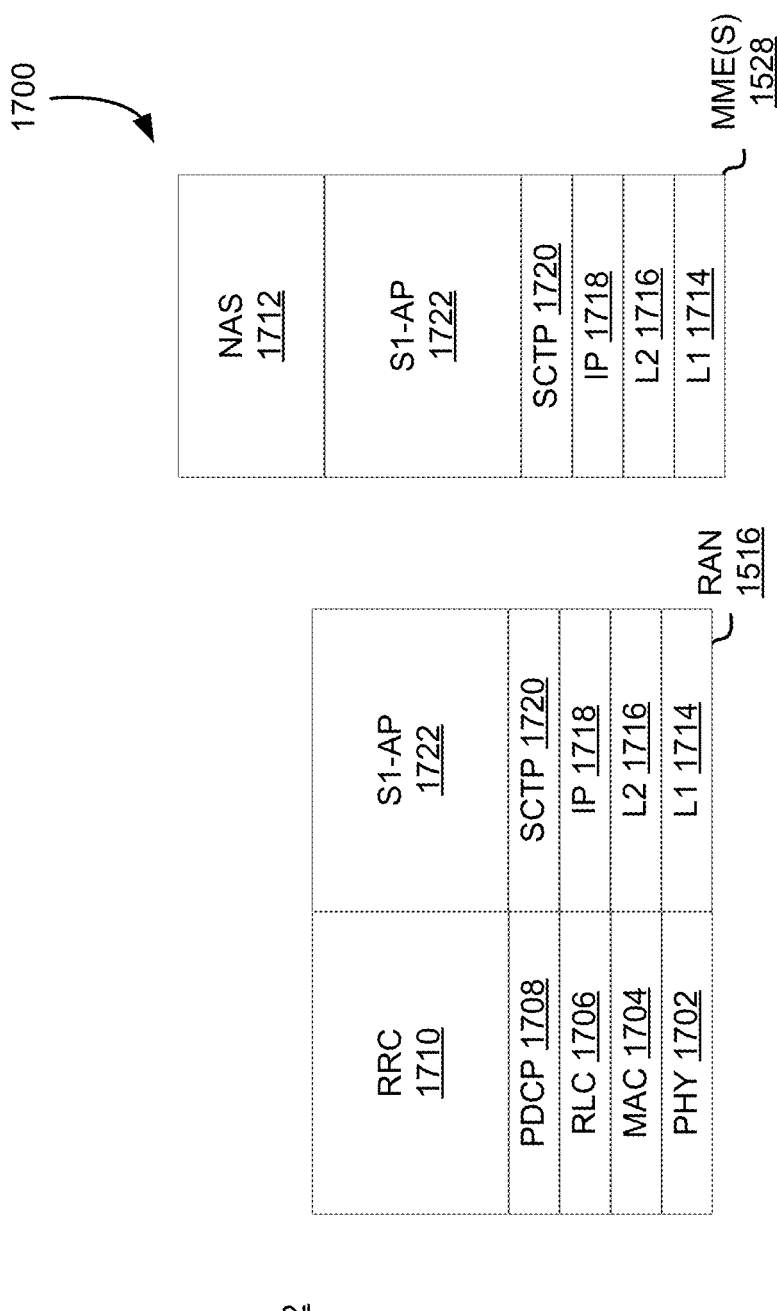
FIG. 17 illustrates a control plane protocol stack, in accordance with at least one embodiment.
Figure 17:
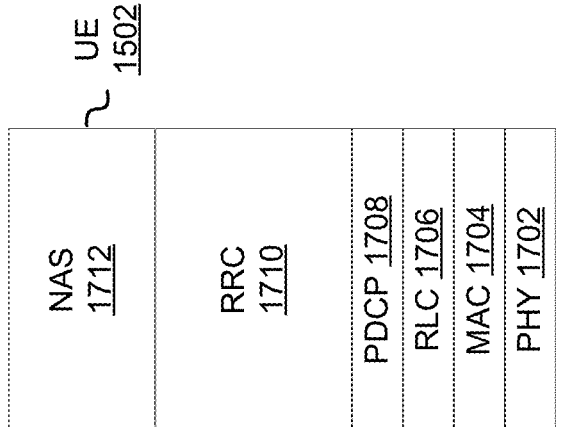

FIG. 17 is an illustration of a control plane protocol stack in accordance with some embodiments. In at least one embodiment, a control plane 1700 is shown as a communications protocol stack between UE 1502 (or alternatively, UE 1504), RAN 1516, and MME(s) 1528.

In at least one embodiment, PHY layer 1702 may transmit or receive information used by MAC layer 1704 over one or more air interfaces. In at least one embodiment, PHY layer 1702 may further perform link adaptation or adaptive modulation and coding (AMC), power control, cell search (e.g., for initial synchronization and handover purposes), and other measurements used by higher layers, such as an RRC layer 1710. In at least one embodiment, PHY layer 1702 may still further perform error detection on transport channels, forward error correction (FEC) coding/de-coding of transport channels, modulation/demodulation of physical channels, interleaving, rate matching, mapping onto physical channels, and Multiple Input Multiple Output (MIMO) antenna processing.

In at least one embodiment, MAC layer 1704 may perform mapping between logical channels and transport channels, multiplexing of MAC service data units (SDUs) from one or more logical channels onto transport blocks (TB) to be delivered to PHY via transport channels, de-multiplexing MAC SDUs to one or more logical channels from transport blocks (TB) delivered from PHY via transport channels, multiplexing MAC SDUs onto TB s, scheduling information reporting, error correction through hybrid automatic repeat request (HARD), and logical channel prioritization.

In at least one embodiment, RLC layer 1706 may operate in a plurality of modes of operation, including: Transparent Mode (TM), Unacknowledged Mode (UM), and Acknowledged Mode (AM). In at least one embodiment, RLC layer 1706 may execute transfer of upper layer protocol data units (PDUs), error correction through automatic repeat request (ARQ) for AM data transfers, and concatenation, segmentation and reassembly of RLC SDUs for UM and AM data transfers. In at least one embodiment, RLC layer 1706 may also execute re-segmentation of RLC data PDUs for AM data transfers, reorder RLC data PDUs for UM and AM data transfers, detect duplicate data for UM and AM data transfers, discard RLC SDUs for UM and AM data transfers, detect protocol errors for AM data transfers, and perform RLC re-establishment.

In at least one embodiment, PDCP layer 1708 may execute header compression and decompression of IP data, maintain PDCP Sequence Numbers (SNs), perform in-sequence delivery of upper layer PDUs at re-establishment of lower layers, eliminate duplicates of lower layer SDUs at re-establishment of lower layers for radio bearers mapped on RLC AM, cipher and decipher control plane data, perform integrity protection and integrity verification of control plane data, control timer-based discard of data, and perform security operations (e.g., ciphering, deciphering, integrity protection, integrity verification, etc.).

In at least one embodiment, main services and functions of a RRC layer 1710 may include broadcast of system information (e.g., included in Master Information Blocks (MIBs) or System Information Blocks (SIBs) related to a non-access stratum (NAS)), broadcast of system information related to an access stratum (AS), paging, establishment, maintenance and release of an RRC connection between an UE and E-UTRAN (e.g., RRC connection paging, RRC connection establishment, RRC connection modification, and RRC connection release), establishment, configuration, maintenance and release of point-to-point radio bearers, security functions including key management, inter radio access technology (RAT) mobility, and measurement configuration for UE measurement reporting. In at least one embodiment, said MIBs and SIBs may comprise one or more information elements (IEs), which may each comprise individual data fields or data structures.

In at least one embodiment, UE 1502 and RAN 1516 may utilize a Uu interface (e.g., an LTE-Uu interface) to exchange control plane data via a protocol stack comprising PHY layer 1702, MAC layer 1704, RLC layer 1706, PDCP layer 1708, and RRC layer 1710.

In at least one embodiment, non-access stratum (NAS) protocols (NAS protocols 1712) form a highest stratum of a control plane between UE 1502 and MME(s) 1528. In at least one embodiment, NAS protocols 1712 support mobility of UE 1502 and session management procedures to establish and maintain IP connectivity between UE 1502 and P-GW 1534.

In at least one embodiment, Si Application Protocol (S1-AP) layer (Si-AP layer 1722) may support functions of a Si interface and comprise Elementary Procedures (EPs). In at least one embodiment, an EP is a unit of interaction between RAN 1516 and CN 1528. In at least one embodiment, S1-AP layer services may comprise two groups: UE-associated services and non UE-associated services. In at least one embodiment, these services perform functions including, but not limited to: E-UTRAN Radio Access Bearer (E-RAB) management, UE capability indication, mobility, NAS signaling transport, RAN Information Management (RIM), and configuration transfer.

In at least one embodiment, Stream Control Transmission Protocol (SCTP) layer (alternatively referred to as a stream control transmission protocol/internet protocol (SCTP/IP) layer) (SCTP layer 1720) may ensure reliable delivery of signaling messages between RAN 1516 and MME(s) 1528 based, in part, on an IP protocol, supported by an IP layer 1718. In at least one embodiment, L2 layer 1716 and an L1 layer 1714 may refer to communication links (e.g., wired or wireless) used by a RAN node and MME to exchange information.

In at least one embodiment, RAN 1516 and MME(s) 1528 may utilize an S1-MME interface to exchange control plane data via a protocol stack comprising a L1 layer 1714, L2 layer 1716, IP layer 1718, SCTP layer 1720, and S1-AP layer 1722.

Figure 18:
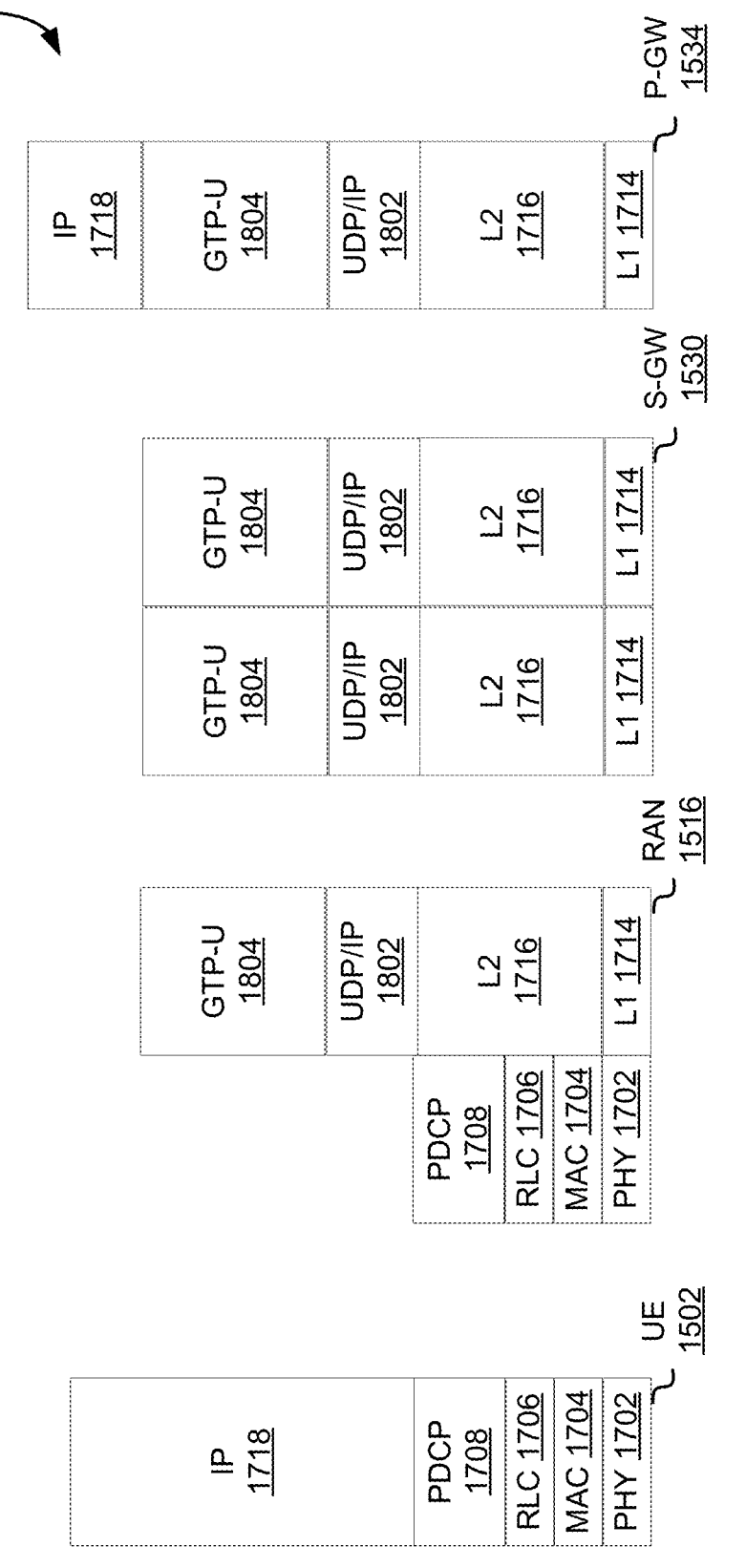
FIG. 18 illustrates a user plane protocol stack, in accordance with at least one embodiment.

FIG. 18 is an illustration of a user plane protocol stack in accordance with at least one embodiment. In at least one embodiment, a user plane 1800 is shown as a communications protocol stack between a UE 1502, RAN 1516, S-GW 1530, and P-GW 1534. In at least one embodiment, user plane 1800 may utilize a same protocol layers as control plane 1700. In at least one embodiment, for example, UE 1502 and RAN 1516 may utilize a Uu interface (e.g., an LTE-Uu interface) to exchange user plane data via a protocol stack comprising PHY layer 1702, MAC layer 1704, RLC layer 1706, PDCP layer 1708.

In at least one embodiment, General Packet Radio Service (GPRS) Tunneling Protocol for a user plane (GTP-U) layer (GTP-U layer 1804) may be used for carrying user data within a GPRS core network and between a radio access network and a core network. In at least one embodiment, user data transported can be packets in any of IPv4, IPv6, or PPP formats, for example. In at least one embodiment, UDP and IP security (UDP/IP) layer (UDP/IP layer 1802) may provide checksums for data integrity, port numbers for addressing different functions at a source and destination, and encryption and authentication on selected data flows. In at least one embodiment, RAN 1516 and S-GW 1530 may utilize an S1-U interface to exchange user plane data via a protocol stack comprising L1 layer 1714, L2 layer 1716, UDP/IP layer 1802, and GTP-U layer 1804. In at least one embodiment, S-GW 1530 and P-GW 1534 may utilize an S5/S8a interface to exchange user plane data via a protocol stack comprising L1 layer 1714, L2 layer 1716, UDP/IP layer 1802, and GTP-U layer 1804. In at least one embodiment, as discussed above with respect to FIG. 17, NAS protocols support a mobility of UE 1502 and session management procedures to establish and maintain IP connectivity between UE 1502 and P-GW 1534.

Figure 19:
FIG. 19 illustrates components of a core network, in accordance with at least one embodiment.
Figure 19:
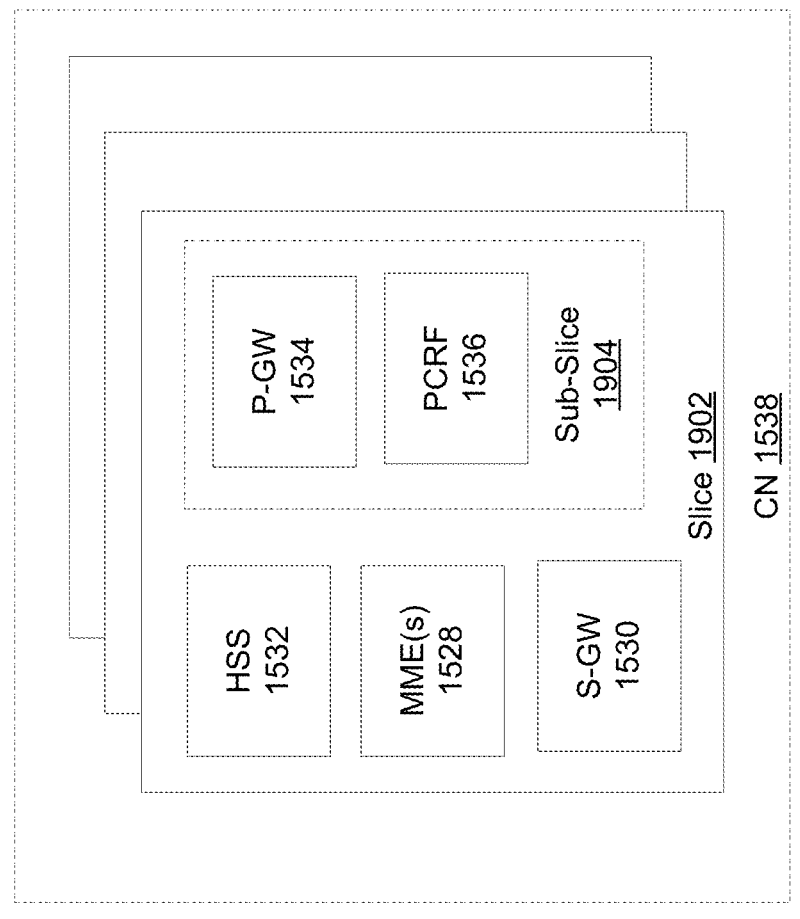

FIG. 19 illustrates components 1900 of a core network in accordance with at least one embodiment. In at least one embodiment, components of CN 1538 may be implemented in one physical node or separate physical nodes including components to read and execute instructions from a machine-readable or computer-readable medium (e.g., a non-transitory machine-readable storage medium). In at least one embodiment, Network Functions Virtualization (NFV) is utilized to virtualize any or all of above described network node functions via executable instructions stored in one or more computer readable storage mediums (described in further detail below). In at least one embodiment, a logical instantiation of CN 1538 may be referred to as a network slice 1902 (e.g., network slice 1902 is shown to include HSS 1532, MME(s) 1528, and S-GW 1530). In at least one embodiment, a logical instantiation of a portion of CN 1538 may be referred to as a network sub-slice 1904 (e.g., network sub-slice 1904 is shown to include P-GW 1534 and PCRF 1536).

In at least one embodiment, NFV architectures and infrastructures may be used to virtualize one or more network functions, alternatively performed by proprietary hardware, onto physical resources comprising a combination of industry-standard server hardware, storage hardware, or switches. In at least one embodiment, NFV systems can be used to execute virtual or reconfigurable implementations of one or more EPC components/functions.

Figure 20:
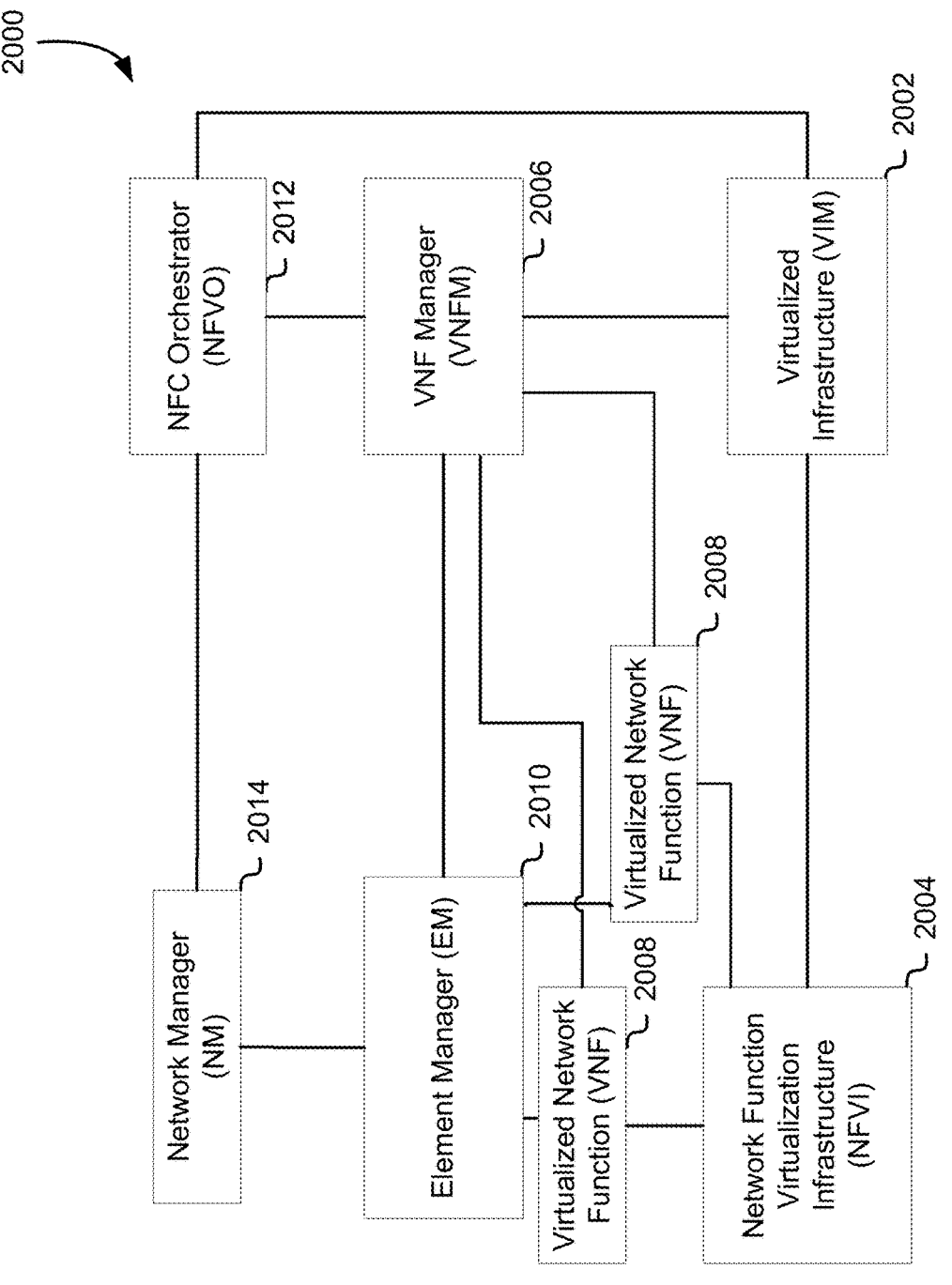
FIG. 20 illustrates components of a system to support network function virtualization (NFV), in accordance with at least one embodiment.

FIG. 20 is a block diagram illustrating components, according to at least one embodiment, of a system 2000 to support network function virtualization (NFV). In at least one embodiment, system 2000 is illustrated as including a virtualized infrastructure manager (shown as VIM 2002), a network function virtualization infrastructure (shown as NFVI 2004), a VNF manager (shown as VNFM 2006), virtualized network functions (shown as VNF 2008), an element manager (shown as EM 2010), an NFV Orchestrator (shown as NFVO 2012), and a network manager (shown as NM 2014).

In at least one embodiment, VIM 2002 manages resources of NFVI 2004. In at least one embodiment, NFVI 2004 can include physical or virtual resources and applications (including hypervisors) used to execute system 2000. In at least one embodiment, VIM 2002 may manage a life cycle of virtual resources with NFVI 2004 (e.g., creation, maintenance, and tear down of virtual machines (VMs) associated with one or more physical resources), track VM instances, track performance, fault and security of VM instances and associated physical resources, and expose VM instances and associated physical resources to other management systems.

In at least one embodiment, VNFM 2006 may manage VNF 2008. In at least one embodiment, VNF 2008 may be used to execute EPC components/functions. In at least one embodiment, VNFM 2006 may manage a life cycle of VNF 2008 and track performance, fault and security of virtual aspects of VNF 2008. In at least one embodiment, EM 2010 may track performance, fault and security of functional aspects of VNF 2008. In at least one embodiment, tracking data from VNFM 2006 and EM 2010 may comprise, for example, performance measurement (PM) data used by VIM 2002 or NFVI 2004. In at least one embodiment, both VNFM 2006 and EM 2010 can scale up/down a quantity of VNFs of system 2000.

In at least one embodiment, NFVO 2012 may coordinate, authorize, release and engage resources of NFVI 2004 in order to provide a requested service (e.g., to execute an EPC function, component, or slice). In at least one embodiment, NM 2014 may provide a package of end-user functions with responsibility for a management of a network, which may include network elements with VNFs, non-virtualized network functions, or both (management of VNFs may occur via an EM 2010).

Computer-Based Systems

The following figures set forth, without limitation, exemplary computer-based systems that can be used to implement at least one embodiment.

Figure 21:
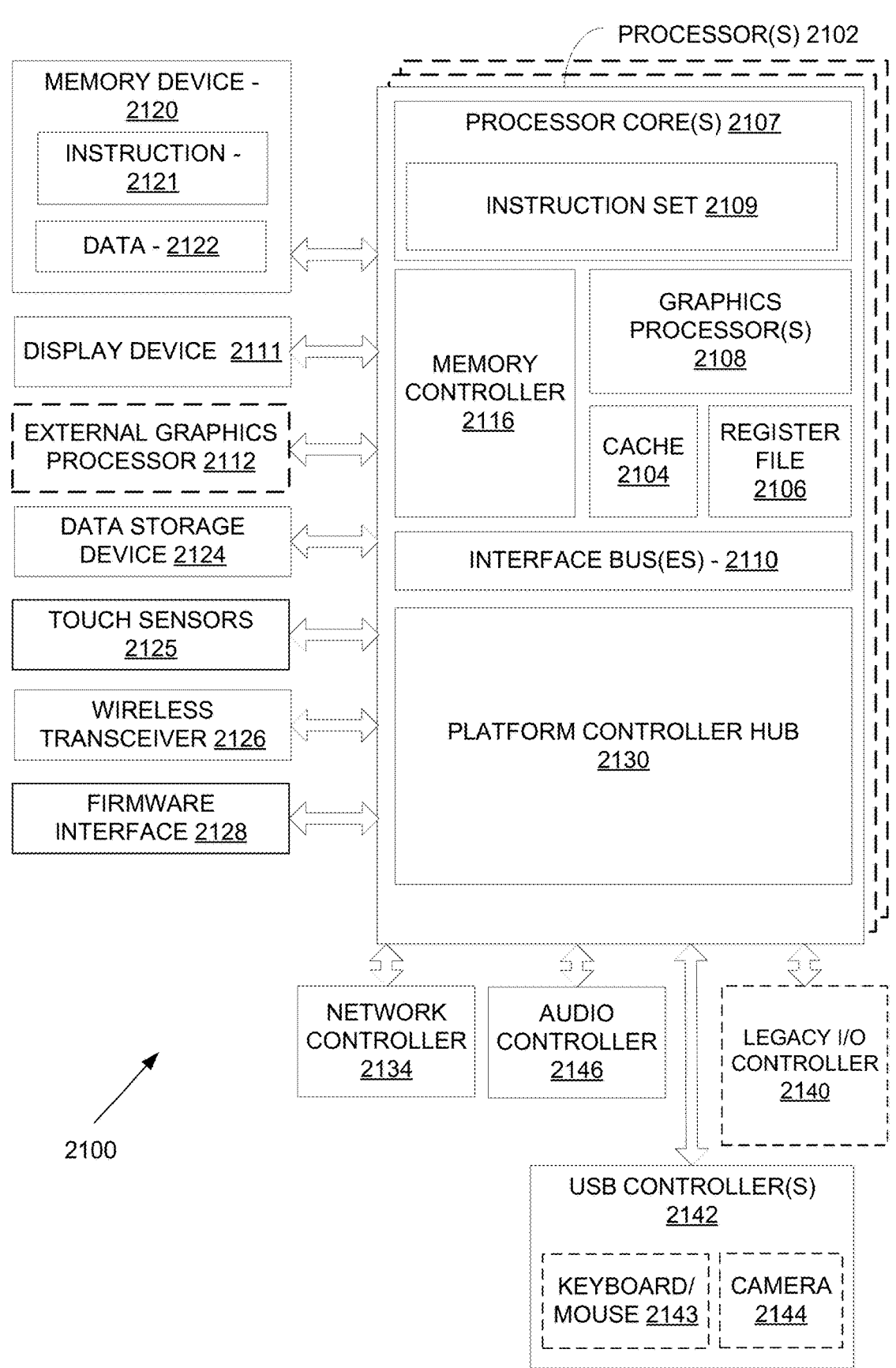
FIG. 21 illustrates a processing system, in accordance with at least one embodiment.

FIG. 21 illustrates a processing system 2100, in accordance with at least one embodiment. In at least one embodiment, processing system 2100 includes one or more processors 2102 and one or more graphics processors 2108, and may be a single processor desktop system, a multiprocessor workstation system, or a server system having a large number of processors 2102 or processor cores 2107. In at least one embodiment, processing system 2100 is a processing platform incorporated within a system-on-a-chip ("SoC") integrated circuit for use in mobile, handheld, or embedded devices.

In at least one embodiment, processing system 2100 can include, or be incorporated within a server-based gaming platform, a game console, a media console, a mobile gaming console, a handheld game console, or an online game console. In at least one embodiment, processing system 2100 is a mobile phone, smart phone, tablet computing device or mobile Internet device. In at least one embodiment, processing system 2100 can also include, couple with, or be integrated within a wearable device, such as a smart watch wearable device, smart eyewear device, augmented reality device, or virtual reality device. In at least one embodiment, processing system 2100 is a television or set top box device having one or more processors 2102 and a graphical interface generated by one or more graphics processors 2108.

In at least one embodiment, one or more processors 2102 each include one or more processor cores 2107 to process instructions which, when executed, perform operations for system and user software. In at least one embodiment, each of one or more processor cores 2107 is configured to process a specific instruction set 2109. In at least one embodiment, instruction set 2109 may facilitate Complex Instruction Set Computing ("CISC"), Reduced Instruction Set Computing ("RISC"), or computing via a Very Long Instruction Word ("VLIW"). In at least one embodiment, processor cores 2107 may each process a different instruction set 2109, which may include instructions to facilitate emulation of other instruction sets. In at least one embodiment, processor core 2107 may also include other processing devices, such as a digital signal processor ("DSP").

In at least one embodiment, processor 2102 includes cache memory ("cache") 2104. In at least one embodiment, processor 2102 can have a single internal cache or multiple levels of internal cache. In at least one embodiment, cache memory is shared among various components of processor 2102. In at least one embodiment, processor 2102 also uses an external cache (e.g., a Level 3 ("L3") cache or Last Level Cache ("LLC")) (not shown), which may be shared among processor cores 2107 using known cache coherency techniques. In at least one embodiment, register file 2106 is additionally included in processor 2102 which may include different types of registers for storing different types of data (e.g., integer registers, floating point registers, status registers, and an instruction pointer register). In at least one embodiment, register file 2106 may include general-purpose registers or other registers.

In at least one embodiment, one or more processor(s) 2102 are coupled with one or more interface bus(es) 2110 to transmit communication signals such as address, data, or control signals between processor 2102 and other components in processing system 2100. In at least one embodiment interface bus 2110, in one embodiment, can be a processor bus, such as a version of a Direct Media Interface ("DMI") bus. In at least one embodiment, interface bus 2110 is not limited to a DMI bus, and may include one or more Peripheral Component Interconnect buses (e.g., "PCI," PCI Express ("PCIe")), memory buses, or other types of interface buses. In at least one embodiment processor(s) 2102 include an integrated memory controller 2116 and a platform controller hub 2130. In at least one embodiment, memory controller 2116 facilitates communication between a memory device and other components of processing system 2100, while platform controller hub ("PCH") 2130 provides connections to Input/Output ("I/O") devices via a local I/O bus.

In at least one embodiment, memory device 2120 can be a dynamic random access memory ("DRAM") device, a static random access memory ("SRAM") device, flash memory device, phase-change memory device, or some other memory device having suitable performance to serve as processor memory. In at least one embodiment memory device 2120 can operate as system memory for processing system 2100, to store data 2122 and instructions 2121 for use when one or more processors 2102 executes an application or process. In at least one embodiment, memory controller 2116 also couples with an optional external graphics processor 2112, which may communicate with one or more graphics processors 2108 in processors 2102 to perform graphics and media operations. In at least one embodiment, a display device 2111 can connect to processor(s) 2102. In at least one embodiment display device 2111 can include one or more of an internal display device, as in a mobile electronic device or a laptop device or an external display device attached via a display interface (e.g., DisplayPort, etc.). In at least one embodiment, display device 2111 can include a head mounted display ("HMD") such as a stereoscopic display device for use in virtual reality ("VR") applications or augmented reality ("AR") applications.

In at least one embodiment, platform controller hub 2130 enables peripherals to connect to memory device 2120 and processor 2102 via a high-speed I/O bus. In at least one embodiment, I/O peripherals include, but are not limited to, an audio controller 2146, a network controller 2134, a firmware interface 2128, a wireless transceiver 2126, touch sensors 2125, a data storage device 2124 (e.g., hard disk drive, flash memory, etc.). In at least one embodiment, data storage device 2124 can connect via a storage interface (e.g., SATA) or via a peripheral bus, such as PCI, or PCIe. In at least one embodiment, touch sensors 2125 can include touch screen sensors, pressure sensors, or fingerprint sensors. In at least one embodiment, wireless transceiver 2126 can be a Wi-Fi transceiver, a Bluetooth transceiver, or a mobile network transceiver such as a 3G, 4G, or Long Term Evolution ("LTE") transceiver. In at least one embodiment, firmware interface 2128 enables communication with system firmware, and can be, for example, a unified extensible firmware interface ("UEFI"). In at least one embodiment, network controller 2134 can enable a network connection to a wired network. In at least one embodiment, a high-performance network controller (not shown) couples with interface bus 2110. In at least one embodiment, audio controller 2146 is a multi-channel high definition audio controller. In at least one embodiment, processing system 2100 includes an optional legacy I/O controller 2140 for coupling legacy (e.g., Personal System 2 ("PS/2")) devices to processing system 2100. In at least one embodiment, platform controller hub 2130 can also connect to one or more Universal Serial Bus ("USB") controllers 2142 connect input devices, such as keyboard and mouse 2143 combinations, a camera 2144, or other USB input devices.

In at least one embodiment, an instance of memory controller 2116 and platform controller hub 2130 may be integrated into a discreet external graphics processor, such as external graphics processor 2112. In at least one embodiment, platform controller hub 2130 and/or memory controller 2116 may be external to one or more processor(s) 2102. For example, in at least one embodiment, processing system 2100 can include an external memory controller 2116 and platform controller hub 2130, which may be configured as a memory controller hub and peripheral controller hub within a system chipset that is in communication with processor(s) 2102.

Figure 22:
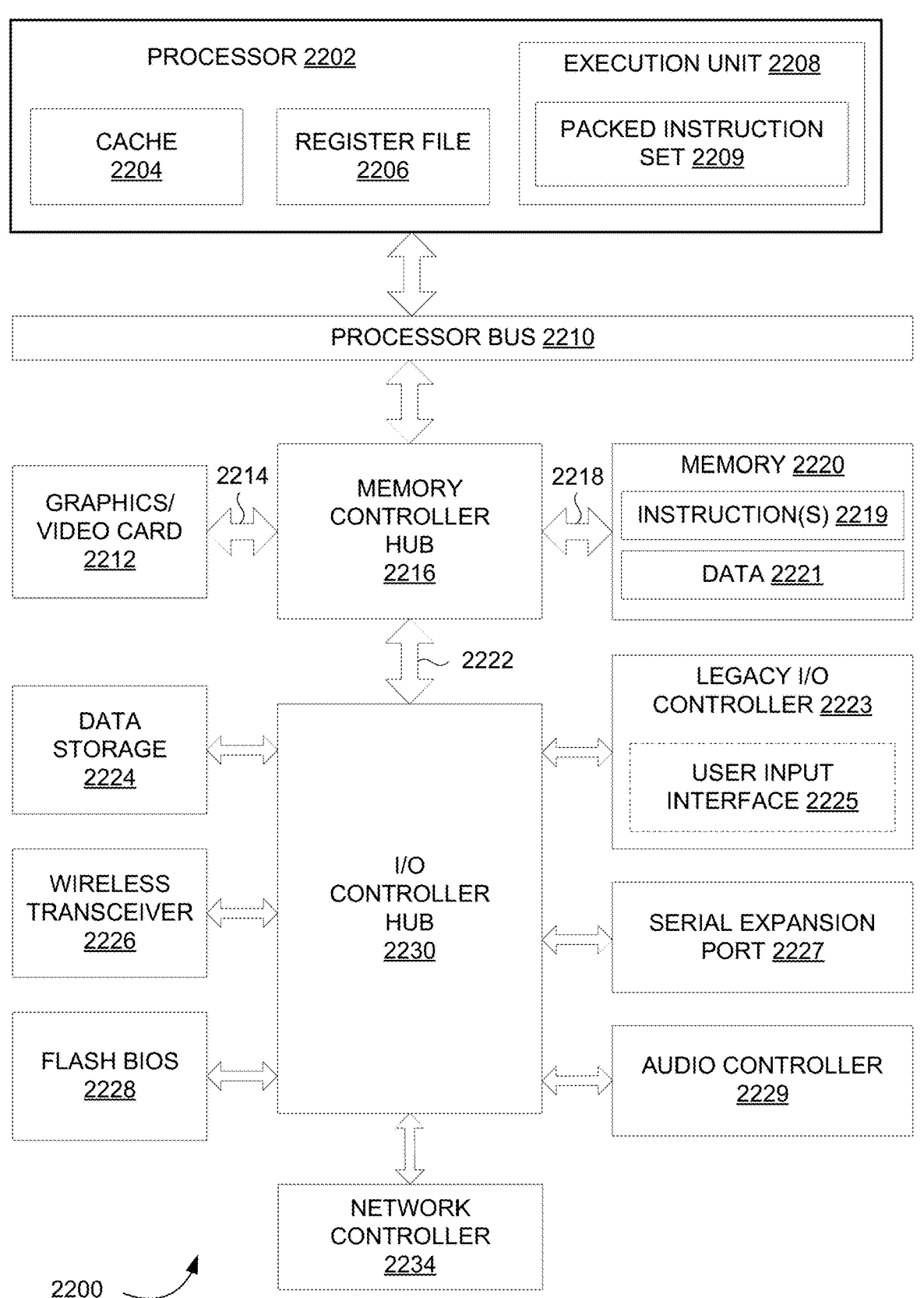
FIG. 22 illustrates a computer system, in accordance with at least one embodiment.

FIG. 22 illustrates a computer system 2200, in accordance with at least one embodiment. In at least one embodiment, computer system 2200 may be a system with interconnected devices and components, an SOC, or some combination. In at least on embodiment, computer system 2200 is formed with a processor 2202 that may include execution units to execute an instruction. In at least one embodiment, computer system 2200 may include, without limitation, a component, such as processor 2202 to employ execution units including logic to perform algorithms for processing data. In at least one embodiment, computer system 2200 may include processors, such as PENTIUM® Processor family, Xeon™, Itanium®, XScale™ and/or StrongARM™, Intel® Core™, or Intel® Nervana™ microprocessors available from Intel Corporation of Santa Clara, California, although other systems (including PCs having other microprocessors, engineering workstations, set-top boxes and like) may also be used. In at least one embodiment, computer system 2200 may execute a version of WINDOWS' operating system available from Microsoft Corporation of Redmond, Wash., although other operating systems (UNIX and Linux for example), embedded software, and/or graphical user interfaces, may also be used.

In at least one embodiment, computer system 2200 may be used in other devices such as handheld devices and embedded applications. Some examples of handheld devices include cellular phones, Internet Protocol devices, digital cameras, personal digital assistants ("PDAs"), and handheld PCs. In at least one embodiment, embedded applications may include a microcontroller, a digital signal processor ("DSP"), an SoC, network computers ("NetPCs"), set-top boxes, network hubs, wide area network ("WAN") switches, or any other system that may perform one or more instructions.

In at least one embodiment, computer system 2200 may include, without limitation, processor 2202 that may include, without limitation, one or more execution units 2208 that may be configured to execute a Compute Unified Device Architecture ("CUDA") (CUDA® is developed by NVIDIA Corporation of Santa Clara, CA) program. In at least one embodiment, a CUDA program is at least a portion of a software application written in a CUDA programming language. In at least one embodiment, computer system 2200 is a single processor desktop or server system. In at least one embodiment, computer system 2200 may be a multiprocessor system. In at least one embodiment, processor 2202 may include, without limitation, a CISC microprocessor, a RISC microprocessor, a VLIW microprocessor, a processor implementing a combination of instruction sets, or any other processor device, such as a digital signal processor, for example. In at least one embodiment, processor 2202 may be coupled to a processor bus 2210 that may transmit data signals between processor 2202 and other components in computer system 2200.

In at least one embodiment, processor 2202 may include, without limitation, a Level 1 ("L1") internal cache memory ("cache") 2204. In at least one embodiment, processor 2202 may have a single internal cache or multiple levels of internal cache. In at least one embodiment, cache memory may reside external to processor 2202. In at least one embodiment, processor 2202 may also include a combination of both internal and external caches. In at least one embodiment, a register file 2206 may store different types of data in various registers including, without limitation, integer registers, floating point registers, status registers, and instruction pointer register.

In at least one embodiment, execution unit 2208, including, without limitation, logic to perform integer and floating point operations, also resides in processor 2202. Processor 2202 may also include a microcode ("ucode") read only memory ("ROM") that stores microcode for certain macro instructions. In at least one embodiment, execution unit 2208 may include logic to handle a packed instruction set 2209. In at least one embodiment, by including packed instruction set 2209 in an instruction set of a general-purpose processor 2202, along with associated circuitry to execute instructions, operations used by many multimedia applications may be performed using packed data in a general-purpose processor 2202. In at least one embodiment, many multimedia applications may be accelerated and executed more efficiently by using full width of a processor's data bus for performing operations on packed data, which may eliminate a need to transfer smaller units of data across a processor's data bus to perform one or more operations one data element at a time.

In at least one embodiment, execution unit 2208 may also be used in microcontrollers, embedded processors, graphics devices, DSPs, and other types of logic circuits. In at least one embodiment, computer system 2200 may include, without limitation, a memory 2220. In at least one embodiment, memory 2220 may be implemented as a DRAM device, an SRAM device, flash memory device, or other memory device. Memory 2220 may store instruction(s) 2219 and/or data 2221 represented by data signals that may be executed by processor 2202.

In at least one embodiment, a system logic chip may be coupled to processor bus 2210 and memory 2220. In at least one embodiment, a system logic chip may include, without limitation, a memory controller hub ("MCH") 2216, and processor 2202 may communicate with MCH 2216 via processor bus 2210. In at least one embodiment, MCH 2216 may provide a high bandwidth memory path 2218 to memory 2220 for instruction and data storage and for storage of graphics commands, data and textures. In at least one embodiment, MCH 2216 may direct data signals between processor 2202, memory 2220, and other components in computer system 2200 and to bridge data signals between processor bus 2210, memory 2220, and a system I/O 2222. In at least one embodiment, system logic chip may provide a graphics port for coupling to a graphics controller. In at least one embodiment, MCH 2216 may be coupled to memory 2220 through high bandwidth memory path 2218 and graphics/video card 2212 may be coupled to MCH 2216 through an Accelerated Graphics Port ("AGP") interconnect 2214.

In at least one embodiment, computer system 2200 may use system I/O 2222 that is a proprietary hub interface bus to couple MCH 2216 to I/O controller hub ("ICH") 2230. In at least one embodiment, ICH 2230 may provide direct connections to some I/O devices via a local I/O bus. In at least one embodiment, local I/O bus may include, without limitation, a high-speed I/O bus for connecting peripherals to memory 2220, a chipset, and processor 2202. Examples may include, without limitation, an audio controller 2229, a firmware hub ("flash BIOS") 2228, a wireless transceiver 2226, a data storage 2224, a legacy I/O controller 2223 containing a user input interface 2225 and a keyboard interface, a serial expansion port 2227, such as a USB, and a network controller 2234. Data storage 2224 may comprise a hard disk drive, a floppy disk drive, a CD-ROM device, a flash memory device, or other mass storage device.

In at least one embodiment, FIG. 22 illustrates a system, which includes interconnected hardware devices or "chips." In at least one embodiment, FIG. 22 may illustrate an exemplary SoC. In at least one embodiment, devices illustrated in FIG. 22 may be interconnected with proprietary interconnects, standardized interconnects (e.g., PCIe), or some combination thereof. In at least one embodiment, one or more components of system 2200 are interconnected using compute express link ("CXL") interconnects.

Figure 23:
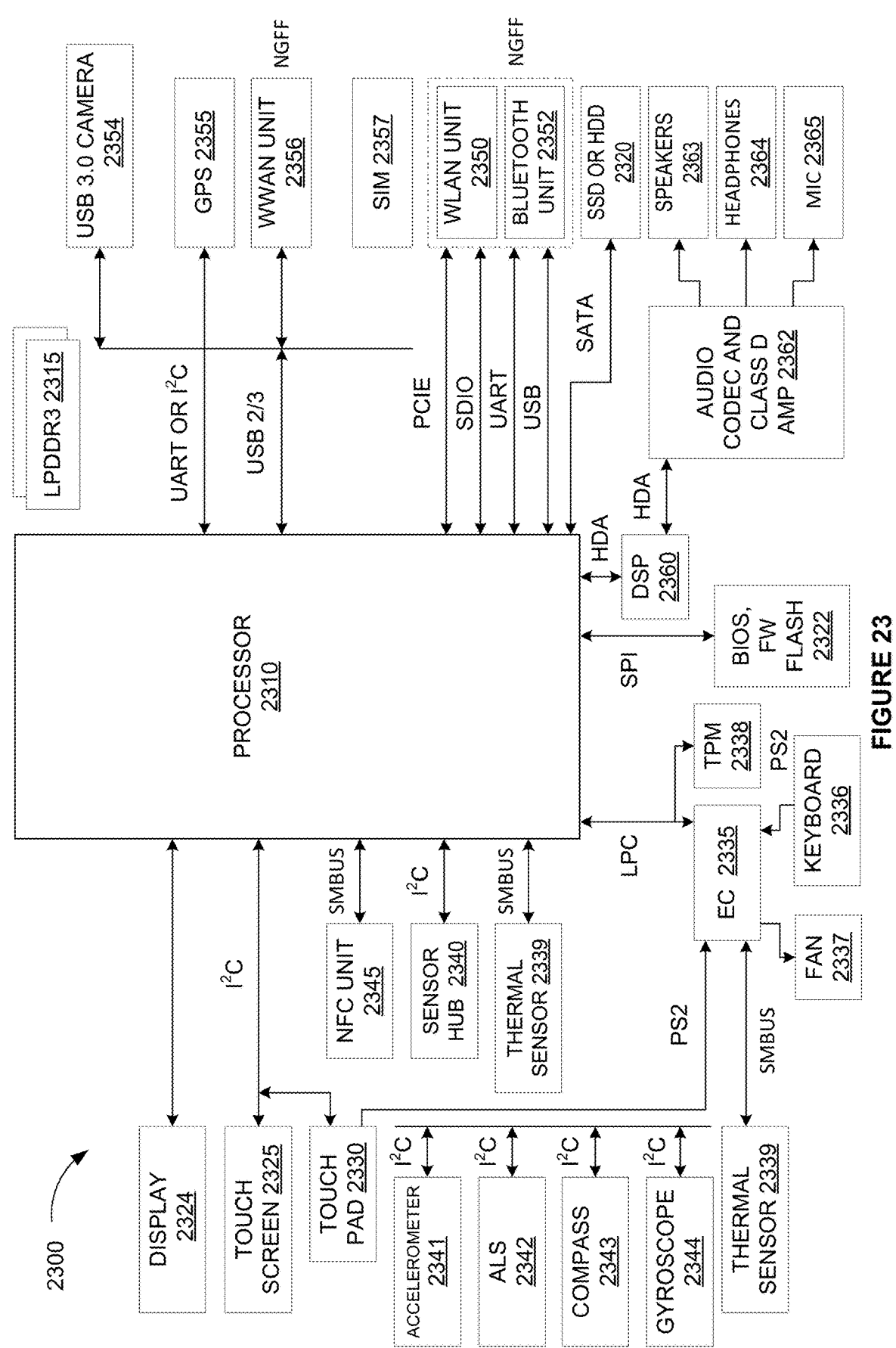
FIG. 23 illustrates a system, in accordance with at least one embodiment.

FIG. 23 illustrates a system 2300, in accordance with at least one embodiment. In at least one embodiment, system 2300 is an electronic device that utilizes a processor 2310. In at least one embodiment, system 2300 may be, for example and without limitation, a notebook, a tower server, a rack server, a blade server, a laptop, a desktop, a tablet, a mobile device, a phone, an embedded computer, or any other suitable electronic device.

In at least one embodiment, system 2300 may include, without limitation, processor 2310 communicatively coupled to any suitable number or kind of components, peripherals, modules, or devices. In at least one embodiment, processor 2310 is coupled using a bus or interface, such as an I²C bus, a System Management Bus ("SMBus"), a Low Pin Count ("LPC") bus, a Serial Peripheral Interface ("SPI"), a High Definition Audio ("HDA") bus, a Serial Advance Technology Attachment ("SATA") bus, a USB (versions 1, 2, 3), or a Universal Asynchronous Receiver/Transmitter ("UART") bus. In at least one embodiment, FIG. 23 illustrates a system which includes interconnected hardware devices or "chips." In at least one embodiment, FIG. 23 may illustrate an exemplary SoC. In at least one embodiment, devices illustrated in FIG. 23 may be interconnected with proprietary interconnects, standardized interconnects (e.g., PCIe) or some combination thereof. In at least one embodiment, one or more components of FIG. 23 are interconnected using CXL interconnects.

In at least one embodiment, FIG. 23 may include a display 2324, a touch screen 2325, a touch pad 2330, a Near Field Communications unit ("NFC") 2345, a sensor hub 2340, a thermal sensor 2346, an Express Chipset ("EC") 2335, a Trusted Platform Module ("TPM") 2338, BIOS/firmware/flash memory ("BIOS, FW Flash") 2322, a DSP 2360, a Solid State Disk ("SSD") or Hard Disk Drive ("HDD") 2320, a wireless local area network unit ("WLAN") 2350, a Bluetooth unit 2352, a Wireless Wide Area Network unit ("WWAN") 2356, a Global Positioning System ("GPS") 2355, a camera ("USB 3.0 camera") 2354 such as a USB 3.0 camera, or a Low Power Double Data Rate ("LPDDR") memory unit ("LPDDR3") 2315 implemented in, for example, LPDDR3 standard. These components may each be implemented in any suitable manner.

In at least one embodiment, other components may be communicatively coupled to processor 2310 through components discussed above. In at least one embodiment, an accelerometer 2341, an Ambient Light Sensor ("ALS") 2342, a compass 2343, and a gyroscope 2344 may be communicatively coupled to sensor hub 2340. In at least one embodiment, a thermal sensor 2339, a fan 2337, a keyboard 2346, and a touch pad 2330 may be communicatively coupled to EC 2335. In at least one embodiment, a speaker 2363, a headphones 2364, and a microphone ("mic") 2365 may be communicatively coupled to an audio unit ("audio codec and class d amp") 2364, which may in turn be communicatively coupled to DSP 2360. In at least one embodiment, audio unit 2364 may include, for example and without limitation, an audio coder/decoder ("codec") and a class D amplifier. In at least one embodiment, a SIM card ("SIM") 2357 may be communicatively coupled to WWAN unit 2356. In at least one embodiment, components such as WLAN unit 2350 and Bluetooth unit 2352, as well as WWAN unit 2356 may be implemented in a Next Generation Form Factor ("NGFF").

Figure 24:
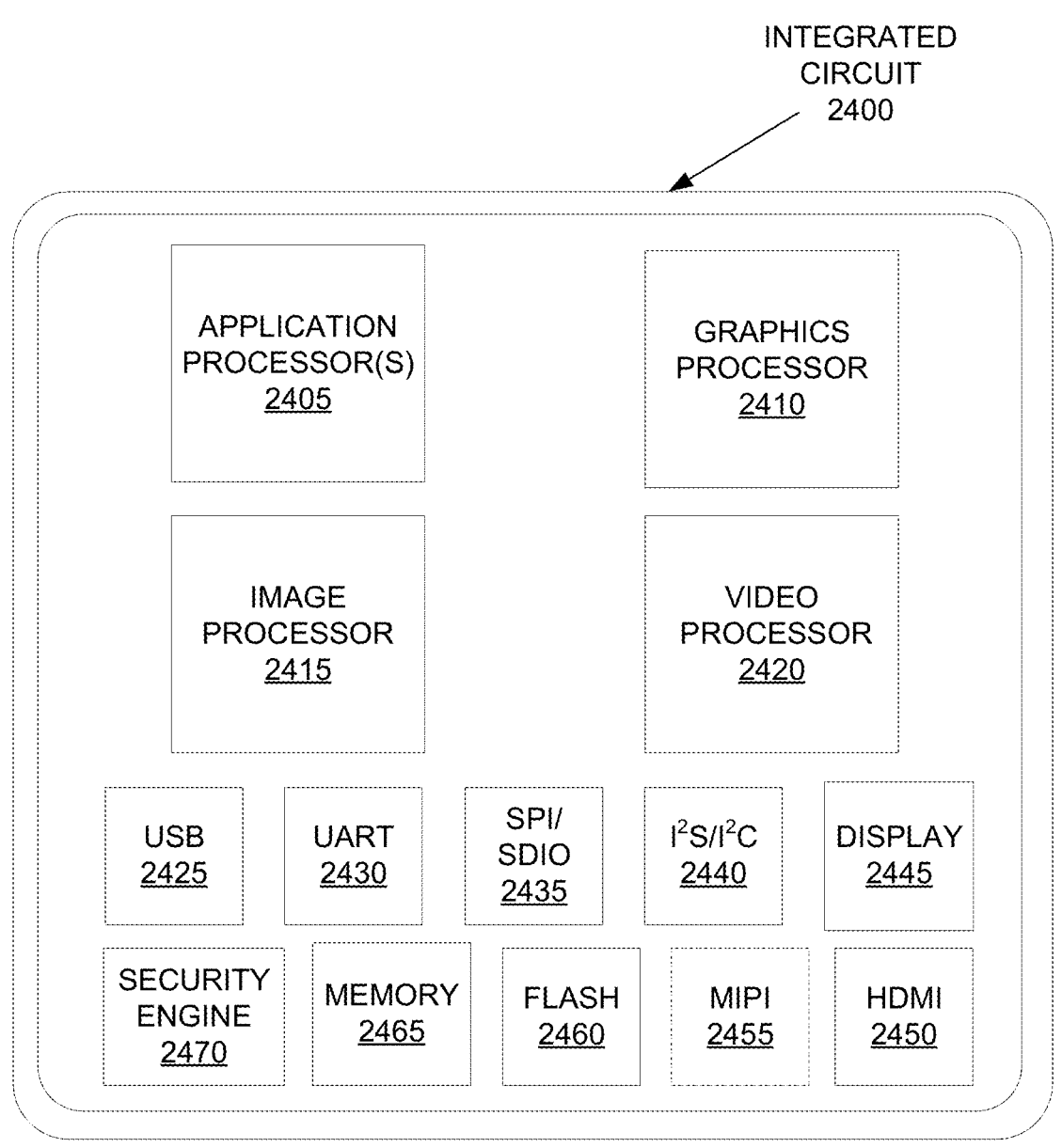
FIG. 24 illustrates an exemplary integrated circuit, in accordance with at least one embodiment.

FIG. 24 illustrates an exemplary integrated circuit 2400, in accordance with at least one embodiment. In at least one embodiment, exemplary integrated circuit 2400 is an SoC that may be fabricated using one or more IP cores. In at least one embodiment, integrated circuit 2400 includes one or more application processor(s) 2405 (e.g., CPUs), at least one graphics processor 2410, and may additionally include an image processor 2415 and/or a video processor 2420, any of which may be a modular IP core. In at least one embodiment, integrated circuit 2400 includes peripheral or bus logic including a USB controller 2425, a UART controller 2430, an SPI/SDIO controller 2435, and an I²S/I²C controller 2440. In at least one embodiment, integrated circuit 2400 can include a display device 2445 coupled to one or more of a high-definition multimedia interface ("HDMI") controller 2450 and a mobile industry processor interface ("MIPI") display interface 2455. In at least one embodiment, storage may be provided by a flash memory subsystem 2460 including flash memory and a flash memory controller. In at least one embodiment, a memory interface may be provided via a memory controller 2465 for access to SDRAM or SRAM memory devices. In at least one embodiment, some integrated circuits additionally include an embedded security engine 2470.

Figure 25:
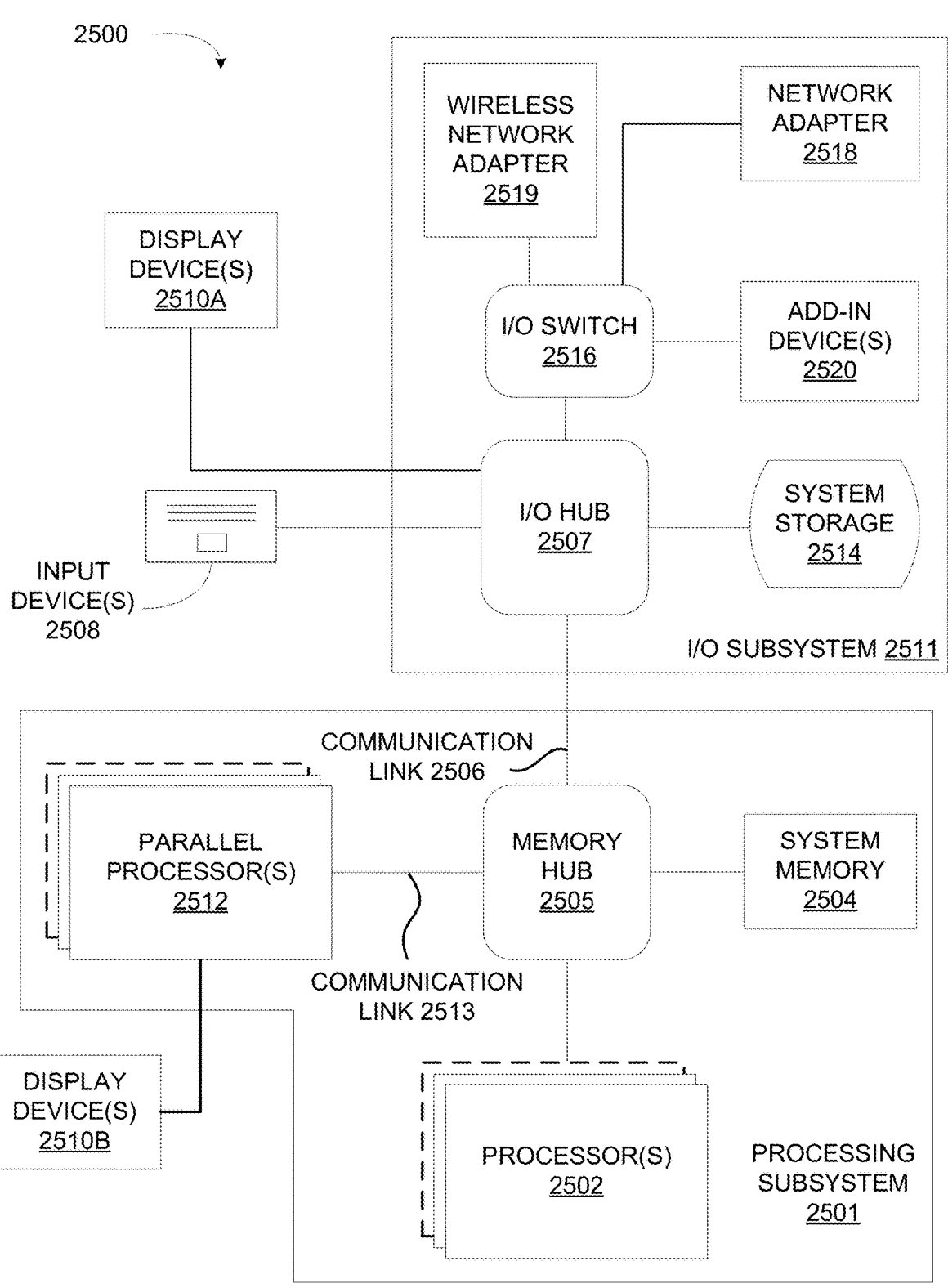
FIG. 25 illustrates a computing system, according to at least one embodiment.

FIG. 25 illustrates a computing system 2500, according to at least one embodiment; In at least one embodiment, computing system 2500 includes a processing subsystem 2501 having one or more processor(s) 2502 and a system memory 2504 communicating via an interconnection path that may include a memory hub 2505. In at least one embodiment, memory hub 2505 may be a separate component within a chipset component or may be integrated within one or more processor(s) 2502. In at least one embodiment, memory hub 2505 couples with an I/O subsystem 2511 via a communication link 2506. In at least one embodiment, I/O subsystem 2511 includes an I/O hub 2507 that can enable computing system 2500 to receive input from one or more input device(s) 2508. In at least one embodiment, I/O hub 2507 can enable a display controller, which may be included in one or more processor(s) 2502, to provide outputs to one or more display device(s) 2510A. In at least one embodiment, one or more display device(s) 2510A coupled with I/O hub 2507 can include a local, internal, or embedded display device.

In at least one embodiment, processing subsystem 2501 includes one or more parallel processor(s) 2512 coupled to memory hub 2505 via a bus or other communication link 2513. In at least one embodiment, communication link 2513 may be one of any number of standards based communication link technologies or protocols, such as, but not limited to PCIe, or may be a vendor specific communications interface or communications fabric. In at least one embodiment, one or more parallel processor(s) 2512 form a computationally focused parallel or vector processing system that can include a large number of processing cores and/or processing clusters, such as a many integrated core processor. In at least one embodiment, one or more parallel processor(s) 2512 form a graphics processing subsystem that can output pixels to one of one or more display device(s) 2510A coupled via I/O Hub 2507. In at least one embodiment, one or more parallel processor(s) 2512 can also include a display controller and display interface (not shown) to enable a direct connection to one or more display device(s) 2510B.

In at least one embodiment, a system storage unit 2514 can connect to I/O hub 2507 to provide a storage mechanism for computing system 2500. In at least one embodiment, an I/O switch 2516 can be used to provide an interface mechanism to enable connections between I/O hub 2507 and other components, such as a network adapter 2518 and/or wireless network adapter 2519 that may be integrated into a platform, and various other devices that can be added via one or more add-in device(s) 2520. In at least one embodiment, network adapter 2518 can be an Ethernet adapter or another wired network adapter. In at least one embodiment, wireless network adapter 2519 can include one or more of a Wi-Fi, Bluetooth, NFC, or other network device that includes one or more wireless radios.

In at least one embodiment, computing system 2500 can include other components not explicitly shown, including USB or other port connections, optical storage drives, video capture devices, and/or variations thereof, that may also be connected to I/O hub 2507. In at least one embodiment, communication paths interconnecting various components in FIG. 25 may be implemented using any suitable protocols, such as PCI based protocols (e.g., PCIe), or other bus or point-to-point communication interfaces and/or protocol(s), such as NVLink high-speed interconnect, or interconnect protocols.

In at least one embodiment, one or more parallel processor(s) 2512 incorporate circuitry optimized for graphics and video processing, including, for example, video output circuitry, and constitutes a graphics processing unit ("GPU"). In at least one embodiment, one or more parallel processor(s) 2512 incorporate circuitry optimized for general purpose processing. In at least one embodiment, components of computing system 2500 may be integrated with one or more other system elements on a single integrated circuit. For example, in at least one embodiment, one or more parallel processor(s) 2512, memory hub 2505, processor(s) 2502, and I/O hub 2507 can be integrated into a SoC integrated circuit. In at least one embodiment, components of computing system 2500 can be integrated into a single package to form a system in package ("SIP") configuration. In at least one embodiment, at least a portion of components of computing system 2500 can be integrated into a multi-chip module ("MCM"), which can be interconnected with other multi-chip modules into a modular computing system. In at least one embodiment, I/O subsystem 2511 and display devices 2510B are omitted from computing system 2500.

Processing Systems

The following figures set forth, without limitation, exemplary processing systems that can be used to implement at least one embodiment.

Figure 26:
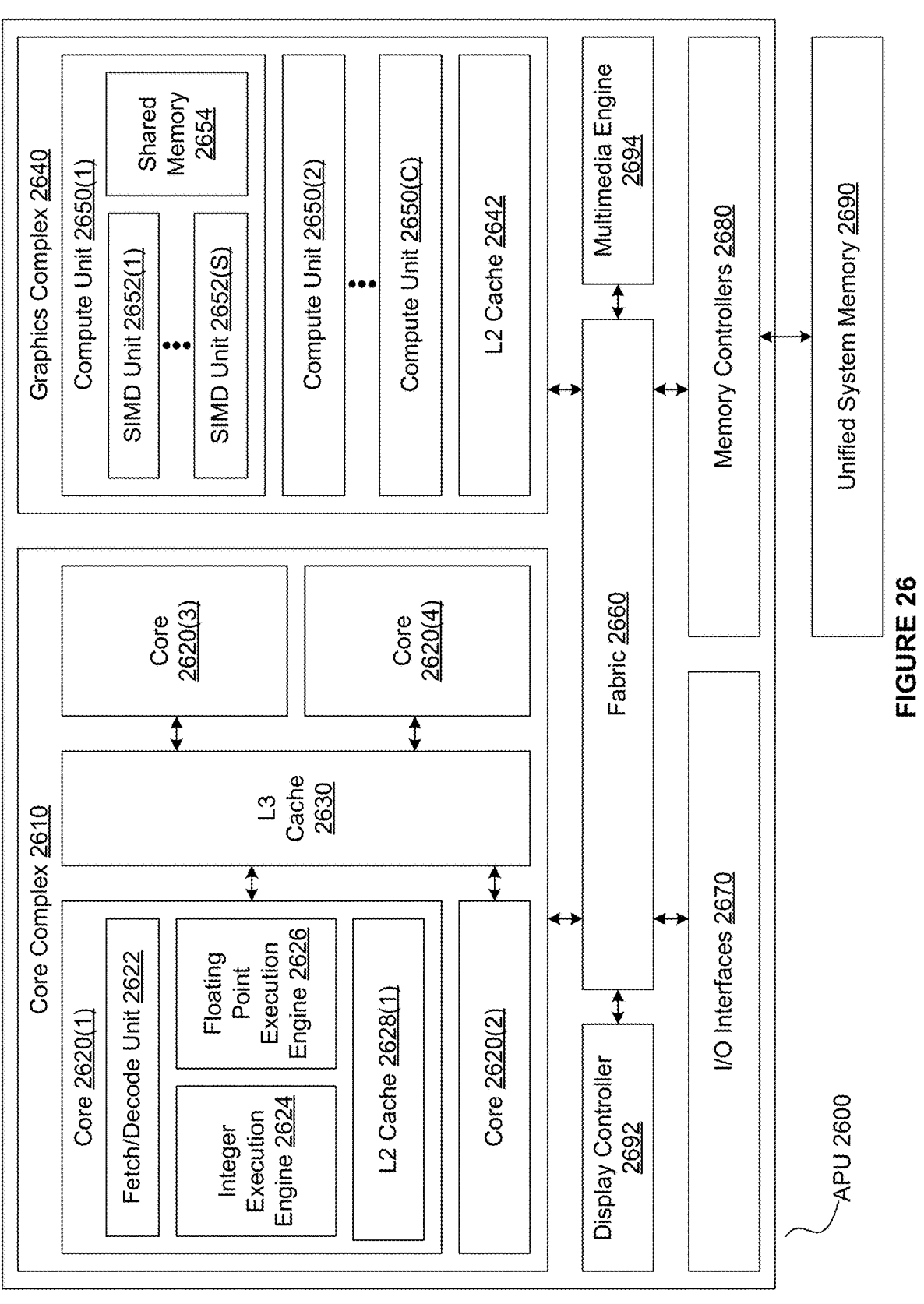
FIG. 26 illustrates an APU, in accordance with at least one embodiment.

FIG. 26 illustrates an accelerated processing unit ("APU") 2600, in accordance with at least one embodiment. In at least one embodiment, APU 2600 is developed by AMD Corporation of Santa Clara, CA. In at least one embodiment, APU 2600 can be configured to execute an application program, such as a CUDA program. In at least one embodiment, APU 2600 includes, without limitation, a core complex 2610, a graphics complex 2640, fabric 2660, I/O interfaces 2670, memory controllers 2680, a display controller 2692, and a multimedia engine 2694. In at least one embodiment, APU 2600 may include, without limitation, any number of core complexes 2610, any number of graphics complexes 2650, any number of display controllers 2692, and any number of multimedia engines 2694 in any combination. For explanatory purposes, multiple instances of like objects are denoted herein with reference numbers identifying an object and parenthetical numbers identifying an instance where needed.

In at least one embodiment, core complex 2610 is a CPU, graphics complex 2640 is a GPU, and APU 2600 is a processing unit that integrates, without limitation, 2610 and 2640 onto a single chip. In at least one embodiment, some tasks may be assigned to core complex 2610 and other tasks may be assigned to graphics complex 2640. In at least one embodiment, core complex 2610 is configured to execute main control software associated with APU 2600, such as an operating system. In at least one embodiment, core complex 2610 is a master processor of APU 2600, controlling and coordinating operations of other processors. In at least one embodiment, core complex 2610 issues commands that control an operation of graphics complex 2640. In at least one embodiment, core complex 2610 can be configured to execute host executable code derived from CUDA source code, and graphics complex 2640 can be configured to execute device executable code derived from CUDA source code.

In at least one embodiment, core complex 2610 includes, without limitation, cores 2620(1)-2620(4) and an L3 cache 2630. In at least one embodiment, core complex 2610 may include, without limitation, any number of cores 2620 and any number and type of caches in any combination. In at least one embodiment, cores 2620 are configured to execute instructions of a particular instruction set architecture ("ISA"). In at least one embodiment, each core 2620 is a CPU core.

In at least one embodiment, each core 2620 includes, without limitation, a fetch/decode unit 2622, an integer execution engine 2624, a floating point execution engine 2626, and an L2 cache 2628. In at least one embodiment, fetch/decode unit 2622 fetches instructions, decodes such instructions, generates micro-operations, and dispatches separate micro-instructions to integer execution engine 2624 and floating point execution engine 2626. In at least one embodiment, fetch/decode unit 2622 can concurrently dispatch one micro-instruction to integer execution engine 2624 and another micro-instruction to floating point execution engine 2626. In at least one embodiment, integer execution engine 2624 executes, without limitation, integer and memory operations. In at least one embodiment, floating point engine 2626 executes, without limitation, floating point and vector operations. In at least one embodiment, fetch-decode unit 2622 dispatches micro-instructions to a single execution engine that replaces both integer execution engine 2624 and floating point execution engine 2626.

In at least one embodiment, each core 2620(i), where i is an integer representing a particular instance of core 2620, may access L2 cache 2628(i) included in core 2620(i). In at least one embodiment, each core 2620 included in core complex 2610(j), where j is an integer representing a particular instance of core complex 2610, is connected to other cores 2620 included in core complex 2610(j) via L3 cache 2630(j) included in core complex 2610(j). In at least one embodiment, cores 2620 included in core complex 2610(j), where j is an integer representing a particular instance of core complex 2610, can access all of L3 cache 2630(j) included in core complex 2610(j). In at least one embodiment, L3 cache 2630 may include, without limitation, any number of slices.

In at least one embodiment, graphics complex 2640 can be configured to perform compute operations in a highly-parallel fashion. In at least one embodiment, graphics complex 2640 is configured to execute graphics pipeline operations such as draw commands, pixel operations, geometric computations, and other operations associated with rendering an image to a display. In at least one embodiment, graphics complex 2640 is configured to execute operations unrelated to graphics. In at least one embodiment, graphics complex 2640 is configured to execute both operations related to graphics and operations unrelated to graphics.

In at least one embodiment, graphics complex 2640 includes, without limitation, any number of compute units 2650 and an L2 cache 2642. In at least one embodiment, compute units 2650 share L2 cache 2642. In at least one embodiment, L2 cache 2642 is partitioned. In at least one embodiment, graphics complex 2640 includes, without limitation, any number of compute units 2650 and any number (including zero) and type of caches. In at least one embodiment, graphics complex 2640 includes, without limitation, any amount of dedicated graphics hardware.

In at least one embodiment, each compute unit 2650 includes, without limitation, any number of SIMD units 2652 and a shared memory 2654. In at least one embodiment, each SIMD unit 2652 implements a SIMD architecture and is configured to perform operations in parallel. In at least one embodiment, each compute unit 2650 may execute any number of thread blocks, but each thread block executes on a single compute unit 2650. In at least one embodiment, a thread block includes, without limitation, any number of threads of execution. In at least one embodiment, a workgroup is a thread block. In at least one embodiment, each SIMD unit 2652 executes a different warp. In at least one embodiment, a warp is a group of threads (e.g., 16 threads), where each thread in a warp belongs to a single thread block and is configured to process a different set of data based on a single set of instructions. In at least one embodiment, predication can be used to disable one or more threads in a warp. In at least one embodiment, a lane is a thread. In at least one embodiment, a work item is a thread. In at least one embodiment, a wavefront is a warp. In at least one embodiment, different wavefronts in a thread block may synchronize together and communicate via shared memory 2654.

In at least one embodiment, fabric 2660 is a system interconnect that facilitates data and control transmissions across core complex 2610, graphics complex 2640, I/O interfaces 2670, memory controllers 2680, display controller 2692, and multimedia engine 2694. In at least one embodiment, APU 2600 may include, without limitation, any amount and type of system interconnect in addition to or instead of fabric 2660 that facilitates data and control transmissions across any number and type of directly or indirectly linked components that may be internal or external to APU 2600. In at least one embodiment, I/O interfaces 2670 are representative of any number and type of I/O interfaces (e.g., PCI, PCI-Extended ("PCI-X"), PCIe, gigabit Ethernet ("GBE"), USB, etc.). In at least one embodiment, various types of peripheral devices are coupled to I/O interfaces 2670 In at least one embodiment, peripheral devices that are coupled to I/O interfaces 2670 may include, without limitation, keyboards, mice, printers, scanners, joysticks or other types of game controllers, media recording devices, external storage devices, network interface cards, and so forth.

In at least one embodiment, display controller AMD92 displays images on one or more display device(s), such as a liquid crystal display ("LCD") device. In at least one embodiment, multimedia engine 240 includes, without limitation, any amount and type of circuitry that is related to multimedia, such as a video decoder, a video encoder, an image signal processor, etc. In at least one embodiment, memory controllers 2680 facilitate data transfers between APU 2600 and a unified system memory 2690. In at least one embodiment, core complex 2610 and graphics complex 2640 share unified system memory 2690.

In at least one embodiment, APU 2600 implements a memory subsystem that includes, without limitation, any amount and type of memory controllers 2680 and memory devices (e.g., shared memory 2654) that may be dedicated to one component or shared among multiple components. In at least one embodiment, APU 2600 implements a cache subsystem that includes, without limitation, one or more cache memories (e.g., L2 caches 2728, L3 cache 2630, and L2 cache 2642) that may each be private to or shared between any number of components (e.g., cores 2620, core complex 2610, SIMD units 2652, compute units 2650, and graphics complex 2640).

Figure 27:
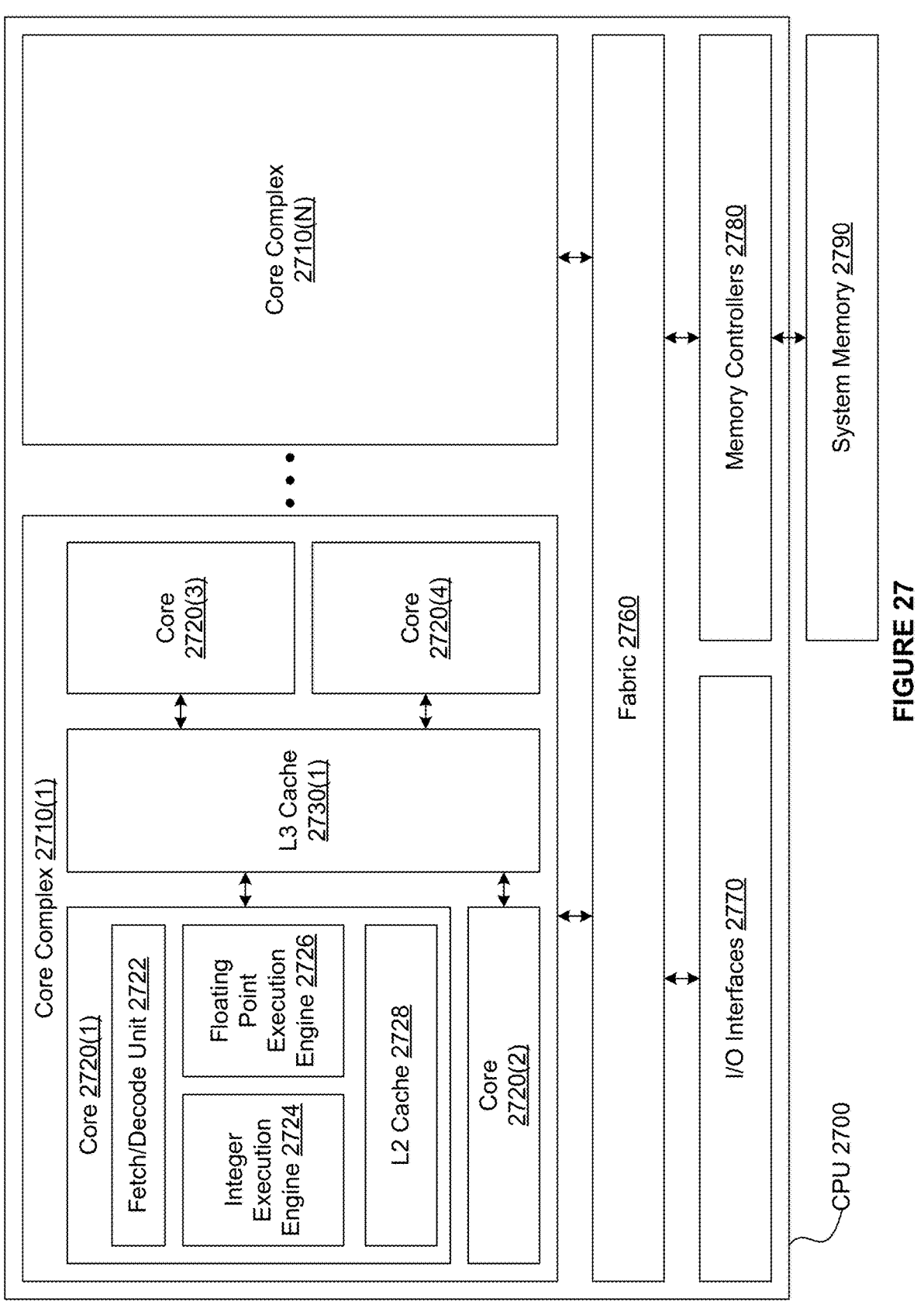
FIG. 27 illustrates a CPU, in accordance with at least one embodiment.

FIG. 27 illustrates a CPU 2700, in accordance with at least one embodiment. In at least one embodiment, CPU 2700 is developed by AMD Corporation of Santa Clara, CA. In at least one embodiment, CPU 2700 can be configured to execute an application program. In at least one embodiment, CPU 2700 is configured to execute main control software, such as an operating system. In at least one embodiment, CPU 2700 issues commands that control an operation of an external GPU (not shown). In at least one embodiment, CPU 2700 can be configured to execute host executable code derived from CUDA source code, and an external GPU can be configured to execute device executable code derived from such CUDA source code. In at least one embodiment, CPU 2700 includes, without limitation, any number of core complexes 2710, fabric 2760, I/O interfaces 2770, and memory controllers 2780.

In at least one embodiment, core complex 2710 includes, without limitation, cores 2720(1)-2720(4) and an L3 cache 2730. In at least one embodiment, core complex 2710 may include, without limitation, any number of cores 2720 and any number and type of caches in any combination. In at least one embodiment, cores 2720 are configured to execute instructions of a particular ISA. In at least one embodiment, each core 2720 is a CPU core.

In at least one embodiment, each core 2720 includes, without limitation, a fetch/decode unit 2722, an integer execution engine 2724, a floating point execution engine 2726, and an L2 cache 2728. In at least one embodiment, fetch/decode unit 2722 fetches instructions, decodes such instructions, generates micro-operations, and dispatches separate micro-instructions to integer execution engine 2724 and floating point execution engine 2726. In at least one embodiment, fetch/decode unit 2722 can concurrently dispatch one micro-instruction to integer execution engine 2724 and another micro-instruction to floating point execution engine 2726. In at least one embodiment, integer execution engine 2724 executes, without limitation, integer and memory operations. In at least one embodiment, floating point engine 2726 executes, without limitation, floating point and vector operations. In at least one embodiment, fetch-decode unit 2722 dispatches micro-instructions to a single execution engine that replaces both integer execution engine 2724 and floating point execution engine 2726.

In at least one embodiment, each core 2720($i$), where i is an integer representing a particular instance of core 2720, may access L2 cache 2728($i$) included in core 2720($i$). In at least one embodiment, each core 2720 included in core complex 2710($j$), where j is an integer representing a particular instance of core complex 2710, is connected to other cores 2720 in core complex 2710($j$) via L3 cache 2730($j$) included in core complex 2710($j$). In at least one embodiment, cores 2720 included in core complex 2710($j$), where j is an integer representing a particular instance of core complex 2710, can access all of L3 cache 2730($j$) included in core complex 2710($j$). In at least one embodiment, L3 cache 2730 may include, without limitation, any number of slices.

In at least one embodiment, fabric 2760 is a system interconnect that facilitates data and control transmissions across core complexes 2710(1)-2710(N) (where N is an integer greater than zero), I/O interfaces 2770, and memory controllers 2780. In at least one embodiment, CPU 2700 may include, without limitation, any amount and type of system interconnect in addition to or instead of fabric 2760 that facilitates data and control transmissions across any number and type of directly or indirectly linked components that may be internal or external to CPU 2700. In at least one embodiment, I/O interfaces 2770 are representative of any number and type of I/O interfaces (e.g., PCI, PCI-X, PCIe, GBE, USB, etc.). In at least one embodiment, various types of peripheral devices are coupled to I/O interfaces 2770 In at least one embodiment, peripheral devices that are coupled to I/O interfaces 2770 may include, without limitation, displays, keyboards, mice, printers, scanners, joysticks or other types of game controllers, media recording devices, external storage devices, network interface cards, and so forth.

In at least one embodiment, memory controllers 2780 facilitate data transfers between CPU 2700 and a system memory 2790. In at least one embodiment, core complex 2710 and graphics complex 2740 share system memory 2790. In at least one embodiment, CPU 2700 implements a memory subsystem that includes, without limitation, any amount and type of memory controllers 2780 and memory devices that may be dedicated to one component or shared among multiple components. In at least one embodiment, CPU 2700 implements a cache subsystem that includes, without limitation, one or more cache memories (e.g., L2 caches 2728 and L3 caches 2730) that may each be private to or shared between any number of components (e.g., cores 2720 and core complexes 2710).

Figure 28:
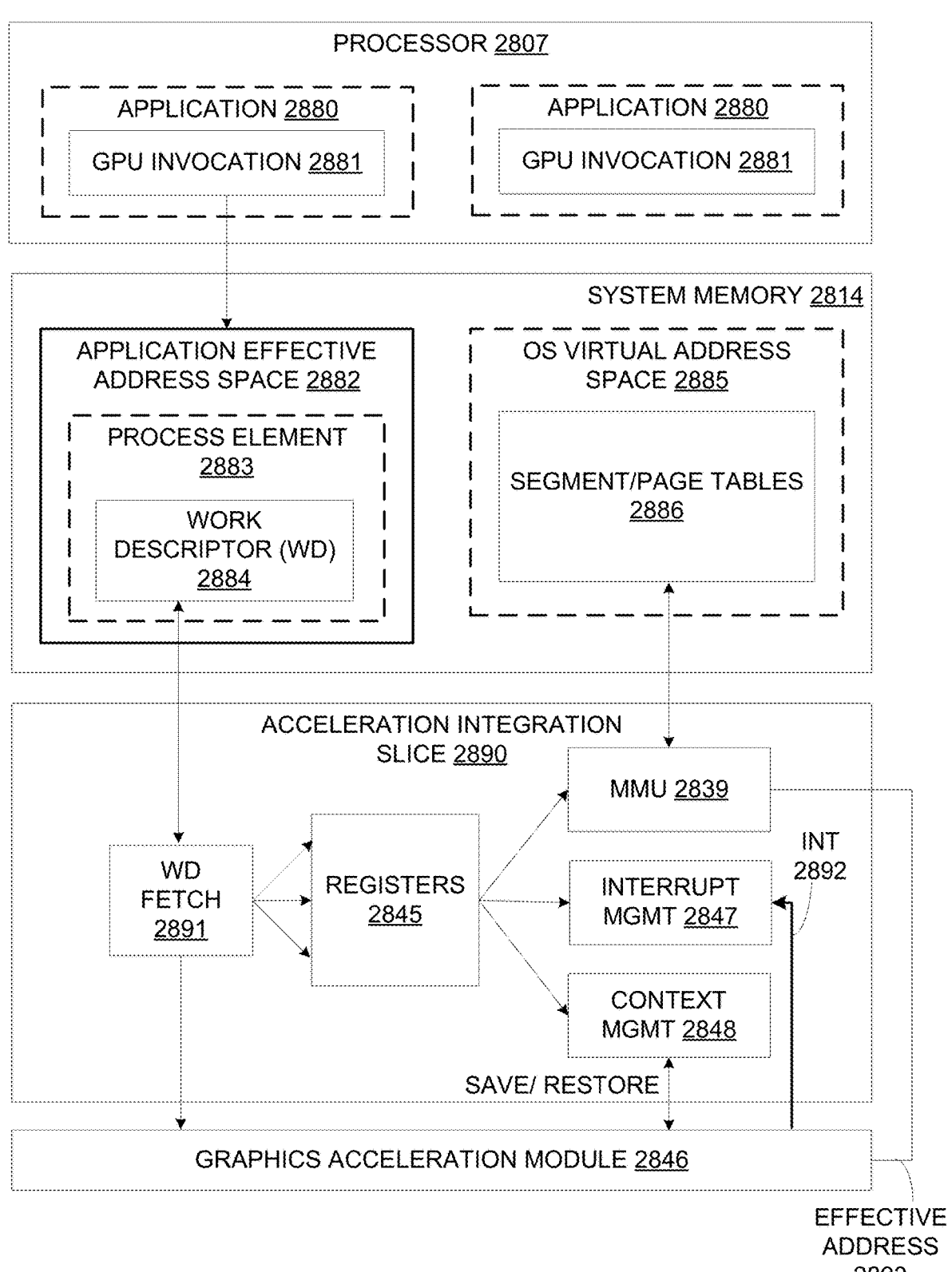
FIG. 28 illustrates an exemplary accelerator integration slice, in accordance with at least one embodiment.

FIG. 28 illustrates an exemplary accelerator integration slice 2890, in accordance with at least one embodiment. As used herein, a "slice" comprises a specified portion of processing resources of an accelerator integration circuit. In at least one embodiment, an accelerator integration circuit provides cache management, memory access, context management, and interrupt management services on behalf of multiple graphics processing engines included in a graphics acceleration module. Graphics processing engines may each comprise a separate GPU. Alternatively, graphics processing engines may comprise different types of graphics processing engines within a GPU such as graphics execution units, media processing engines (e.g., video encoders/decoders), samplers, and blit engines. In at least one embodiment, a graphics acceleration module may be a GPU with multiple graphics processing engines. In at least one embodiment, graphics processing engines may be individual GPUs integrated on a common package, line card, or chip.

An application effective address space 2882 within system memory 2814 stores process elements 2883. In one embodiment, process elements 2883 are stored in response to GPU invocations 2881 from applications 2880 executed on processor 2807. A process element 2883 contains process state for corresponding application 2880. A work descriptor ("WD") 2884 contained in process element 2883 can be a single job requested by an application or may contain a pointer to a queue of jobs. In at least one embodiment, WD 2884 is a pointer to a job request queue in application effective address space 2882.

Graphics acceleration module 2846 and/or individual graphics processing engines can be shared by all or a subset of processes in a system. In at least one embodiment, an infrastructure for setting up process state and sending WD

2884 to graphics acceleration module 2846 to start a job in a virtualized environment may be included.

In at least one embodiment, a dedicated-process programming model is implementation-specific. In this model, a single process owns graphics acceleration module 2846 or an individual graphics processing engine. Because graphics acceleration module 2846 is owned by a single process, a hypervisor initializes an accelerator integration circuit for an owning partition and an operating system initializes accelerator integration circuit for an owning process when graphics acceleration module 2846 is assigned.

In operation, a WD fetch unit 2891 in accelerator integration slice 2890 fetches next WD 2884 which includes an indication of work to be done by one or more graphics processing engines of graphics acceleration module 2846. Data from WD 2884 may be stored in registers 2845 and used by a memory management unit ("MMU") 2839, interrupt management circuit 2847 and/or context management circuit 2848 as illustrated. For example, one embodiment of MMU 2839 includes segment/page walk circuitry for accessing segment/page tables 2886 within OS virtual address space 2885. Interrupt management circuit 2847 may process interrupt events ("INT") 2892 received from graphics acceleration module 2846. When performing graphics operations, an effective address 2893 generated by a graphics processing engine is translated to a real address by MMU 2839.

In one embodiment, a same set of registers 2845 are duplicated for each graphics processing engine and/or graphics acceleration module 2846 and may be initialized by a hypervisor or operating system. Each of these duplicated registers may be included in accelerator integration slice 2890. Exemplary registers that may be initialized by a hypervisor are shown in Table 1.

TABLE 1

| Hypervisor Initialized Registers |
| --- |
| 1  Slice Control Register |
| 2  Real Address (RA) Scheduled Processes Area Pointer |
| 3  Authority Mask Override Register |
| 4  Interrupt Vector Table Entry Offset |
| 5  Interrupt Vector Table Entry Limit |
| 6  State Register |
| 7  Logical Partition ID |
| 8  Real address (RA) Hypervisor Accelerator Utilization Record Pointer |
| 9  Storage Description Register |

Exemplary registers that may be initialized by an operating system are shown in Table 2.

TABLE 2

| Operating System Initialized Registers |
| --- |
| 1  Process and Thread Identification |
| 2  Effective Address (EA) Context Save/Restore Pointer |
| 3  Virtual Address (VA) Accelerator Utilization Record Pointer |
| 4  Virtual Address (VA) Storage Segment Table Pointer |
| 5  Authority Mask |
| 6  Work descriptor |

In one embodiment, each WD 2884 is specific to a particular graphics acceleration module 2846 and/or a particular graphics processing engine. It contains all information required by a graphics processing engine to do work or it can be a pointer to a memory location where an application has set up a command queue of work to be completed.

Figure 29A:
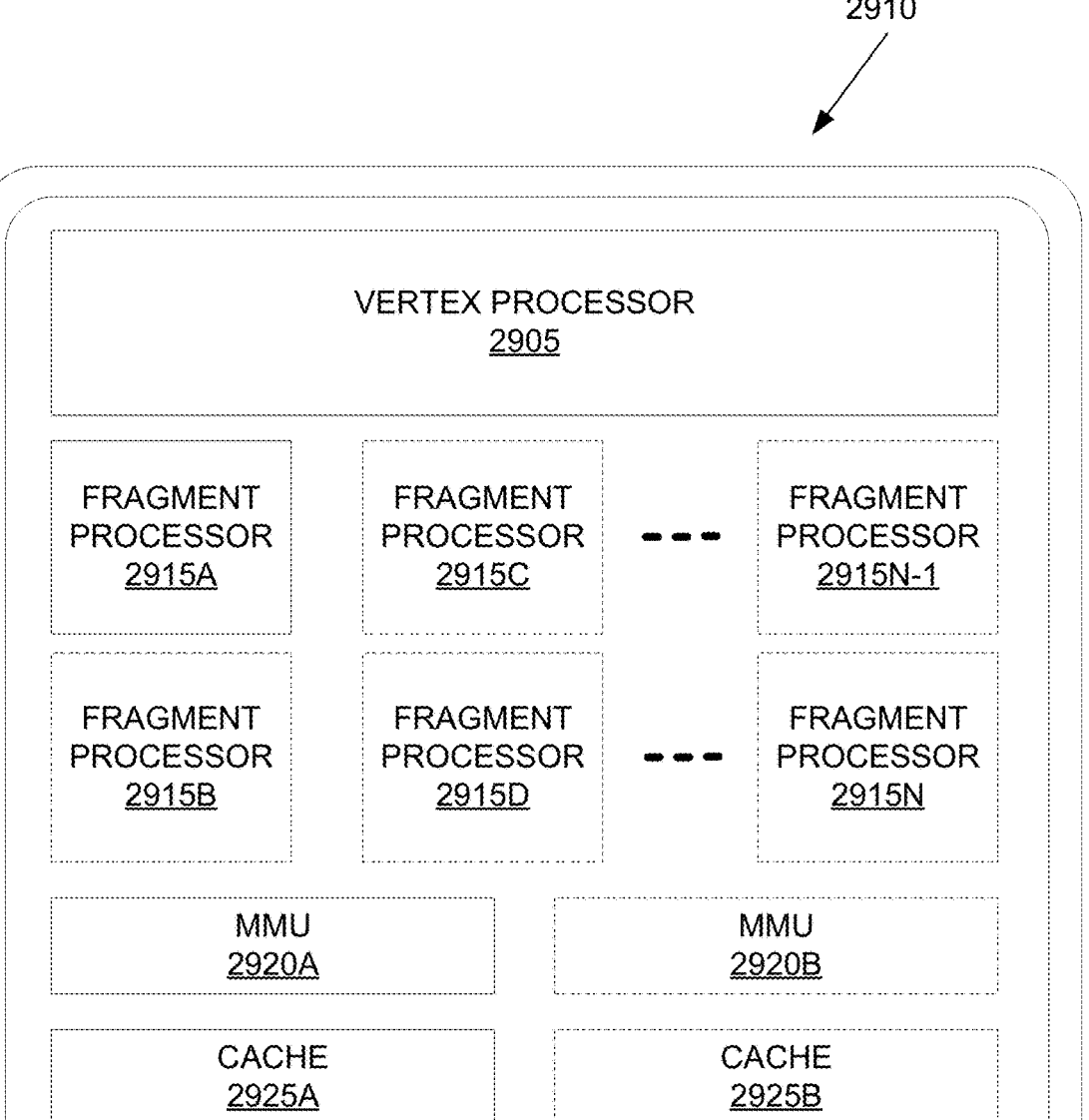
FIGS. 29A-29B illustrate exemplary graphics processors, in accordance with at least one embodiment.
Figure 29B:
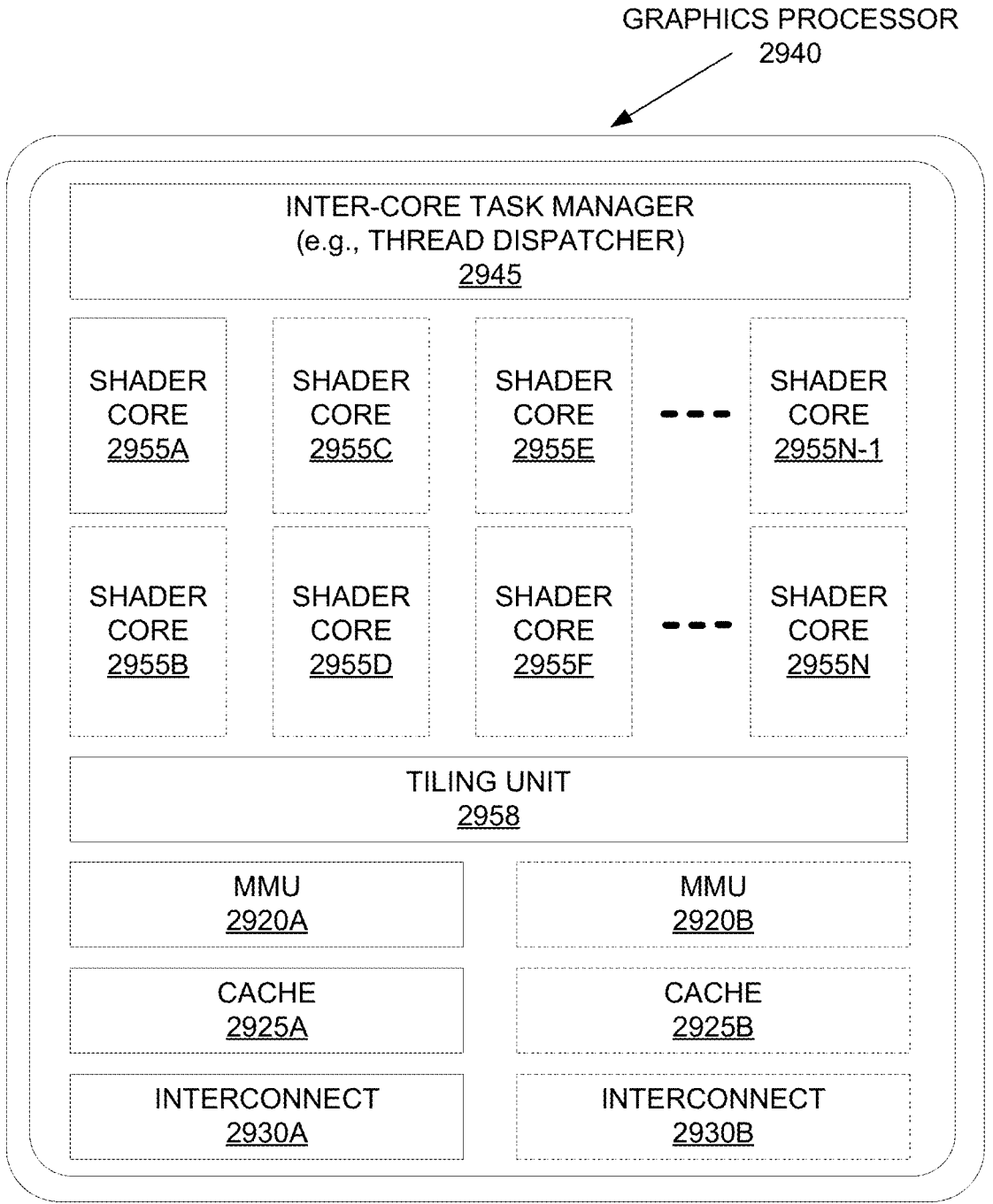

FIGS. 29A-29B illustrate exemplary graphics processors, in accordance with at least one embodiment. In at least one embodiment, any of the exemplary graphics processors may be fabricated using one or more IP cores. In addition to what is illustrated, other logic and circuits may be included in at least one embodiment, including additional graphics processors/cores, peripheral interface controllers, or general-purpose processor cores. In at least one embodiment, the exemplary graphics processors are for use within an SoC.

FIG. 29A illustrates an exemplary graphics processor 2910 of an SoC integrated circuit that may be fabricated using one or more IP cores, in accordance with at least one embodiment. FIG. 29B illustrates an additional exemplary graphics processor 2940 of an SoC integrated circuit that may be fabricated using one or more IP cores, in accordance with at least one embodiment. In at least one embodiment, graphics processor 2910 of FIG. 29A is a low power graphics processor core. In at least one embodiment, graphics processor 2940 of FIG. 29B is a higher performance graphics processor core. In at least one embodiment, each of graphics processors 2910, 2940 can be variants of graphics processor 510 of FIG. 5.

In at least one embodiment, graphics processor 2910 includes a vertex processor 2905 and one or more fragment processor(s) 2915A-2915N (e.g., 2915A, 2915B, 2915C, 2915D, through 2915N-1, and 2915N). In at least one embodiment, graphics processor 2910 can execute different shader programs via separate logic, such that vertex processor 2905 is optimized to execute operations for vertex shader programs, while one or more fragment processor(s) 2915A-2915N execute fragment (e.g., pixel) shading operations for fragment or pixel shader programs. In at least one embodiment, vertex processor 2905 performs a vertex processing stage of a 3D graphics pipeline and generates primitives and vertex data. In at least one embodiment, fragment processor(s) 2915A-2915N use primitive and vertex data generated by vertex processor 2905 to produce a framebuffer that is displayed on a display device. In at least one embodiment, fragment processor(s) 2915A-2915N are optimized to execute fragment shader programs as provided for in an OpenGL API, which may be used to perform similar operations as a pixel shader program as provided for in a Direct 3D API.

In at least one embodiment, graphics processor 2910 additionally includes one or more MMU(s) 2920A-2920B, cache(s) 2925A-2925B, and circuit interconnect(s) 2930A-2930B. In at least one embodiment, one or more MMU(s) 2920A-2920B provide for virtual to physical address mapping for graphics processor 2910, including for vertex processor 2905 and/or fragment processor(s) 2915A-2915N, which may reference vertex or image/texture data stored in memory, in addition to vertex or image/texture data stored in one or more cache(s) 2925A-2925B. In at least one embodiment, one or more MMU(s) 2920A-2920B may be synchronized with other MMUs within a system, including one or more MMUs associated with one or more application processor(s) 505, image processors 515, and/or video processors 520 of FIG. 5, such that each processor 505-520 can participate in a shared or unified virtual memory system. In at least one embodiment, one or more circuit interconnect(s) 2930A-2930B enable graphics processor 2910 to interface with other IP cores within an SoC, either via an internal bus of an SoC or via a direct connection.

In at least one embodiment, graphics processor 2940 includes one or more MMU(s) 2920A-2920B, caches 2925A-2925B, and circuit interconnects 2930A-2930B of graphics processor 2910 of FIG. 29A. In at least one embodiment, graphics processor 2940 includes one or more shader core(s) 2955A-2955N (e.g., 2955A, 2955B, 2955C, 2955D, 2955E, 2955F, through 2955N-1, and 2955N), which provides for a unified shader core architecture in which a single core or type or core can execute all types of programmable shader code, including shader program code to implement vertex shaders, fragment shaders, and/or compute shaders. In at least one embodiment, a number of shader cores can vary. In at least one embodiment, graphics processor 2940 includes an inter-core task manager 2945, which acts as a thread dispatcher to dispatch execution threads to one or more shader cores 2955A-2955N and a tiling unit 2958 to accelerate tiling operations for tile-based rendering, in which rendering operations for a scene are subdivided in image space, for example to exploit local spatial coherence within a scene or to optimize use of internal caches.

Figure 30A:
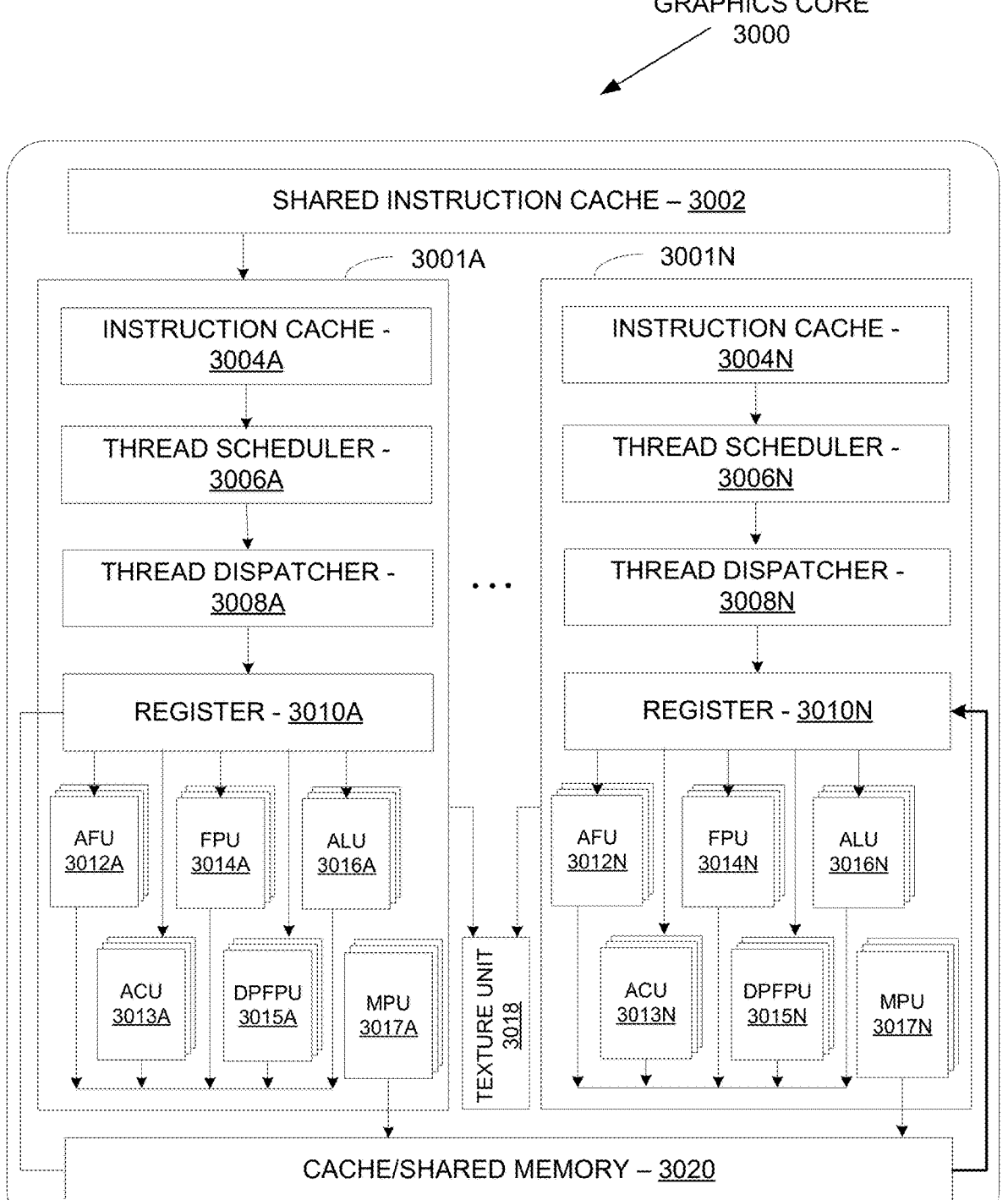
FIG. 30A illustrates a graphics core, in accordance with at least one embodiment.

FIG. 30A illustrates a graphics core 3000, in accordance with at least one embodiment. In at least one embodiment, graphics core 3000 may be included within graphics processor 2410 of FIG. 24. In at least one embodiment, graphics core 3000 may be a unified shader core 2955A-2955N as in FIG. 29B. In at least one embodiment, graphics core 3000 includes a shared instruction cache 3002, a texture unit 3018, and a cache/shared memory 3020 that are common to execution resources within graphics core 3000. In at least one embodiment, graphics core 3000 can include multiple slices 3001A-3001N or partition for each core, and a graphics processor can include multiple instances of graphics core 3000. Slices 3001A-3001N can include support logic including a local instruction cache 3004A-3004N, a thread scheduler 3006A-3006N, a thread dispatcher 3008A-3008N, and a set of registers 3010A-3010N. In at least one embodiment, slices 3001A-3001N can include a set of additional function units ("AFUs") 3012A-3012N, floating-point units ("FPUs") 3014A-3014N, integer arithmetic logic units ("ALUs") 3016-3016N, address computational units ("ACUs") 3013A-3013N, double-precision floating-point units ("DPFPUs") 3015A-3015N, and matrix processing units ("MPUs") 3017A-3017N.

In at least one embodiment, FPUs 3014A-3014N can perform single-precision (32-bit) and half-precision (16-bit) floating point operations, while DPFPUs 3015A-3015N perform double precision (64-bit) floating point operations. In at least one embodiment, ALUs 3016A-3016N can perform variable precision integer operations at 8-bit, 16-bit, and 32-bit precision, and can be configured for mixed precision operations. In at least one embodiment, MPUs 3017A-3017N can also be configured for mixed precision matrix operations, including half-precision floating point and 8-bit integer operations. In at least one embodiment, MPUs 3017-3017N can perform a variety of matrix operations to accelerate CUDA programs, including enabling support for accelerated general matrix to matrix multiplication ("GEMM"). In at least one embodiment, AFUs 3012A-3012N can perform additional logic operations not supported by floating-point or integer units, including trigonometric operations (e.g., Sine, Cosine, etc.).

Figure 30B:
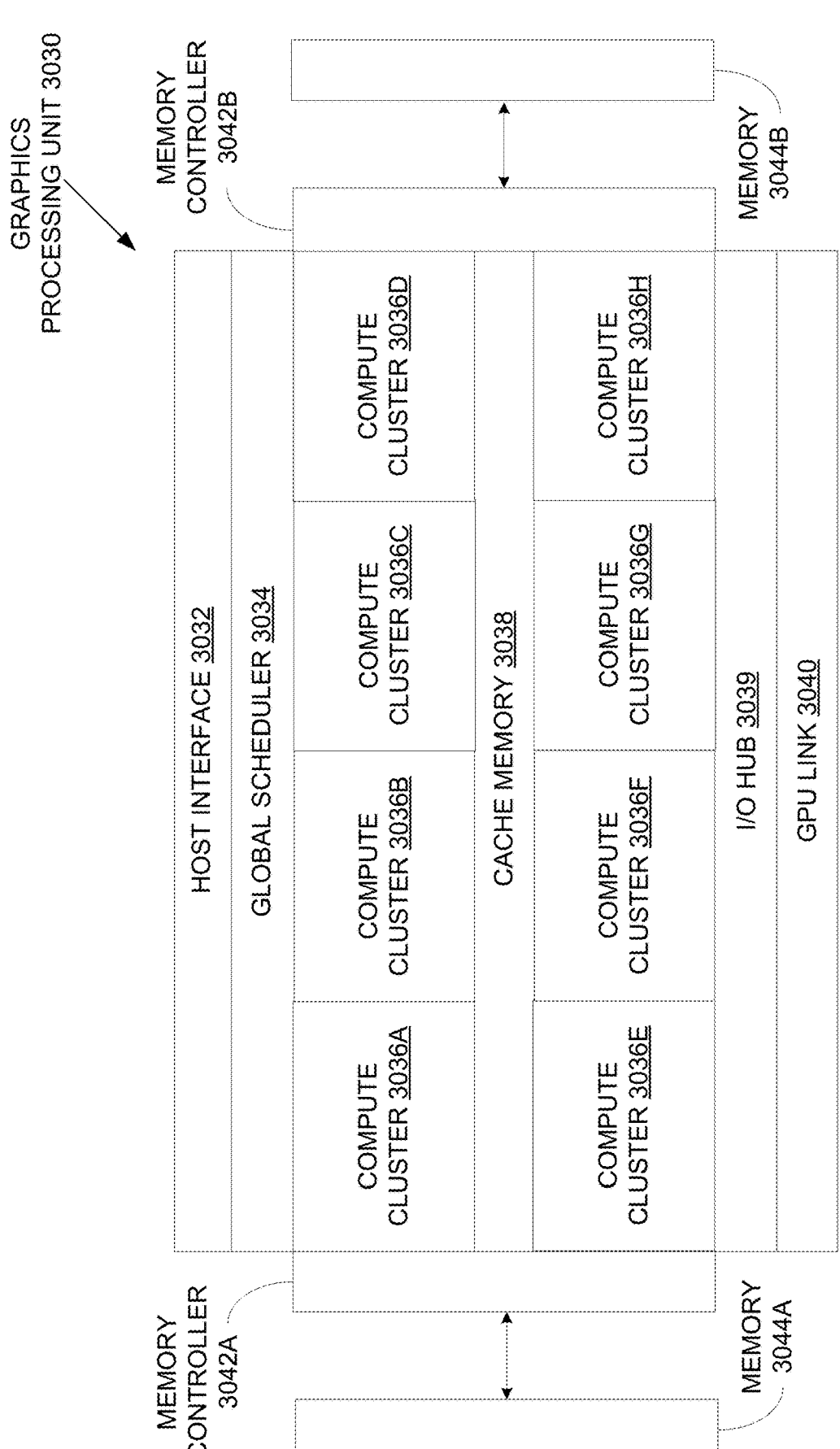
FIG. 30B illustrates a GPGPU, in accordance with at least one embodiment.

FIG. 30B illustrates a general-purpose graphics processing unit ("GPGPU") 3030, in accordance with at least one embodiment. In at least one embodiment, GPGPU 3030 is highly-parallel and suitable for deployment on a multi-chip module. In at least one embodiment, GPGPU 3030 can be configured to enable highly-parallel compute operations to be performed by an array of GPUs. In at least one embodiment, GPGPU 3030 can be linked directly to other instances of GPGPU 3030 to create a multi-GPU cluster to improve execution time for CUDA programs. In at least one embodiment, GPGPU 3030 includes a host interface 3032 to enable a connection with a host processor. In at least one embodiment, host interface 3032 is a PCIe interface. In at least one embodiment, host interface 3032 can be a vendor specific communications interface or communications fabric. In at least one embodiment, GPGPU 3030 receives commands from a host processor and uses a global scheduler 3034 to distribute execution threads associated with those commands to a set of compute clusters 3036A-3036H. In at least one embodiment, compute clusters 3036A-3036H share a cache memory 3038. In at least one embodiment, cache memory 3038 can serve as a higher-level cache for cache memories within compute clusters 3036A-3036H.

In at least one embodiment, GPGPU 3030 includes memory 3044A-3044B coupled with compute clusters 3036A-3036H via a set of memory controllers 3042A-3042B. In at least one embodiment, memory 3044A-3044B can include various types of memory devices including DRAM or graphics random access memory, such as synchronous graphics random access memory ("SGRAM"), including graphics double data rate ("GDDR") memory.

In at least one embodiment, compute clusters 3036A-3036H each include a set of graphics cores, such as graphics core 3000 of FIG. 30A, which can include multiple types of integer and floating point logic units that can perform computational operations at a range of precisions including suited for computations associated with CUDA programs. For example, in at least one embodiment, at least a subset of floating point units in each of compute clusters 3036A-3036H can be configured to perform 16-bit or 32-bit floating point operations, while a different subset of floating point units can be configured to perform 64-bit floating point operations.

In at least one embodiment, multiple instances of GPGPU 3030 can be configured to operate as a compute cluster. In at least one embodiment, compute clusters 3036A-3036H may implement any technically feasible communication techniques for synchronization and data exchange. In at least one embodiment, multiple instances of GPGPU 3030 communicate over host interface 3032. In at least one embodiment, GPGPU 3030 includes an I/O hub 3039 that couples GPGPU 3030 with a GPU link 3040 that enables a direct connection to other instances of GPGPU 3030. In at least one embodiment, GPU link 3040 is coupled to a dedicated GPU-to-GPU bridge that enables communication and synchronization between multiple instances of GPGPU 3030. In at least one embodiment GPU link 3040 couples with a high speed interconnect to transmit and receive data to other GPGPUs 3030 or parallel processors. In at least one embodiment, multiple instances of GPGPU 3030 are located in separate data processing systems and communicate via a network device that is accessible via host interface 3032. In at least one embodiment GPU link 3040 can be configured to enable a connection to a host processor in addition to or as an alternative to host interface 3032. In at least one embodiment, GPGPU 3030 can be configured to execute a CUDA program.

Figure 31A:
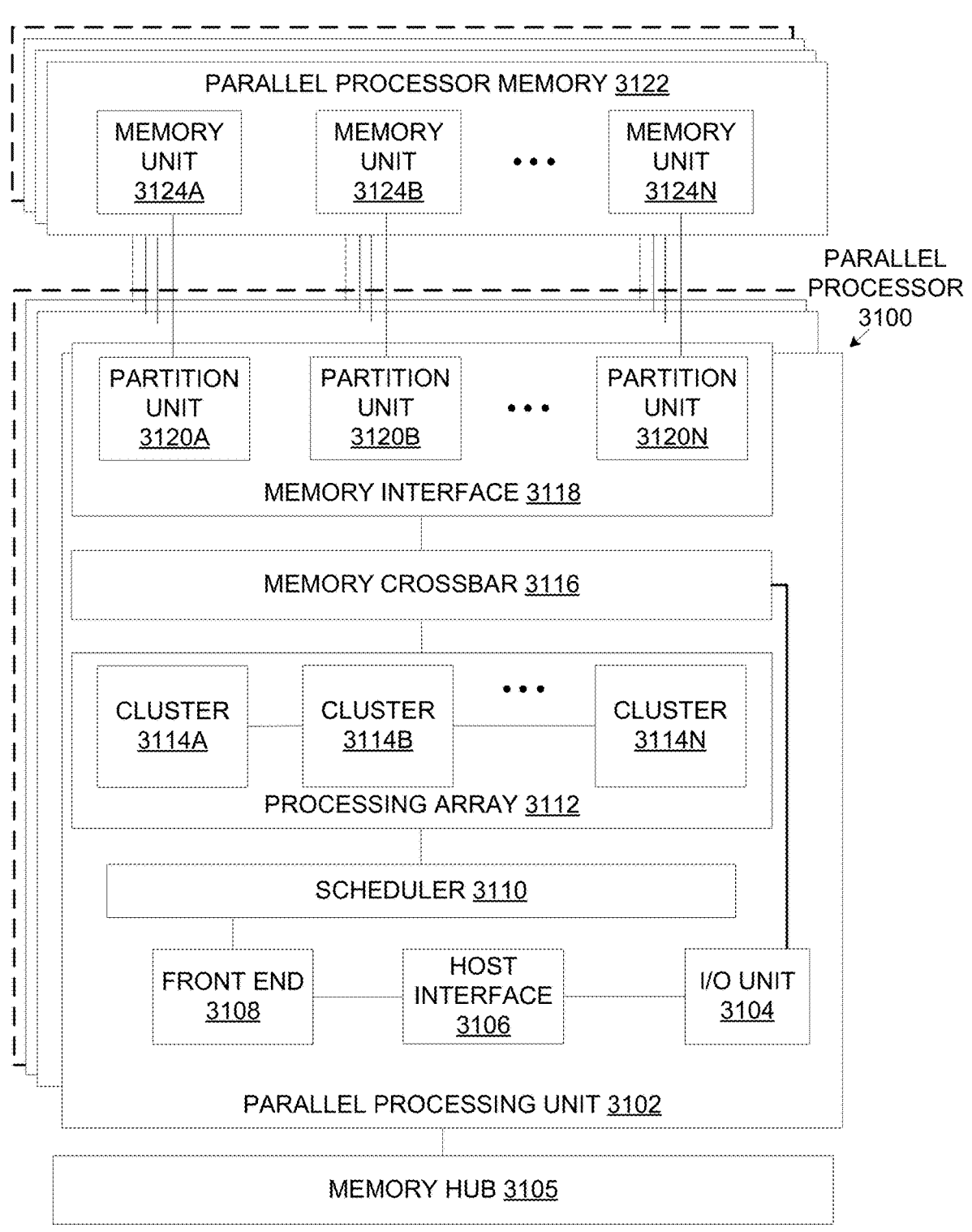
FIG. 31A illustrates a parallel processor, in accordance with at least one embodiment.

FIG. 31A illustrates a parallel processor 3100, in accordance with at least one embodiment. In at least one embodiment, various components of parallel processor 3100 may be implemented using one or more integrated circuit devices, such as programmable processors, application specific integrated circuits ("ASICs"), or FPGAs.

In at least one embodiment, parallel processor 3100 includes a parallel processing unit 3102. In at least one embodiment, parallel processing unit 3102 includes an I/O unit 3104 that enables communication with other devices, including other instances of parallel processing unit 3102. In at least one embodiment, I/O unit 3104 may be directly connected to other devices. In at least one embodiment, I/O unit 3104 connects with other devices via use of a hub or switch interface, such as memory hub 605. In at least one embodiment, connections between memory hub 605 and I/O unit 3104 form a communication link. In at least one embodiment, I/O unit 3104 connects with a host interface 3106 and a memory crossbar 3116, where host interface 3106 receives commands directed to performing processing operations and memory crossbar 3116 receives commands directed to performing memory operations.

In at least one embodiment, when host interface 3106 receives a command buffer via I/O unit 3104, host interface 3106 can direct work operations to perform those commands to a front end 3108. In at least one embodiment, front end 3108 couples with a scheduler 3110, which is configured to distribute commands or other work items to a processing array 3112. In at least one embodiment, scheduler 3110 ensures that processing array 3112 is properly configured and in a valid state before tasks are distributed to processing array 3112. In at least one embodiment, scheduler 3110 is implemented via firmware logic executing on a microcontroller. In at least one embodiment, microcontroller implemented scheduler 3110 is configurable to perform complex scheduling and work distribution operations at coarse and fine granularity, enabling rapid preemption and context switching of threads executing on processing array 3112. In at least one embodiment, host software can prove workloads for scheduling on processing array 3112 via one of multiple graphics processing doorbells. In at least one embodiment, workloads can then be automatically distributed across processing array 3112 by scheduler 3110 logic within a microcontroller including scheduler 3110.

In at least one embodiment, processing array 3112 can include up to "N" clusters (e.g., cluster 3114A, cluster 3114B, through cluster 3114N). In at least one embodiment, each cluster 3114A-3114N of processing array 3112 can execute a large number of concurrent threads. In at least one embodiment, scheduler 3110 can allocate work to clusters 3114A-3114N of processing array 3112 using various scheduling and/or work distribution algorithms, which may vary depending on a workload arising for each type of program or computation. In at least one embodiment, scheduling can be handled dynamically by scheduler 3110, or can be assisted in part by compiler logic during compilation of program logic configured for execution by processing array 3112. In at least one embodiment, different clusters 3114A-3114N of processing array 3112 can be allocated for processing different types of programs or for performing different types of computations.

In at least one embodiment, processing array 3112 can be configured to perform various types of parallel processing operations. In at least one embodiment, processing array 3112 is configured to perform general-purpose parallel compute operations. For example, in at least one embodiment, processing array 3112 can include logic to execute processing tasks including filtering of video and/or audio data, performing modeling operations, including physics operations, and performing data transformations.

In at least one embodiment, processing array 3112 is configured to perform parallel graphics processing operations. In at least one embodiment, processing array 3112 can include additional logic to support execution of such graphics processing operations, including, but not limited to texture sampling logic to perform texture operations, as well as tessellation logic and other vertex processing logic. In at least one embodiment, processing array 3112 can be configured to execute graphics processing related shader programs such as, but not limited to vertex shaders, tessellation shaders, geometry shaders, and pixel shaders. In at least one embodiment, parallel processing unit 3102 can transfer data from system memory via I/O unit 3104 for processing. In at least one embodiment, during processing, transferred data can be stored to on-chip memory (e.g., a parallel processor memory 3122) during processing, then written back to system memory.

In at least one embodiment, when parallel processing unit 3102 is used to perform graphics processing, scheduler 3110 can be configured to divide a processing workload into approximately equal sized tasks, to better enable distribution of graphics processing operations to multiple clusters 3114A-3114N of processing array 3112. In at least one embodiment, portions of processing array 3112 can be configured to perform different types of processing. For example, in at least one embodiment, a first portion may be configured to perform vertex shading and topology generation, a second portion may be configured to perform tessellation and geometry shading, and a third portion may be configured to perform pixel shading or other screen space operations, to produce a rendered image for display. In at least one embodiment, intermediate data produced by one or more of clusters 3114A-3114N may be stored in buffers to allow intermediate data to be transmitted between clusters 3114A-3114N for further processing.

In at least one embodiment, processing array 3112 can receive processing tasks to be executed via scheduler 3110, which receives commands defining processing tasks from front end 3108. In at least one embodiment, processing tasks can include indices of data to be processed, e.g., surface (patch) data, primitive data, vertex data, and/or pixel data, as well as state parameters and commands defining how data is to be processed (e.g., what program is to be executed). In at least one embodiment, scheduler 3110 may be configured to fetch indices corresponding to tasks or may receive indices from front end 3108. In at least one embodiment, front end 3108 can be configured to ensure processing array 3112 is configured to a valid state before a workload specified by incoming command buffers (e.g., batch-buffers, push buffers, etc.) is initiated.

In at least one embodiment, each of one or more instances of parallel processing unit 3102 can couple with parallel processor memory 3122. In at least one embodiment, parallel processor memory 3122 can be accessed via memory crossbar 3116, which can receive memory requests from processing array 3112 as well as I/O unit 3104. In at least one embodiment, memory crossbar 3116 can access parallel processor memory 3122 via a memory interface 3118. In at least one embodiment, memory interface 3118 can include multiple partition units (e.g., a partition unit 3120A, partition unit 3120B, through partition unit 3120N) that can each couple to a portion (e.g., memory unit) of parallel processor memory 3122. In at least one embodiment, a number of partition units 3120A-3120N is configured to be equal to a number of memory units, such that a first partition unit 3120A has a corresponding first memory unit 3124A, a second partition unit 3120B has a corresponding memory unit 3124B, and an Nth partition unit 3120N has a corresponding Nth memory unit 3124N. In at least one embodiment, a number of partition units 3120A-3120N may not be equal to a number of memory devices.

In at least one embodiment, memory units 3124A-3124N can include various types of memory devices, including DRAM or graphics random access memory, such as SGRAM, including GDDR memory. In at least one embodiment, memory units 3124A-3124N may also include 3D stacked memory, including but not limited to high bandwidth memory ("HBM"). In at least one embodiment, render targets, such as frame buffers or texture maps may be stored across memory units 3124A-3124N, allowing partition units 3120A-3120N to write portions of each render target in parallel to efficiently use available bandwidth of parallel processor memory 3122. In at least one embodiment, a local instance of parallel processor memory 3122 may be excluded in favor of a unified memory design that utilizes system memory in conjunction with local cache memory.

In at least one embodiment, any one of clusters 3114A-3114N of processing array 3112 can process data that will be written to any of memory units 3124A-3124N within parallel processor memory 3122. In at least one embodiment, memory crossbar 3116 can be configured to transfer an output of each cluster 3114A-3114N to any partition unit 3120A-3120N or to another cluster 3114A-3114N, which can perform additional processing operations on an output. In at least one embodiment, each cluster 3114A-3114N can communicate with memory interface 3118 through memory crossbar 3116 to read from or write to various external memory devices. In at least one embodiment, memory crossbar 3116 has a connection to memory interface 3118 to communicate with I/O unit 3104, as well as a connection to a local instance of parallel processor memory 3122, enabling processing units within different clusters 3114A-3114N to communicate with system memory or other memory that is not local to parallel processing unit 3102. In at least one embodiment, memory crossbar 3116 can use virtual channels to separate traffic streams between clusters 3114A-3114N and partition units 3120A-3120N.

In at least one embodiment, multiple instances of parallel processing unit 3102 can be provided on a single add-in card, or multiple add-in cards can be interconnected. In at least one embodiment, different instances of parallel processing unit 3102 can be configured to interoperate even if different instances have different numbers of processing cores, different amounts of local parallel processor memory, and/or other configuration differences. For example, in at least one embodiment, some instances of parallel processing unit 3102 can include higher precision floating point units relative to other instances. In at least one embodiment, systems incorporating one or more instances of parallel processing unit 3102 or parallel processor 3100 can be implemented in a variety of configurations and form factors, including but not limited to desktop, laptop, or handheld personal computers, servers, workstations, game consoles, and/or embedded systems.

Figure 31B:
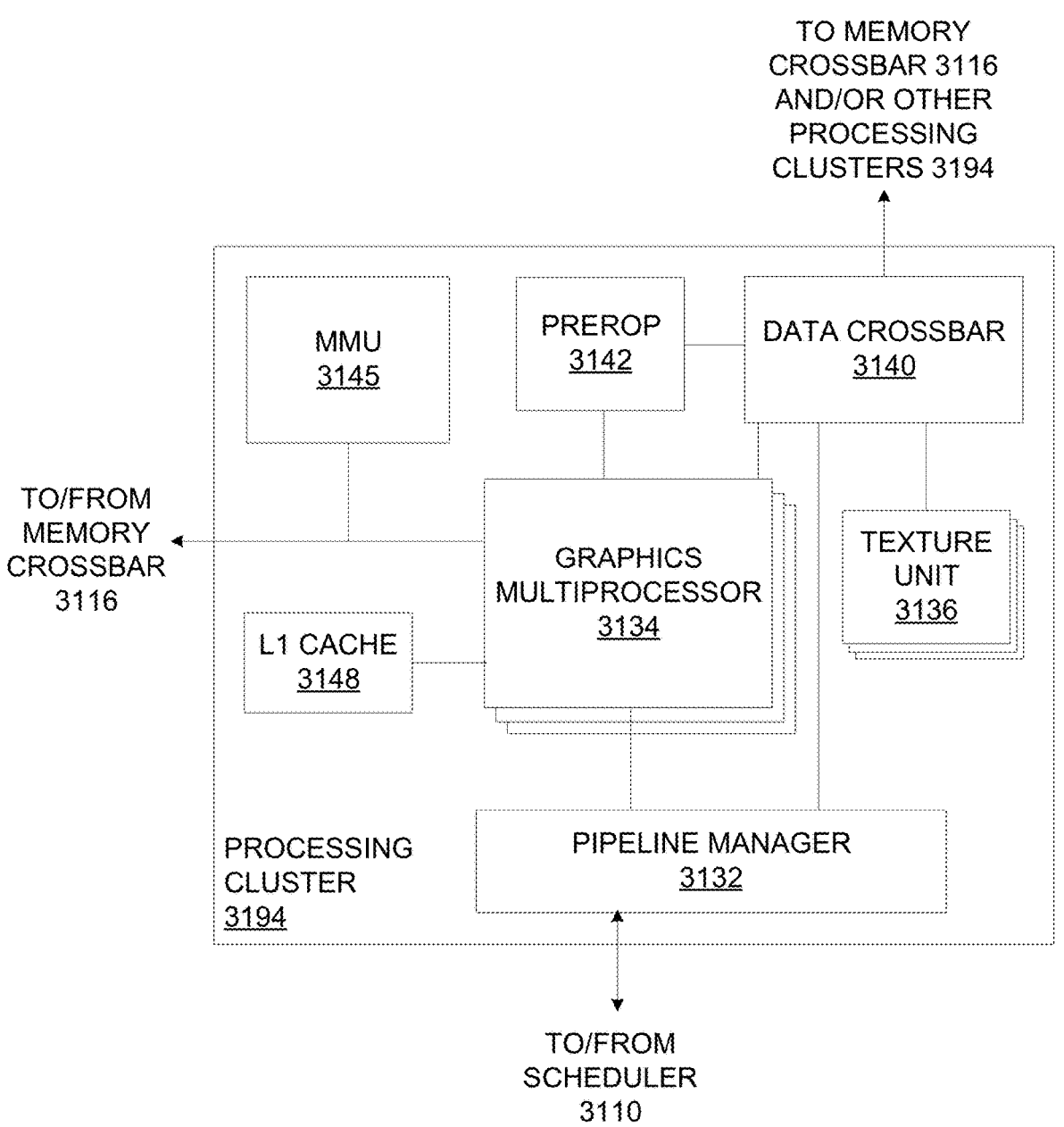
FIG. 31B illustrates a processing cluster, in accordance with at least one embodiment.

FIG. 31B illustrates a processing cluster 3194, in accordance with at least one embodiment. In at least one embodiment, processing cluster 3194 is included within a parallel processing unit. In at least one embodiment, processing cluster 3194 is one of processing clusters 3114A-3114N of FIG. 31. In at least one embodiment, processing cluster 3194 can be configured to execute many threads in parallel, where the term "thread" refers to an instance of a particular program executing on a particular set of input data. In at least one embodiment, single instruction, multiple data ("SIMD") instruction issue techniques are used to support parallel execution of a large number of threads without providing multiple independent instruction units. In at least one embodiment, single instruction, multiple thread ("SIMT") techniques are used to support parallel execution of a large number of generally synchronized threads, using a common instruction unit configured to issue instructions to a set of processing engines within each processing cluster 3194.

In at least one embodiment, operation of processing cluster 3194 can be controlled via a pipeline manager 3132 that distributes processing tasks to SIMT parallel processors. In at least one embodiment, pipeline manager 3132 receives instructions from scheduler 3110 of FIG. 31 and manages execution of those instructions via a graphics multiprocessor 3134 and/or a texture unit 3136. In at least one embodiment, graphics multiprocessor 3134 is an exemplary instance of a SIMT parallel processor. However, in at least one embodiment, various types of SIMT parallel processors of differing architectures may be included within processing cluster 3194. In at least one embodiment, one or more instances of graphics multiprocessor 3134 can be included within processing cluster 3194. In at least one embodiment, graphics multiprocessor 3134 can process data and a data crossbar 3140 can be used to distribute processed data to one of multiple possible destinations, including other shader units. In at least one embodiment, pipeline manager 3132 can facilitate distribution of processed data by specifying destinations for processed data to be distributed via data crossbar 3140.

In at least one embodiment, each graphics multiprocessor 3134 within processing cluster 3194 can include an identical set of functional execution logic (e.g., arithmetic logic units, load/store units ("LSUs"), etc.). In at least one embodiment, functional execution logic can be configured in a pipelined manner in which new instructions can be issued before previous instructions are complete. In at least one embodiment, functional execution logic supports a variety of operations including integer and floating point arithmetic, comparison operations, Boolean operations, bit-shifting, and computation of various algebraic functions. In at least one embodiment, same functional-unit hardware can be leveraged to perform different operations and any combination of functional units may be present.

In at least one embodiment, instructions transmitted to processing cluster 3194 constitute a thread. In at least one embodiment, a set of threads executing across a set of parallel processing engines is a thread group. In at least one embodiment, a thread group executes a program on different input data. In at least one embodiment, each thread within a thread group can be assigned to a different processing engine within graphics multiprocessor 3134. In at least one embodiment, a thread group may include fewer threads than a number of processing engines within graphics multiprocessor 3134. In at least one embodiment, when a thread group includes fewer threads than a number of processing engines, one or more of processing engines may be idle during cycles in which that thread group is being processed. In at least one embodiment, a thread group may also include more threads than a number of processing engines within graphics multiprocessor 3134. In at least one embodiment, when a thread group includes more threads than a number of processing engines within graphics multiprocessor 3134, processing can be performed over consecutive clock cycles. In at least one embodiment, multiple thread groups can be executed concurrently on graphics multiprocessor 3134.

In at least one embodiment, graphics multiprocessor 3134 includes an internal cache memory to perform load and store operations. In at least one embodiment, graphics multiprocessor 3134 can forego an internal cache and use a cache memory (e.g., L1 cache 3148) within processing cluster 3194. In at least one embodiment, each graphics multiprocessor 3134 also has access to Level 2 ("L2") caches within partition units (e.g., partition units 3120A-3120N of FIG. 31A) that are shared among all processing clusters 3194 and may be used to transfer data between threads. In at least one embodiment, graphics multiprocessor 3134 may also access off-chip global memory, which can include one or more of local parallel processor memory and/or system memory. In at least one embodiment, any memory external to parallel processing unit 3102 may be used as global memory. In at least one embodiment, processing cluster 3194 includes multiple instances of graphics multiprocessor 3134 that can share common instructions and data, which may be stored in L1 cache 3148.

In at least one embodiment, each processing cluster 3194 may include an MMU 3145 that is configured to map virtual addresses into physical addresses. In at least one embodiment, one or more instances of MMU 3145 may reside within memory interface 3118 of FIG. 31. In at least one embodiment, MMU 3145 includes a set of page table entries ("PTEs") used to map a virtual address to a physical address of a tile and optionally a cache line index. In at least one embodiment, MMU 3145 may include address translation lookaside buffers ("TLBs") or caches that may reside within graphics multiprocessor 3134 or L1 cache 3148 or processing cluster 3194. In at least one embodiment, a physical address is processed to distribute surface data access locality to allow efficient request interleaving among partition units. In at least one embodiment, a cache line index may be used to determine whether a request for a cache line is a hit or miss.

In at least one embodiment, processing cluster 3194 may be configured such that each graphics multiprocessor 3134 is coupled to a texture unit 3136 for performing texture mapping operations, e.g., determining texture sample positions, reading texture data, and filtering texture data. In at least one embodiment, texture data is read from an internal texture L1 cache (not shown) or from an L1 cache within graphics multiprocessor 3134 and is fetched from an L2 cache, local parallel processor memory, or system memory, as needed. In at least one embodiment, each graphics multiprocessor 3134 outputs a processed task to data crossbar 3140 to provide a processed task to another processing cluster 3194 for further processing or to store a processed task in an L2 cache, a local parallel processor memory, or a system memory via memory crossbar 3116. In at least one embodiment, a pre-raster operations unit ("preROP") 3142 is configured to receive data from graphics multiprocessor 3134, direct data to ROP units, which may be located with partition units as described herein (e.g., partition units 3120A-3120N of FIG. 31). In at least one embodiment, PreROP 3142 can perform optimizations for color blending, organize pixel color data, and perform address translations.

Figure 31C:
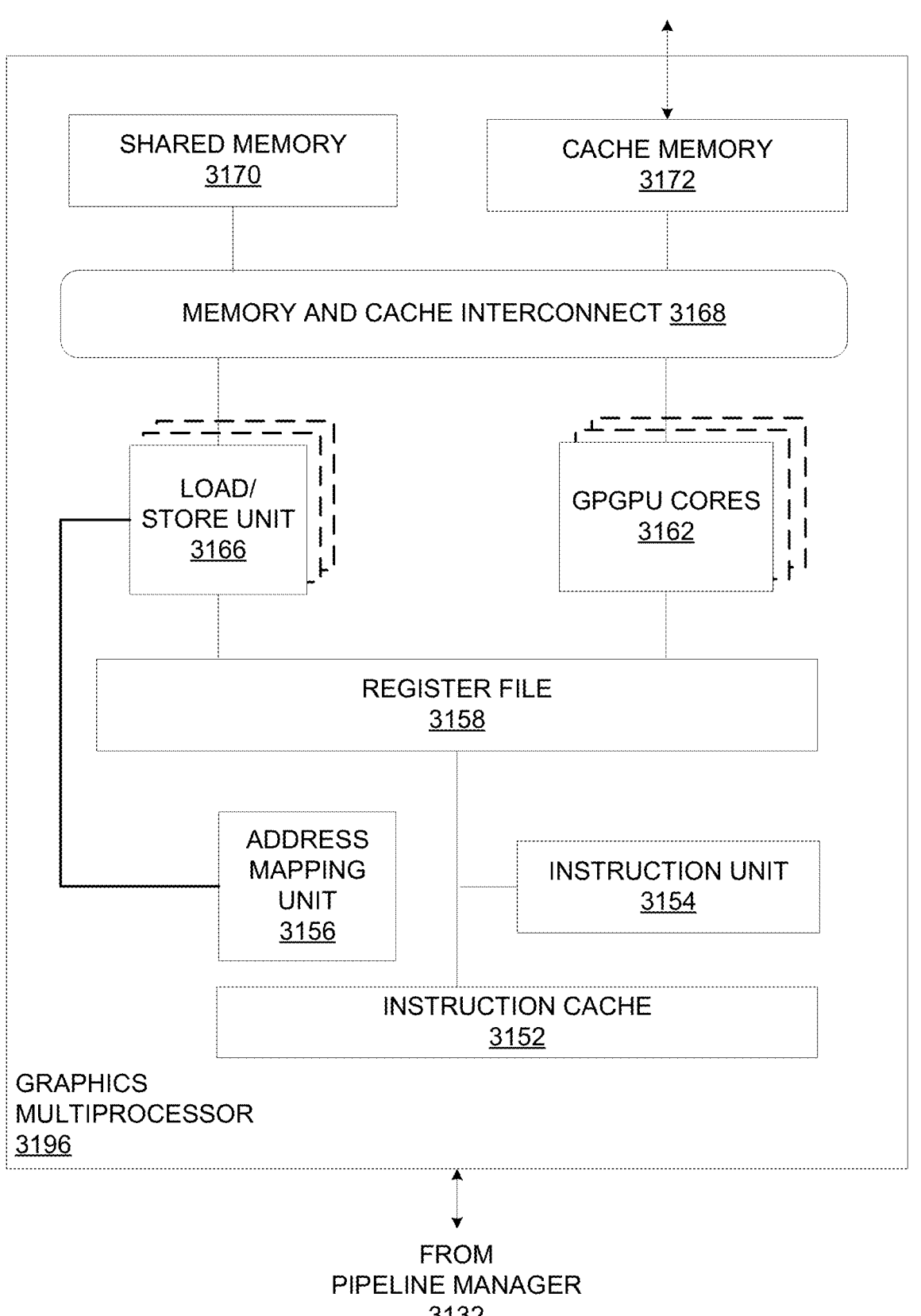
FIG. 31C illustrates a graphics multiprocessor, in accordance with at least one embodiment.

FIG. 31C illustrates a graphics multiprocessor 3196, in accordance with at least one embodiment. In at least one embodiment, graphics multiprocessor 3196 is graphics multiprocessor 3134 of FIG. 31B. In at least one embodiment, graphics multiprocessor 3196 couples with pipeline manager 3132 of processing cluster 3194. In at least one embodiment, graphics multiprocessor 3196 has an execution pipeline including but not limited to an instruction cache 3152, an instruction unit 3154, an address mapping unit 3156, a register file 3158, one or more GPGPU cores 3162, and one or more LSUs 3166. GPGPU cores 3162 and LSUs 3166 are coupled with cache memory 3172 and shared memory 3170 via a memory and cache interconnect 3168.

In at least one embodiment, instruction cache 3152 receives a stream of instructions to execute from pipeline manager 3132. In at least one embodiment, instructions are cached in instruction cache 3152 and dispatched for execution by instruction unit 3154. In at least one embodiment, instruction unit 3154 can dispatch instructions as thread groups (e.g., warps), with each thread of a thread group assigned to a different execution unit within GPGPU core 3162. In at least one embodiment, an instruction can access any of a local, shared, or global address space by specifying an address within a unified address space. In at least one embodiment, address mapping unit 3156 can be used to translate addresses in a unified address space into a distinct memory address that can be accessed by LSUs 3166.

In at least one embodiment, register file 3158 provides a set of registers for functional units of graphics multiprocessor 3196. In at least one embodiment, register file 3158 provides temporary storage for operands connected to data paths of functional units (e.g., GPGPU cores 3162, LSUs 3166) of graphics multiprocessor 3196. In at least one embodiment, register file 3158 is divided between each of functional units such that each functional unit is allocated a dedicated portion of register file 3158. In at least one embodiment, register file 3158 is divided between different thread groups being executed by graphics multiprocessor 3196.

In at least one embodiment, GPGPU cores 3162 can each include FPUs and/or integer ALUs that are used to execute instructions of graphics multiprocessor 3196. GPGPU cores 3162 can be similar in architecture or can differ in architecture. In at least one embodiment, a first portion of GPGPU cores 3162 include a single precision FPU and an integer ALU while a second portion of GPGPU cores 3162 include a double precision FPU. In at least one embodiment, FPUs can implement IEEE 754-2008 standard for floating point arithmetic or enable variable precision floating point arithmetic. In at least one embodiment, graphics multiprocessor 3196 can additionally include one or more fixed function or special function units to perform specific functions such as copy rectangle or pixel blending operations. In at least one embodiment one or more of GPGPU cores 3162 can also include fixed or special function logic.

In at least one embodiment, GPGPU cores 3162 include SIMD logic capable of performing a single instruction on multiple sets of data. In at least one embodiment GPGPU cores 3162 can physically execute SIMD4, SIMD8, and SIMD16 instructions and logically execute SIMD1, SIMD2, and SIMD32 instructions. In at least one embodiment, SIMD instructions for GPGPU cores 3162 can be generated at compile time by a shader compiler or automatically generated when executing programs written and compiled for single program multiple data ("SPMD") or SIMT architectures. In at least one embodiment, multiple threads of a program configured for an SIMT execution model can executed via a single SIMD instruction. For example, in at least one embodiment, eight SIMT threads that perform the same or similar operations can be executed in parallel via a single SIMD8 logic unit.

In at least one embodiment, memory and cache interconnect 3168 is an interconnect network that connects each functional unit of graphics multiprocessor 3196 to register file 3158 and to shared memory 3170. In at least one embodiment, memory and cache interconnect 3168 is a crossbar interconnect that allows LSU 3166 to implement load and store operations between shared memory 3170 and register file 3158. In at least one embodiment, register file 3158 can operate at a same frequency as GPGPU cores 3162, thus data transfer between GPGPU cores 3162 and register file 3158 is very low latency. In at least one embodiment, shared memory 3170 can be used to enable communication between threads that execute on functional units within graphics multiprocessor 3196. In at least one embodiment, cache memory 3172 can be used as a data cache for example, to cache texture data communicated between functional units and texture unit 3136. In at least one embodiment, shared memory 3170 can also be used as a program managed cached. In at least one embodiment, threads executing on GPGPU cores 3162 can programmatically store data within shared memory in addition to automatically cached data that is stored within cache memory 3172.

In at least one embodiment, a parallel processor or GPGPU as described herein is communicatively coupled to host/processor cores to accelerate graphics operations, machine-learning operations, pattern analysis operations, and various general purpose GPU (GPGPU) functions. In at least one embodiment, a GPU may be communicatively coupled to host processor/cores over a bus or other interconnect (e.g., a high speed interconnect such as PCIe or NVLink). In at least one embodiment, a GPU may be integrated on a same package or chip as cores and communicatively coupled to cores over a processor bus/interconnect that is internal to a package or a chip. In at least one embodiment, regardless of a manner in which a GPU is connected, processor cores may allocate work to a GPU in a form of sequences of commands/instructions contained in a WD. In at least one embodiment, a GPU then uses dedicated circuitry/logic for efficiently processing these commands/instructions.

General Computing

The following figures set forth, without limitation, exemplary software constructs within general computing that can be used to implement at least one embodiment.

Figure 32:
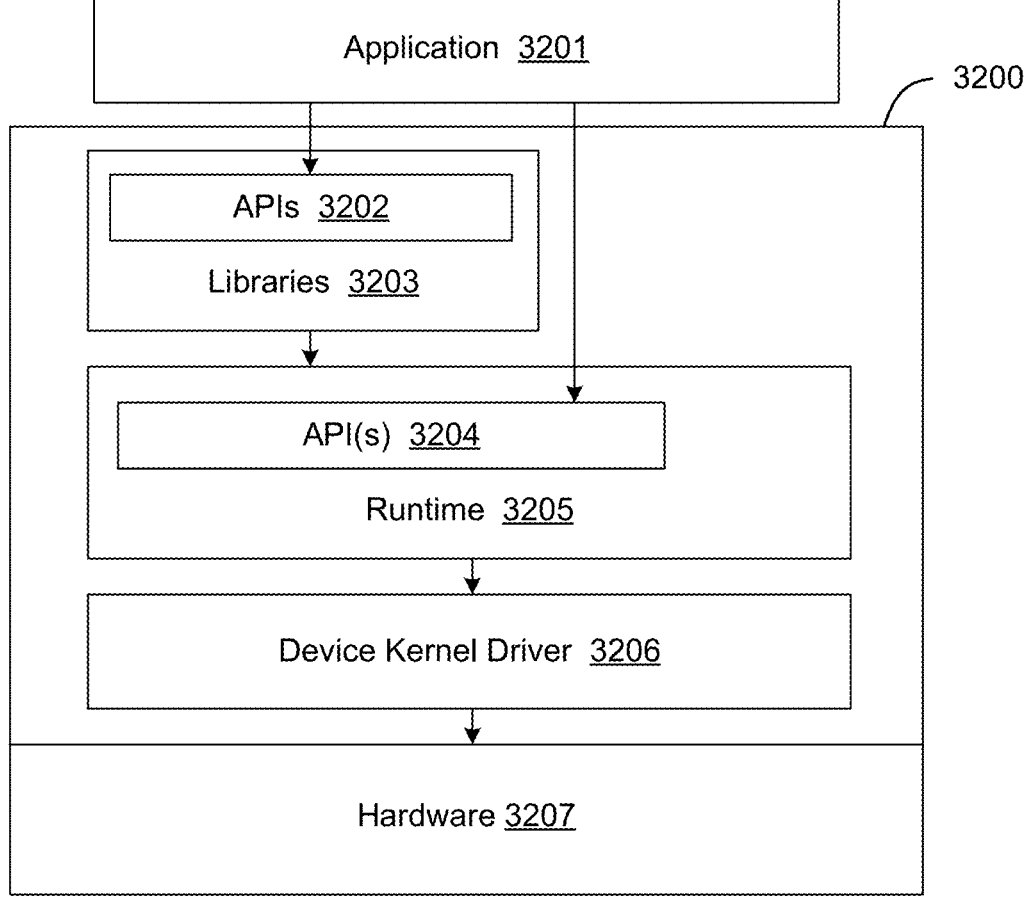
FIG. 32 illustrates a software stack of a programming platform, in accordance with at least one embodiment.

FIG. 32 illustrates a software stack of a programming platform, in accordance with at least one embodiment. In at least one embodiment, a programming platform is a platform for leveraging hardware on a computing system to accelerate computational tasks. A programming platform may be accessible to software developers through libraries, compiler directives, and/or extensions to programming languages, in at least one embodiment. In at least one embodiment, a programming platform may be, but is not limited to, CUDA, Radeon Open Compute Platform ("ROCm"), OpenCL (OpenCL™ is developed by Khronos group), SYCL, or Intel One API.

In at least one embodiment, a software stack 3200 of a programming platform provides an execution environment for an application 3201. In at least one embodiment, application 3201 may include any computer software capable of being launched on software stack 3200. In at least one embodiment, application 3201 may include, but is not limited to, an artificial intelligence ("AI")/machine learning ("ML") application, a high performance computing ("HPC") application, a virtual desktop infrastructure ("VDI"), or a data center workload.

In at least one embodiment, application 3201 and software stack 3200 run on hardware 3207. Hardware 3207 may include one or more GPUs, CPUs, FPGAs, AI engines, and/or other types of compute devices that support a programming platform, in at least one embodiment. In at least one embodiment, such as with CUDA, software stack 3200 may be vendor specific and compatible with only devices from particular vendor(s). In at least one embodiment, such as in with OpenCL, software stack 3200 may be used with devices from different vendors. In at least one embodiment, hardware 3207 includes a host connected to one more devices that can be accessed to perform computational tasks via application programming interface ("API") calls. A device within hardware 3207 may include, but is not limited to, a GPU, FPGA, AI engine, or other compute device (but may also include a CPU) and its memory, as opposed to a host within hardware 3207 that may include, but is not limited to, a CPU (but may also include a compute device) and its memory, in at least one embodiment.

In at least one embodiment, software stack 3200 of a programming platform includes, without limitation, a number of libraries 3203, a runtime 3205, and a device kernel driver 3206. Each of libraries 3203 may include data and programming code that can be used by computer programs and leveraged during software development, in at least one embodiment. In at least one embodiment, libraries 3203 may include, but are not limited to, pre-written code and subroutines, classes, values, type specifications, configuration data, documentation, help data, and/or message templates. In at least one embodiment, libraries 3203 include functions that are optimized for execution on one or more types of devices. In at least one embodiment, libraries 3203 may include, but are not limited to, functions for performing mathematical, deep learning, and/or other types of operations on devices. In at least one embodiment, libraries 3303 are associated with corresponding APIs 3302, which may include one or more APIs, that expose functions implemented in libraries 3303.

In at least one embodiment, application 3201 is written as source code that is compiled into executable code, as discussed in greater detail below in conjunction with FIG. 37. Executable code of application 3201 may run, at least in part, on an execution environment provided by software stack 3200, in at least one embodiment. In at least one embodiment, during execution of application 3201, code may be reached that needs to run on a device, as opposed to a host. In such a case, runtime 3205 may be called to load and launch requisite code on a device, in at least one embodiment. In at least one embodiment, runtime 3205 may include any technically feasible runtime system that is able to support execution of application S01.

In at least one embodiment, runtime 3205 is implemented as one or more runtime libraries associated with corresponding APIs, which are shown as API(s) 3204. One or more of such runtime libraries may include, without limitation, functions for memory management, execution control, device management, error handling, and/or synchronization, among other things, in at least one embodiment. In at least one embodiment, memory management functions may include, but are not limited to, functions to allocate, deallocate, and copy device memory, as well as transfer data between host memory and device memory. In at least one embodiment, execution control functions may include, but are not limited to, functions to launch a function (sometimes referred to as a "kernel" when a function is a global function callable from a host) on a device and set attribute values in a buffer maintained by a runtime library for a given function to be executed on a device.

Runtime libraries and corresponding API(s) 3204 may be implemented in any technically feasible manner, in at least one embodiment. In at least one embodiment, one (or any number of) API may expose a low-level set of functions for fine-grained control of a device, while another (or any number of) API may expose a higher-level set of such functions. In at least one embodiment, a high-level runtime API may be built on top of a low-level API. In at least one embodiment, one or more of runtime APIs may be language-specific APIs that are layered on top of a language-independent runtime API.

In at least one embodiment, device kernel driver 3206 is configured to facilitate communication with an underlying device. In at least one embodiment, device kernel driver 3206 may provide low-level functionalities upon which APIs, such as API(s) 3204, and/or other software relies. In at least one embodiment, device kernel driver 3206 may be configured to compile intermediate representation ("IR") code into binary code at runtime. For CUDA, device kernel driver 3206 may compile Parallel Thread Execution ("PTX") IR code that is not hardware specific into binary code for a specific target device at runtime (with caching of compiled binary code), which is also sometimes referred to as "finalizing" code, in at least one embodiment. Doing so may permit finalized code to run on a target device, which may not have existed when source code was originally compiled into PTX code, in at least one embodiment. Alternatively, in at least one embodiment, device source code may be compiled into binary code offline, without requiring device kernel driver 3206 to compile IR code at runtime.

Figure 33:
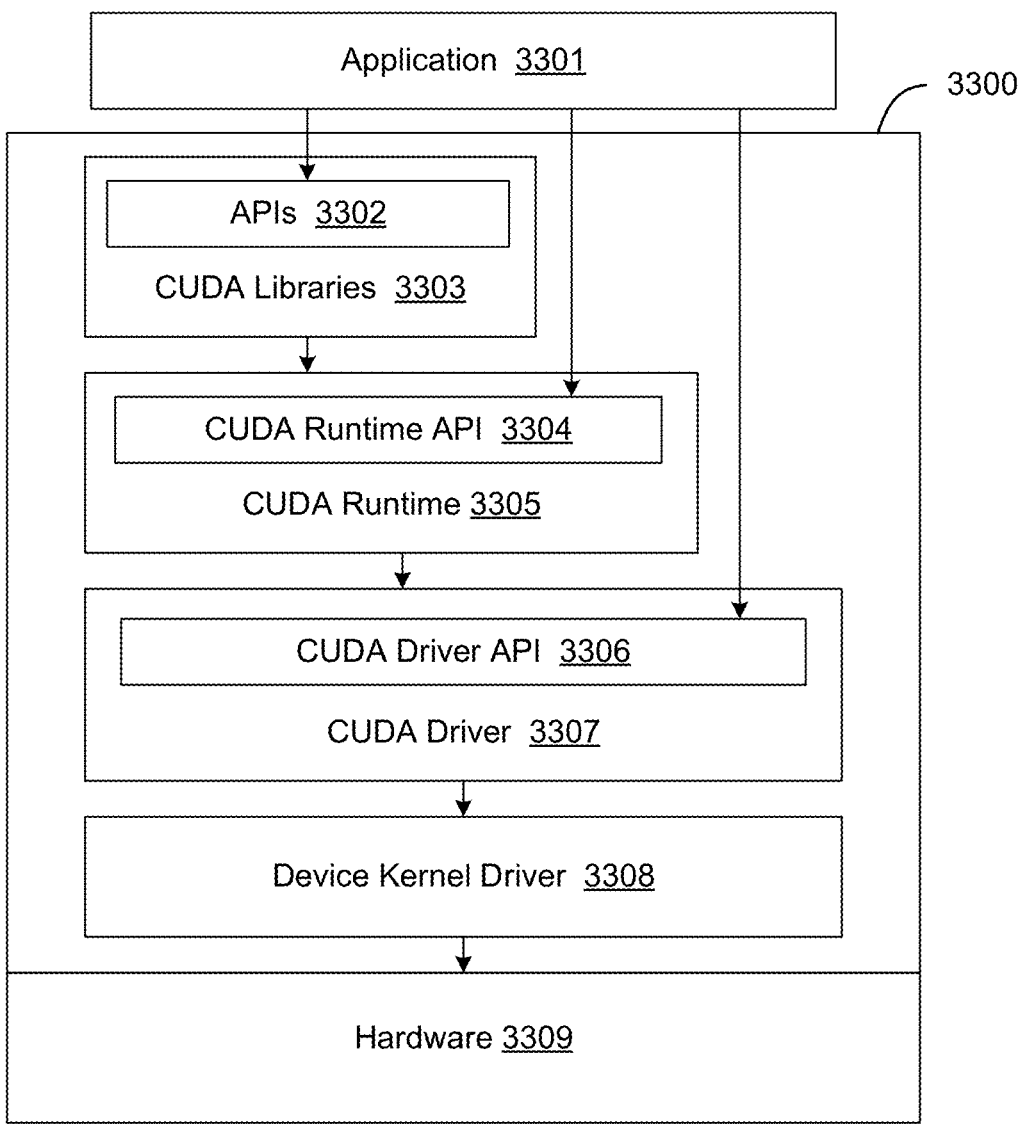
FIG. 33 illustrates a CUDA implementation of a software stack of FIG. 32, in accordance with at least one embodiment.

FIG. 33 illustrates a CUDA implementation of software stack 3200 of FIG. 32, in accordance with at least one embodiment. In at least one embodiment, a CUDA software stack 3300, on which an application 3301 may be launched, includes CUDA libraries 3303, a CUDA runtime 3305, a CUDA driver 3307, and a device kernel driver 3308. In at least one embodiment, CUDA software stack 3300 executes on hardware 3309, which may include a GPU that supports CUDA and is developed by NVIDIA Corporation of Santa Clara, CA.

In at least one embodiment, application 3301, CUDA runtime 3305, and device kernel driver 3308 may perform similar functionalities as application 3201, runtime 3205, and device kernel driver 3206, respectively, which are described above in conjunction with FIG. 32. In at least one embodiment, CUDA driver 3307 includes a library (libcuda.so) that implements a CUDA driver API 3306. Similar to a CUDA runtime API 3304 implemented by a CUDA runtime library (cudart), CUDA driver API 3306 may, without limitation, expose functions for memory management, execution control, device management, error handling, synchronization, and/or graphics interoperability, among other things, in at least one embodiment. In at least one embodiment, CUDA driver API 3306 differs from CUDA runtime API 3304 in that CUDA runtime API 3304 simplifies device code management by providing implicit initialization, context (analogous to a process) management, and module (analogous to dynamically loaded libraries) management. In contrast to high-level CUDA runtime API 3304, CUDA driver API 3306 is a low-level API providing more fine-grained control of a device, particularly with respect to contexts and module loading, in at least one embodiment. In at least one embodiment, CUDA driver API 3306 may expose functions for context management that are not exposed by CUDA runtime API 3304. In at least one embodiment, CUDA driver API 3306 is also language-independent and supports, e.g., OpenCL in addition to CUDA runtime API 3304. Further, in at least one embodiment, development libraries, including CUDA runtime 3305, may be considered as separate from driver components, including user-mode CUDA driver 3307 and kernel-mode device driver 3308 (also sometimes referred to as a "display" driver).

In at least one embodiment, CUDA libraries 3303 may include, but are not limited to, mathematical libraries, deep learning libraries, parallel algorithm libraries, and/or signal/image/video processing libraries, which parallel computing applications such as application 3301 may utilize. In at least one embodiment, CUDA libraries 3303 may include mathematical libraries such as a cuBLAS library that is an implementation of Basic Linear Algebra Subprograms ("BLAS") for performing linear algebra operations, a cuFFT library for computing fast Fourier transforms ("FFTs"), and a cuRAND library for generating random numbers, among others. In at least one embodiment, CUDA libraries 3303 may include deep learning libraries such as a cuDNN library of primitives for deep neural networks and a TensorRT platform for high-performance deep learning inference, among others.

Figure 34:
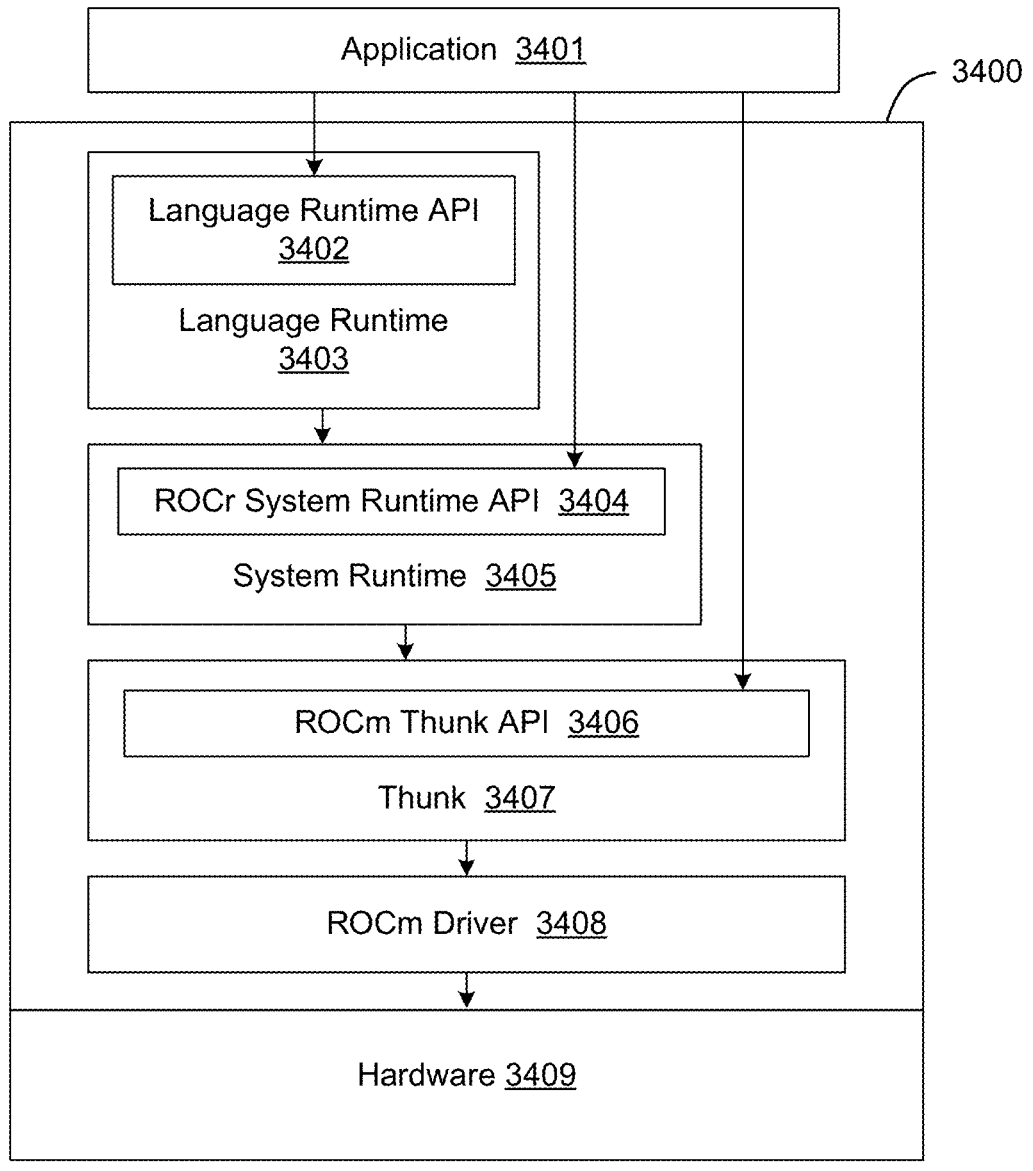
FIG. 34 illustrates a ROCm implementation of a software stack of FIG. 32, in accordance with at least one embodiment.

FIG. 34 illustrates a ROCm implementation of software stack 3200 of FIG. 32, in accordance with at least one embodiment. In at least one embodiment, a ROCm software stack 3400, on which an application 3401 may be launched, includes a language runtime 3403, a system runtime 3405, a thunk 3407, a ROCm kernel driver 3408, and a device kernel driver 3409. In at least one embodiment, ROCm software stack 3400 executes on hardware 3410, which may include a GPU that supports ROCm and is developed by AMD Corporation of Santa Clara, CA.

In at least one embodiment, application 3401 may perform similar functionalities as application 3201 discussed above in conjunction with FIG. 32. In addition, language runtime 3403 and system runtime 3405 may perform similar functionalities as runtime 3205 discussed above in conjunction with FIG. 32, in at least one embodiment. In at least one embodiment, language runtime 3403 and system runtime 3405 differ in that system runtime 3405 is a language-independent runtime that implements a ROCr system runtime API 3404 and makes use of a Heterogeneous System Architecture ("HAS") Runtime API. HAS runtime API is a thin, user-mode API that exposes interfaces to access and interact with an AMD GPU, including functions for memory management, execution control via architected dispatch of kernels, error handling, system and agent information, and runtime initialization and shutdown, among other things, in at least one embodiment. In contrast to system runtime 3405, language runtime 3403 is an implementation of a language-specific runtime API 3402 layered on top of ROCr system runtime API 3404, in at least one embodiment. In at least one embodiment, language runtime API may include, but is not limited to, a Heterogeneous compute Interface for Portability ("HIP") language runtime API, a Heterogeneous Compute Compiler ("HCC") language runtime API, or an OpenCL API, among others. HIP language in particular is an extension of C++ programming language with functionally similar versions of CUDA mechanisms, and, in at least one embodiment, a HIP language runtime API includes functions that are similar to those of CUDA runtime API 3304 discussed above in conjunction with FIG. 33, such as functions for memory management, execution control, device management, error handling, and synchronization, among other things.

In at least one embodiment, thunk (ROCt) 3407 is an interface that can be used to interact with underlying ROCm driver 3408. In at least one embodiment, ROCm driver 3408 is a ROCk driver, which is a combination of an AMDGPU driver and a HAS kernel driver (amdkfd). In at least one embodiment, AMDGPU driver is a device kernel driver for GPUs developed by AMD that performs similar functionalities as device kernel driver 3206 discussed above in conjunction with FIG. 32. In at least one embodiment, HAS kernel driver is a driver permitting different types of processors to share system resources more effectively via hardware features.

In at least one embodiment, various libraries (not shown) may be included in ROCm software stack 3400 above language runtime 3403 and provide functionality similarity to CUDA libraries 3303, discussed above in conjunction with FIG. 33. In at least one embodiment, various libraries may include, but are not limited to, mathematical, deep learning, and/or other libraries such as a hipBLAS library that implements functions similar to those of CUDA cuBLAS, a rocFFT library for computing FFTs that is similar to CUDA cuFFT, among others.

Figure 35:
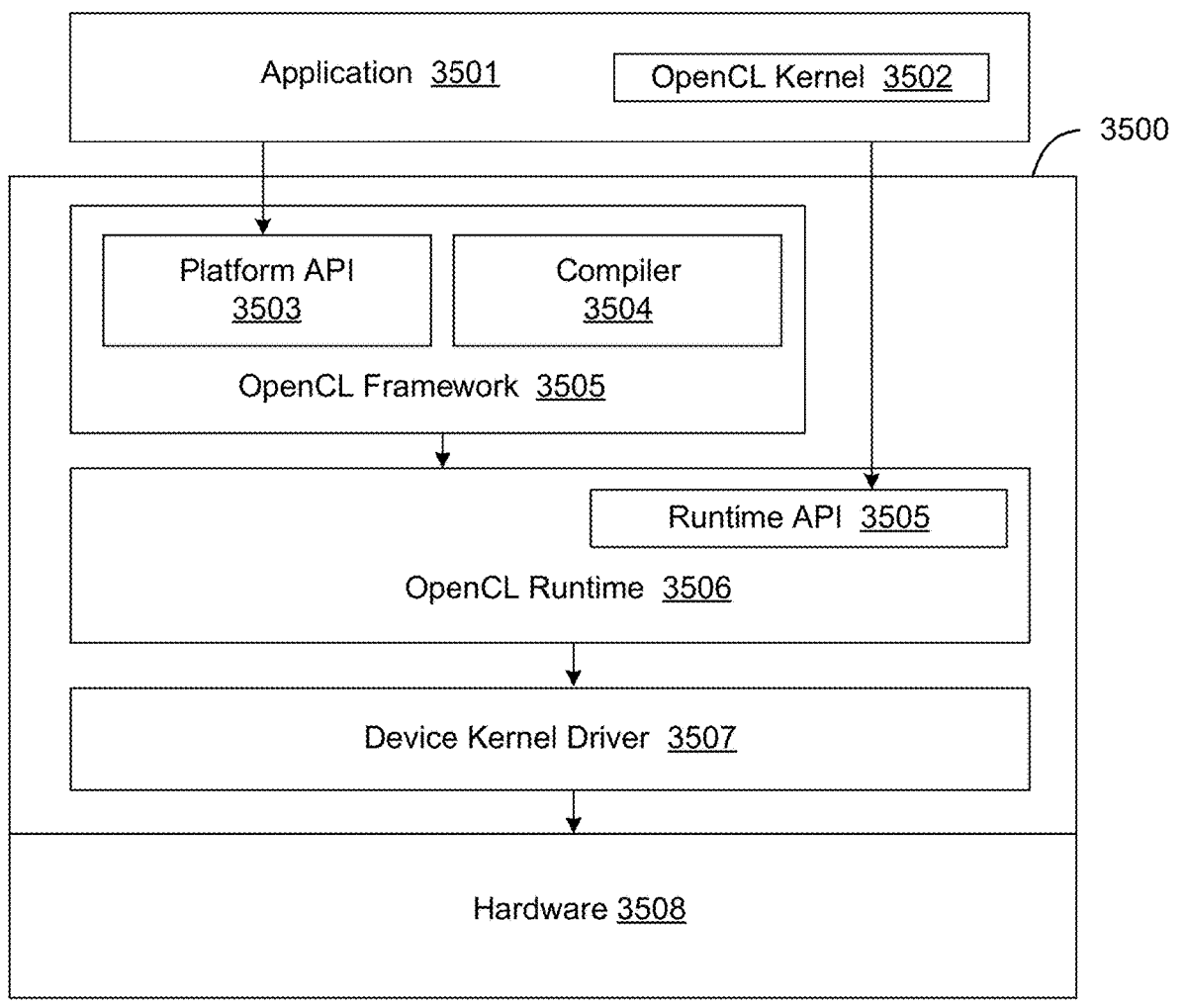
FIG. 35 illustrates an OpenCL implementation of a software stack of FIG. 32, in accordance with at least one embodiment.

FIG. 35 illustrates an OpenCL implementation of software stack 3200 of FIG. 32, in accordance with at least one embodiment. In at least one embodiment, an OpenCL software stack 3500, on which an application 3501 may be launched, includes an OpenCL framework 3505, an OpenCL runtime 3506, and a driver 3507. In at least one embodiment, OpenCL software stack 3500 executes on hardware 3309 that is not vendor-specific. As OpenCL is supported by devices developed by different vendors, specific OpenCL drivers may be required to interoperate with hardware from such vendors, in at least one embodiment.

In at least one embodiment, application 3501, OpenCL runtime 3506, device kernel driver 3507, and hardware 3508 may perform similar functionalities as application 3201, runtime 3205, device kernel driver 3206, and hardware 3207, respectively, that are discussed above in conjunction with FIG. 32. In at least one embodiment, application 3501 further includes an OpenCL kernel 3502 with code that is to be executed on a device.

In at least one embodiment, OpenCL defines a "platform" that allows a host to control devices connected to a host. In at least one embodiment, an OpenCL framework provides a platform layer API and a runtime API, shown as platform API 3503 and runtime API 3505. In at least one embodiment, runtime API 3505 uses contexts to manage execution of kernels on devices. In at least one embodiment, each identified device may be associated with a respective context, which runtime API 3505 may use to manage command queues, program objects, and kernel objects, share memory objects, among other things, for that device. In at least one embodiment, platform API 3503 exposes functions that permit device contexts to be used to select and initialize devices, submit work to devices via command queues, and enable data transfer to and from devices, among other things. In addition, OpenCL framework provides various built-in functions (not shown), including math functions, relational functions, and image processing functions, among others, in at least one embodiment.

In at least one embodiment, a compiler 3504 is also included in OpenCL framework 3505. Source code may be compiled offline prior to executing an application or online during execution of an application, in at least one embodiment. In contrast to CUDA and ROCm, OpenCL applications in at least one embodiment may be compiled online by compiler 3504, which is included to be representative of any number of compilers that may be used to compile source code and/or IR code, such as Standard Portable Intermediate Representation ("SPIR-V") code, into binary code. Alternatively, in at least one embodiment, OpenCL applications may be compiled offline, prior to execution of such applications.

Figure 36:
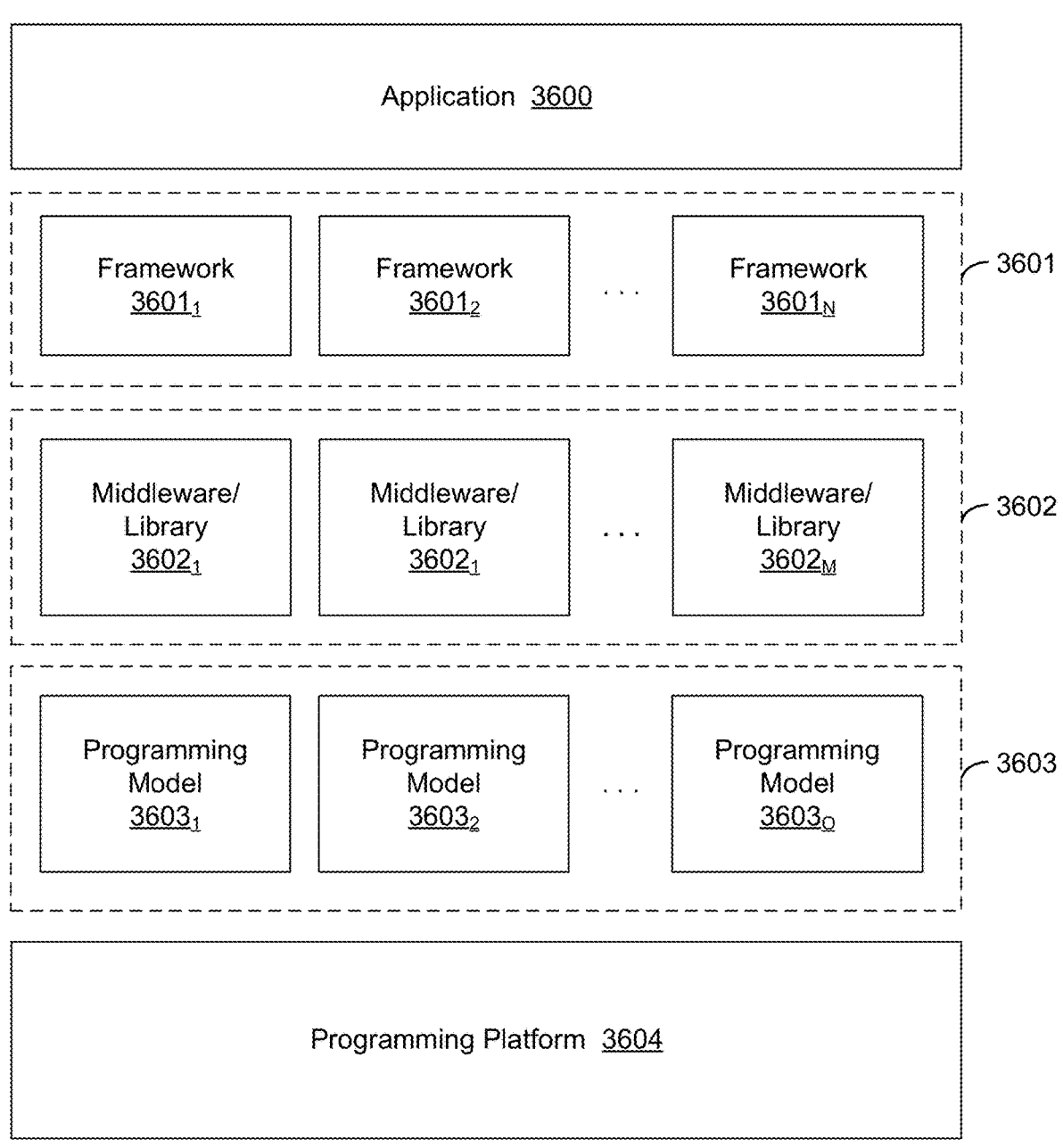
FIG. 36 illustrates software that is supported by a programming platform, in accordance with at least one embodiment.

FIG. 36 illustrates software that is supported by a programming platform, in accordance with at least one embodiment. In at least one embodiment, a programming platform 3604 is configured to support various programming models 3603, middlewares and/or libraries 3602, and frameworks 3601 that an application 3600 may rely upon. In at least one embodiment, application 3600 may be an AI/ML application implemented using, for example, a deep learning framework such as MXNet, PyTorch, or TensorFlow, which may rely on libraries such as cuDNN, NVIDIA Collective Communications Library ("NCCL"), and/or NVIDA Developer Data Loading Library ("DALI") CUDA libraries to provide accelerated computing on underlying hardware.

In at least one embodiment, programming platform 3604 may be one of a CUDA, ROCm, or OpenCL platform described above in conjunction with FIG. 33, FIG. 34, and FIG. 35, respectively. In at least one embodiment, programming platform 3604 supports multiple programming models 3603, which are abstractions of an underlying computing system permitting expressions of algorithms and data structures. Programming models 3603 may expose features of underlying hardware in order to improve performance, in at least one embodiment. In at least one embodiment, programming models 3603 may include, but are not limited to, CUDA, HIP, OpenCL, C++ Accelerated Massive Parallelism ("C++ AMP"), Open Multi-Processing ("OpenMP"), Open Accelerators ("OpenACC"), and/or Vulcan Compute.

In at least one embodiment, libraries and/or middlewares 3602 provide implementations of abstractions of programming models 3604. In at least one embodiment, such libraries include data and programming code that may be used by computer programs and leveraged during software development. In at least one embodiment, such middlewares include software that provides services to applications beyond those available from programming platform 3604. In at least one embodiment, libraries and/or middlewares 3602 may include, but are not limited to, cuBLAS, cuFFT, cuRAND, and other CUDA libraries, or rocBLAS, rocFFT, rocRAND, and other ROCm libraries. In addition, in at least one embodiment, libraries and/or middlewares 3602 may include NCCL and ROCm Communication Collectives Library ("RCCL") libraries providing communication routines for GPUs, a MIOpen library for deep learning acceleration, and/or an Eigen library for linear algebra, matrix and vector operations, geometrical transformations, numerical solvers, and related algorithms.

In at least one embodiment, application frameworks 3601 depend on libraries and/or middlewares 3602. In at least one embodiment, each of application frameworks 3601 is a software framework used to implement a standard structure of application software. An AI/ML application may be implemented using a framework such as Caffe, Caffe2, TensorFlow, Keras, PyTorch, or MxNet deep learning frameworks, in at least one embodiment.

Figure 37:
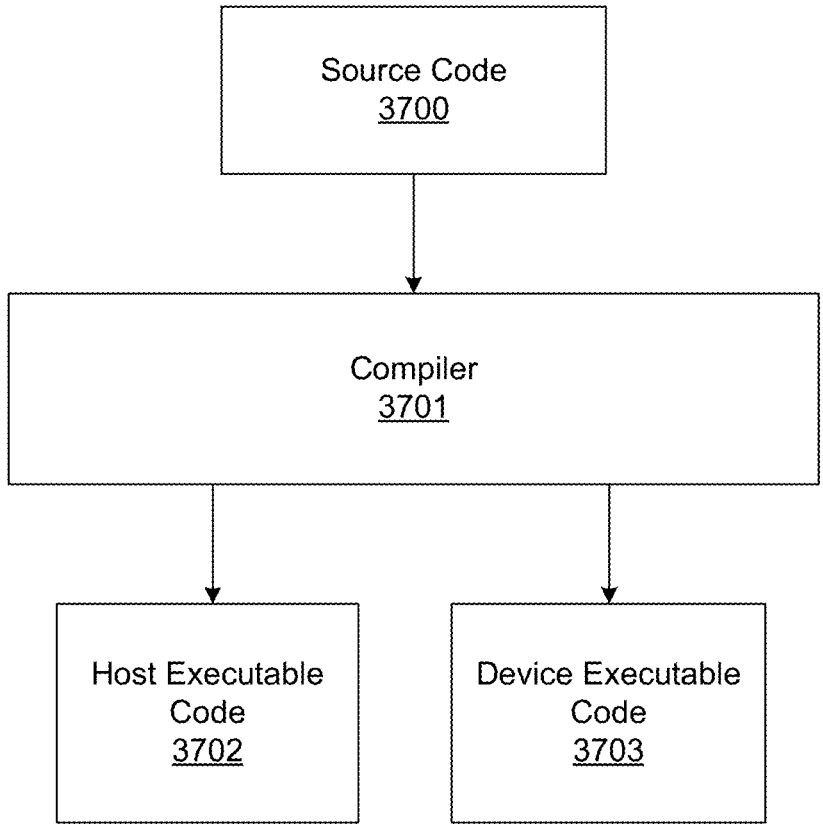
FIG. 37 illustrates compiling code to execute on programming platforms of FIGS. 32-35, in accordance with at least one embodiment.

FIG. 37 illustrates compiling code to execute on one of programming platforms of FIGS. 32-35, in accordance with at least one embodiment. In at least one embodiment, a compiler 3701 receives source code 3700 that includes both host code as well as device code. In at least one embodiment, compiler 3701 is configured to convert source code 3700 into host executable code 3702 for execution on a host and device executable code 3703 for execution on a device. In at least one embodiment, source code 3700 may either be compiled offline prior to execution of an application, or online during execution of an application.

In at least one embodiment, source code 3700 may include code in any programming language supported by compiler 3701, such as C++, C, Fortran, etc. In at least one embodiment, source code 3700 may be included in a single-source file having a mixture of host code and device code, with locations of device code being indicated therein. In at least one embodiment, a single-source file may be a .cu file that includes CUDA code or a .hip.cpp file that includes HIP code. Alternatively, in at least one embodiment, source code 3700 may include multiple source code files, rather than a single-source file, into which host code and device code are separated.

In at least one embodiment, compiler 3701 is configured to compile source code 3700 into host executable code 3702 for execution on a host and device executable code 3703 for execution on a device. In at least one embodiment, compiler 3701 performs operations including parsing source code 3700 into an abstract system tree (AST), performing optimizations, and generating executable code. In at least one embodiment in which source code 3700 includes a single-source file, compiler 3701 may separate device code from host code in such a single-source file, compile device code and host code into device executable code 3703 and host executable code 3702, respectively, and link device executable code 3703 and host executable code 3702 together in a single file, as discussed in greater detail below with respect to FIG. 26.

In at least one embodiment, host executable code 3702 and device executable code 3703 may be in any suitable format, such as binary code and/or IR code. In a case of CUDA, host executable code 3702 may include native object code and device executable code 3703 may include code in PTX intermediate representation, in at least one embodiment. In a case of ROCm, both host executable code 3702 and device executable code 3703 may include target binary code, in at least one embodiment.

Figure 38:
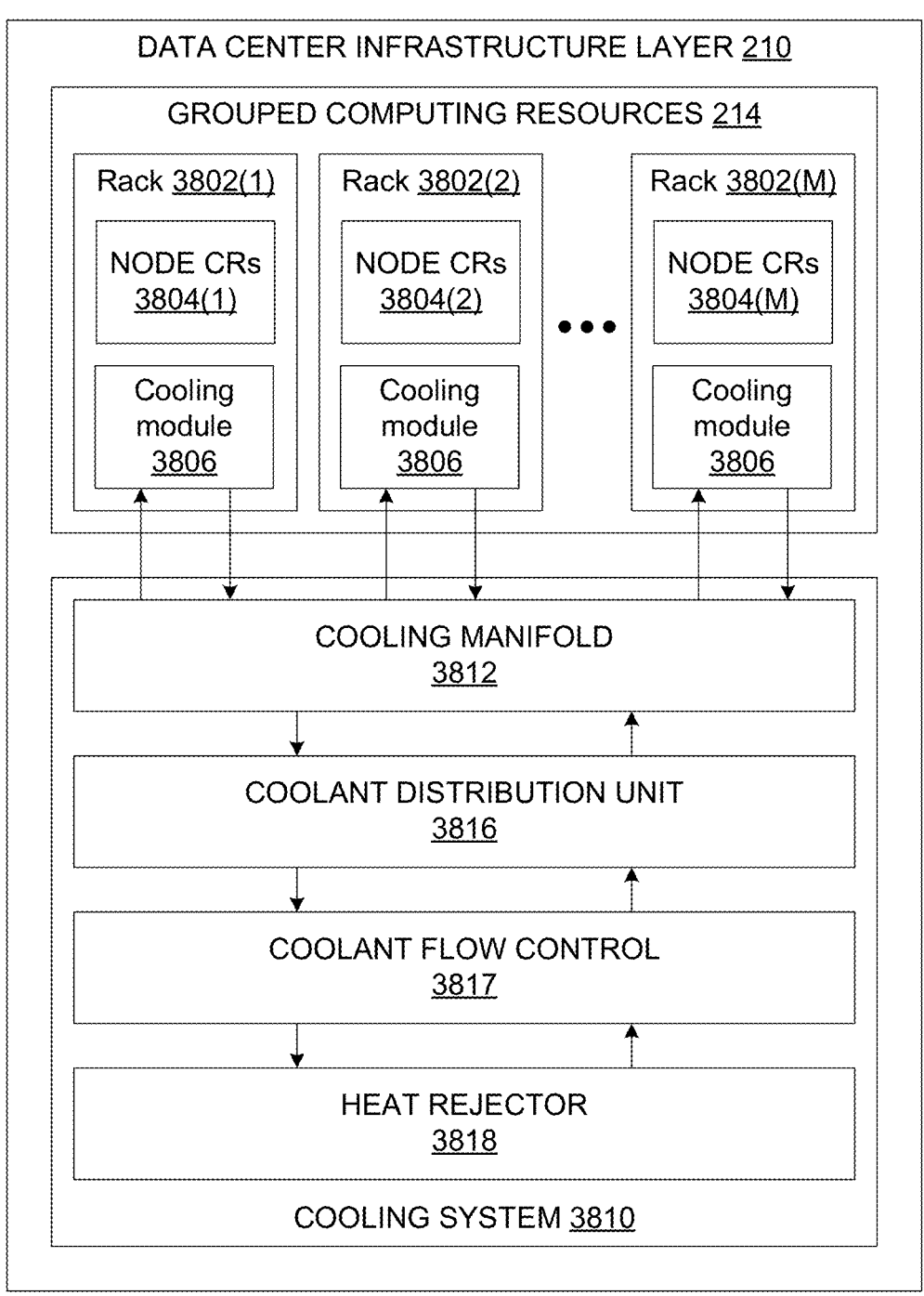
FIG. 38 illustrates a data center infrastructure layer that includes grouped computing resources and a cooling system, in accordance with at least one embodiment.

FIG. 38 illustrates an exemplary embodiment of the data center infrastructure layer 210. The resource orchestrator 212 is omitted from this view in the interest of simplicity. Additional detail is provided for the grouped computing resources 214, which may include M racks 3802(1)-3802(M). Each rack may house one or more of the node C.R.s 216(1)-216(N), with the groups of node C.R.s 216 that is housed within the respective racks 3802(1)-3802(M) being indicated as node CRs 3804(1)-3804(M).

The node CRs 3804 may include any appropriate type of computing resource, at any level of granularity. For example, the node CRs 3804 may be considered as being servers, each of which may include multiple processors. In another example, the node CRs 3804 may be considered to be individual processors. Each of the node CRs 3804 may be separately cooled, and may furthermore be selectively enabled. Thus, as workloads within the data center change, individual resources among the node CRs 3804 may be turned on and off.

Each rack 3802 includes a respective cooling module 3806. The cooling modules 3806 distribute coolant within the rack 3802, and may include any appropriate manifolds, piping, pumps, heat sinks, valves, and coolant that may be used to cool the computing resources of the respective node CRs 3804 in the rack 3802. Thus, each of the racks 3802 in the grouped computing resources 214 has its own internal cooling system implemented by the respective cooling module 3806. Coolant in each cooling module 3806 circulates within the respective rack 3802, but is exchanged with a cooling system 3810 that is in fluid communication with the racks 3802.

As coolant circulates within a given rack 3802, it takes waste heat from the node CRs 3804. The amount of coolant flow that is needed to cool a rack 3802 will depend on the number of node CRs 3804 that are enabled within the rack.

As node CRs 3804 are disabled, for example because they are not needed to process a given workload, coolant circulation to the disabled node CRs 3804 may be turned off.

This change in cooling load may be accompanied by changes in coolant pressure within the cooling system. For example, if many node CRs 3804 are enabled and the load is high, the pressure differential between coolant entering a rack 3802 and coolant leaving the rack 3802 may be much larger than the pressure differential that is measured when fewer node CRs 3804 are enabled and the load is low.

As the cooling module 3806 of each rack 3802 manages the coolant flow within that rack 3802, the cooling module 3806 may sense the cooling needs of the rack 3802 and may react accordingly. For example, as the workload being executed by node CRs 3804 within the rack 3802 increases and additional coolant is used, the cooling module 3806 may recognize this by an increased pressure differential between the input and the output coolant lines for the rack 3802, and may adjust coolant flow to the rack accordingly. This pressure differential information may therefore correspond to, e.g., a number of servers or processors that are turned on within the rack 3802, and may be reported to other components within the cooling system 3810 to control coolant flow.

When warm coolant leaves a rack 3802, the warm coolant may enter a cooling manifold, where it may combine with warm coolant from other racks 3802. The warm coolant passes from the cooling manifold 3812 to a coolant distribution unit (CDU) 3816. The CDU 3816 manages heat exchange between the coolant in the cooling manifold 3812 and coolant within a heat rejector 3818. For example, the CDU 3816 may include liquid-to-liquid heat exchanger, where warm coolant from the cooling manifold 3812 transfers heat to cool coolant from the heat rejector 3818. The CDU may then return the cooled coolant back to the cooling manifold, where it may pass along a separate cool coolant path to the cooling modules 3806.

In at least some embodiments, internal coolant may refer to coolant that flows between the CDU 3816 and the racks 3802, while external coolant may refer to coolant that flows between the CDU 3816 and the heat rejector 3818. Thus, the CDU 3816 transfers heat from the internal coolant to the external coolant.

As the internal coolant from the cooling manifold 3812 loses heat to the coolant from the heat rejector 3818 at the CDU 3816, the temperature of the external coolant from the heat rejector 3818 rises. The warmer external coolant is then cooled by the heat rejector 3818 by any appropriate means, including active cooling, such as by a compressor, or by passive cooling, such as by a cooling tower.

The CDU 3816 may control the exchange of heat between internal coolant from the cooling manifold 3812 and external coolant from the heat rejector 3818. However, each CDU 3816 has its own respective operational characteristics, and may have a range of coolant flow rates in which the CDU 3816 provides its best performance. For example, a given CDU 3816 may have a maximum cooling capacity that represents the heat load and coolant flow rate that the CDU 3816 can reliably manage, but may also have a minimum flow rate for the external coolant, below which the CDU 3816 may no longer provide coolant flow with a reliable temperature and rate. In some exemplary embodiments, the temperature fluctuations may need to remain within ±1° C.

The design of the CDU 3816 may be outside the control of a data center designer. In at least some embodiments, coolant flow control 3817 may be used to manage the coolant flow rate that enters the CDU 3816 from the heat rejector 3818, so that flow regulation limitations of the CDU

3816 do not cause temperature fluctuations in the internal coolant. The coolant flow control 3817 may respond to pressure differential information that is reported by the cooling modules 3806, so that primary coolant flow to the CDU 3816 may be managed in a manner that rapidly responds to changing workloads.

The internal coolant and the external coolant may include any appropriate cooling fluid, including water, glycol, propylene glycol, combinations thereof, or any other appropriate refrigerant or single-phase or two-phase coolant fluid.

The different components of the cooling system 3810 may communicate with one another to achieve effective cooling of all computing resources 3804. In at least some embodiments, sensors may be positioned at various points in the cooling system 3810, cooling modules 3806, racks 3802, and computing resources 3804 to collect operational information about the data center. This information may be transmitted to decision-making logic, for example at control valves within the system or some other data center management system. Instructions may similarly be transmitted, for example to control valves within the cooling system 3810 and cooling modules 3806.

Such communications can be effected using any appropriate communications medium and protocol or combination thereof. In at least some embodiments, components may communicate using TCP/IP, transmitting data using any appropriate computer networking hardware. In at least some examples, MODBUS® may be used to communicate information using any appropriate MODBUS® communications hardware. In at least some examples, ASHRAE BACNET® may be used to communicate information using any appropriate computer networking hardware.

Figure 39A:
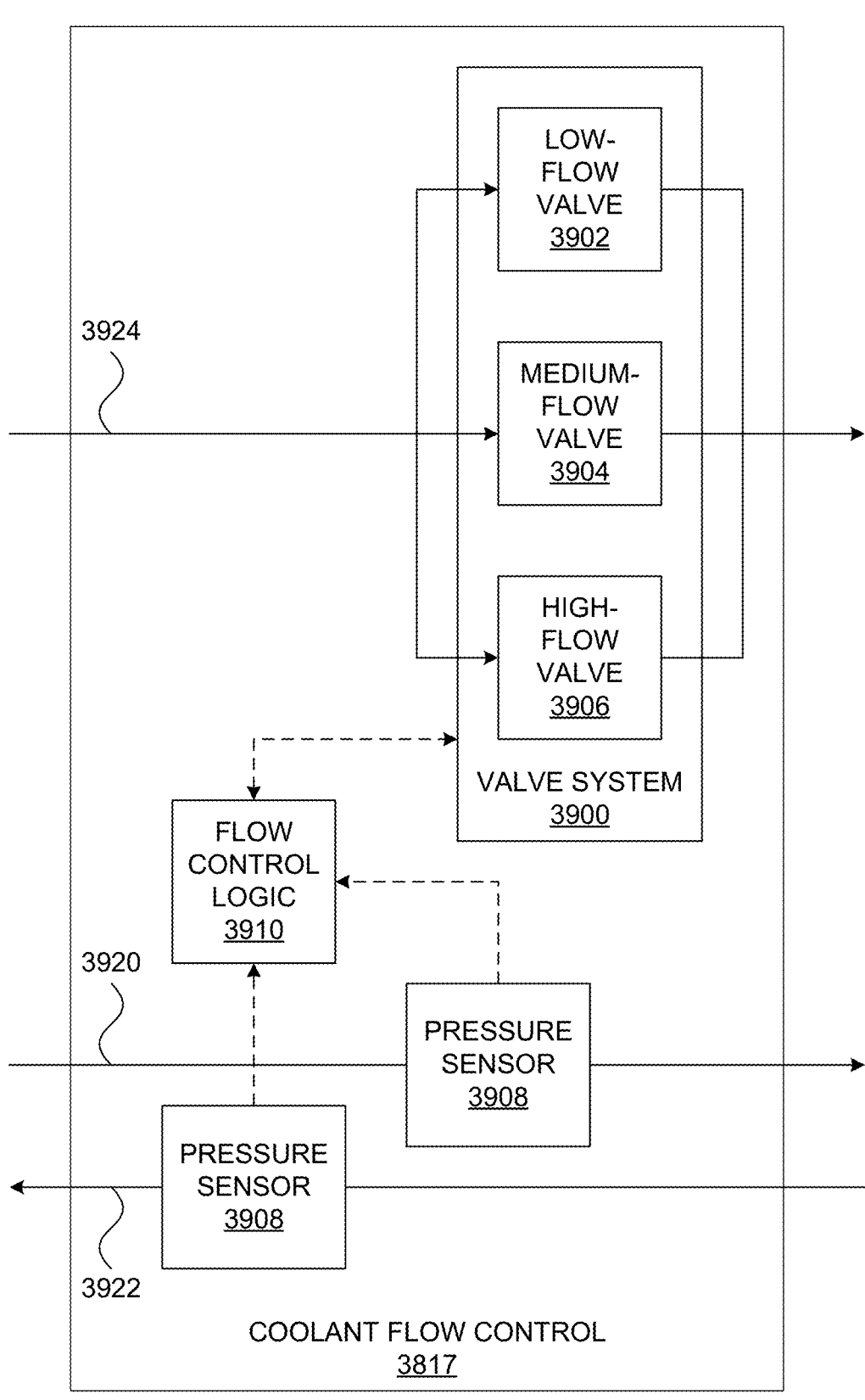
FIG. 39A illustrates a coolant flow control that responds to pressure differential measurements, in accordance with at least one embodiment.

FIG. 39A illustrates an exemplary embodiment of the coolant flow control 3817. In this figure, solid lines indicate a coolant path, with an arrow indicating a direction of coolant flow, and dashed lines indicate a data path that communicates information and/or instructions. The coolant flow control 3817 manages the rate of external coolant flow 3924 between the heat rejector 3818 and the CDU 3816, but uses information relating to the internal coolant flow to do so.

The coolant flow control 3817 collects pressure information from the internal coolant using pressure sensors 3908. As the external coolant 3924 passes through a valve system 3900, the valve system 3900 determines the rate at which external coolant 3924 can circulate through the CDU 3816. This rate of flow is controlled according to the collected pressure information.

In at least some embodiments, the valve system 3900 may include multiple flow control valves, each of which may manage the coolant flow rate in a different range. For example, the valve system 3900 may include three valves arranged in parallel, including a low-flow valve 3902, a medium-flow valve 3904, and a high-flow valve 3906. It should be understood that, although three flow regimes are described herein, any appropriate number may be used instead.

The valves of the valve system 3900 may have overlapping flow rate ranges. For example, the high range of the acceptable flow rates in the low-flow valve 3902 may be able to accommodate some of the same flow rate values as the low range of the acceptable flow rates in the medium-flow valve 3904. Similarly, the range of the medium-flow valve 3904 may overlap with the range of the high-flow valve 3906.

In at least some embodiments, the valve system 3900 may select which of the valves controls the flow of coolant to the CDU 3816. This control may be performed by flow control logic 3910. In at least some embodiments, the flow control logic 3910 may make a determination about the appropriate range of coolant flow rates based on pressure differential information.

As internal coolant passes through the cooling module 3806 of a rack 3802, the pressure of the internal coolant drops. The magnitude of the pressure drop may depend on how many node CRs 3804 are being cooled within the rack 3802. For example, if a large number of node CRs 3804 are being cooled, the pressure drop may be larger than if a smaller number of node CRs 3804 are being cooled.

In a data center with variable loads, the node CRs 3804 within a given rack 3802 may generate differing amounts of heat, and some may be turned off entirely when they are not needed. The pressures of the coolant that is output by the respective cooling modules 3806 combine within the cooling manifold 3812. In at least some embodiments, the pressure sensors 3908 measure the pressure of the cool internal coolant flow 3922 to the cooling manifold 3812 from the CDU 3816 and the pressure of the warm internal coolant flow 3920 from the cooling manifold 3812 to the CDU 3816. In at least some embodiments, the pressure sensors 3908 may measure the pressure of the cool internal coolant flow 3922 to a given rack 3802 and the pressure of the warm internal coolant flow 3920 from the given rack 3802. In at least some embodiments, multiple sets of pressure sensors 3908 may be used to measure respective pressure differentials from each of the different racks 3802 in a data center, and may report fine-grained load information to the flow control logic 3910.

The measured pressure information may be used to determine a pressure differential, for example by determining the difference between the pressure measurements. This pressure differential may be calculated at the sensors, for example before the information is transmitted to the flow control logic 3910, or may be determined by the flow control logic 3910 itself. The pressure sensors 3908 may communicate with the flow control logic 3910 by any appropriate wired or wireless communications medium and protocol. The flow control logic 3910 determines the pressure differential based on these measurements and identifies a corresponding flow rate regime responsive to the pressure differential, and sends a valve selection to the valve system 3900.

The flow control logic 3910 selects an appropriate valve within the valve system 3900 to manage coolant flow within the identified flow rate regime. In at least some embodiments, the low-flow valve 3902 may be enabled when the pressure differential is below a low pressure-difference threshold value, the high-flow valve 3906 may be enabled when the pressure differential is above a high pressure-difference threshold value, and the medium-flow valve 3904 may be enabled when the pressure differential is between the low pressure-difference threshold value and the high pressure-difference threshold value. To enable a given valve, the enabled valve may be opened while the other valves in the valve system 3900 may be closed completely, so that coolant only flows through the enabled valve.

In at least some embodiments, the selection of the valve within the valve system 3900 may be selected to achieve hysteresis when the ranges of the valves overlap one another. Thus, a first set of thresholds may be used as the flow rate increases, while a second set of thresholds may be used as the flow rate decreases. Thus the switching between, for example, the low-flow valve 3902 and the medium-flow valve 3904 may occur at different coolant flow rates depending on the direction of change.

This hysteresis can be used to minimize switching between valves in the valve system 3900, for example when the coolant flow rate is fluctuating within a range of overlap between two different regimes. Hysteresis in flow control logic 3901 may prevent a small and transient change in cooling load from resulting in unnecessary valve changes, which can decrease wear on the valves and can further decrease temperature fluctuations in the coolant.

Figure 39B:
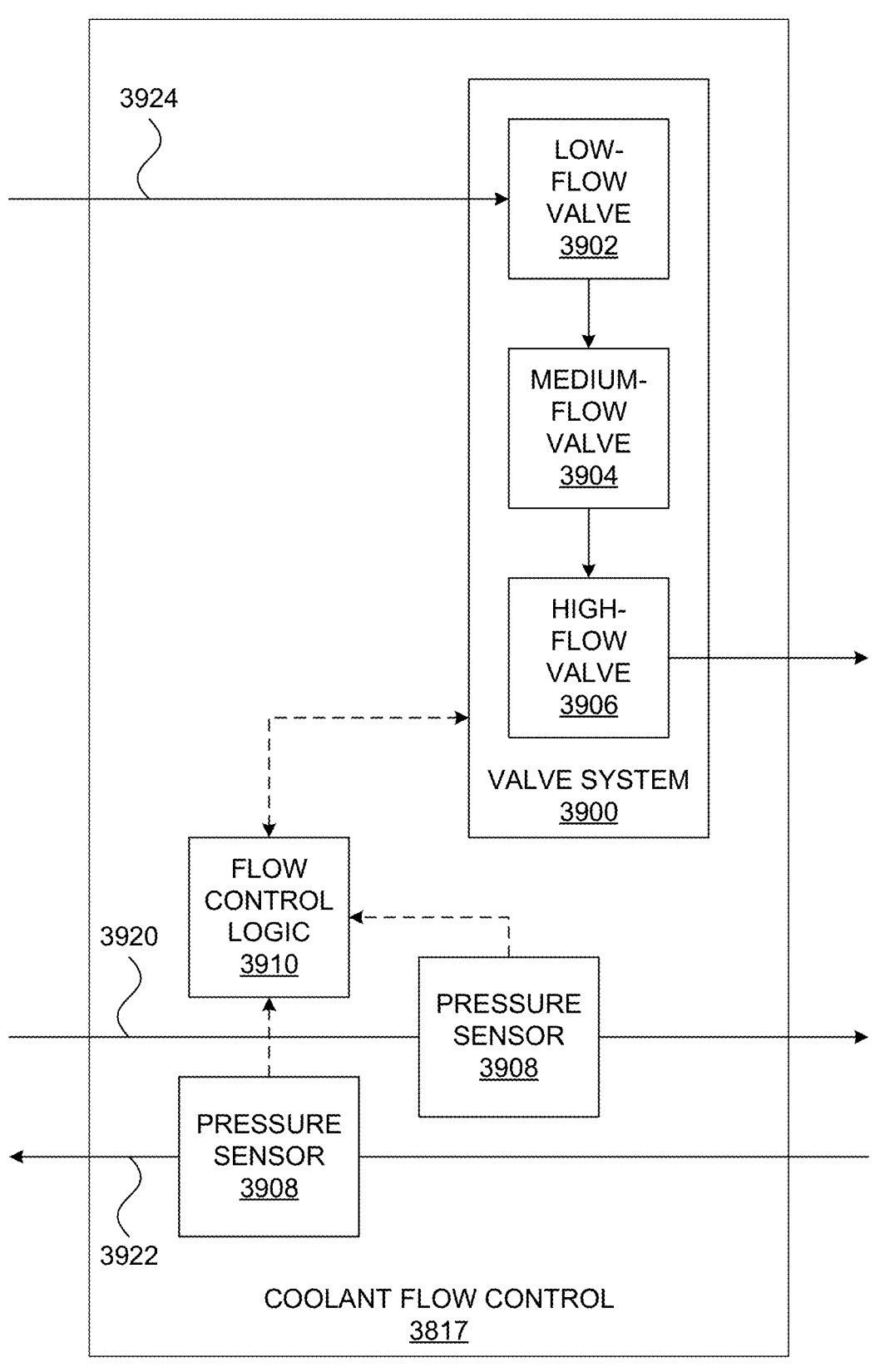
FIG. 39B illustrates a coolant flow control that responds to pressure differential measurements, in accordance with at least one embodiment.

FIG. 39B illustrates an exemplary embodiment of the coolant flow control 3817. In this figure, solid lines indicate a coolant path, with an arrow indicating a direction of coolant flow, and dashed lines indicate a data path that communications information and/or instructions.

In at least some embodiments, the valve system 3900 may be configured with the valves (3902, 3904, and 3906) arranged in series. To enable a valve in such embodiments, in at least some embodiments the enabled valve may be partially closed to limit coolant flow, while the other valves may be opened completely, so that the enabled valve controls the flow of coolant through the valve system 3900.

Figure 40:
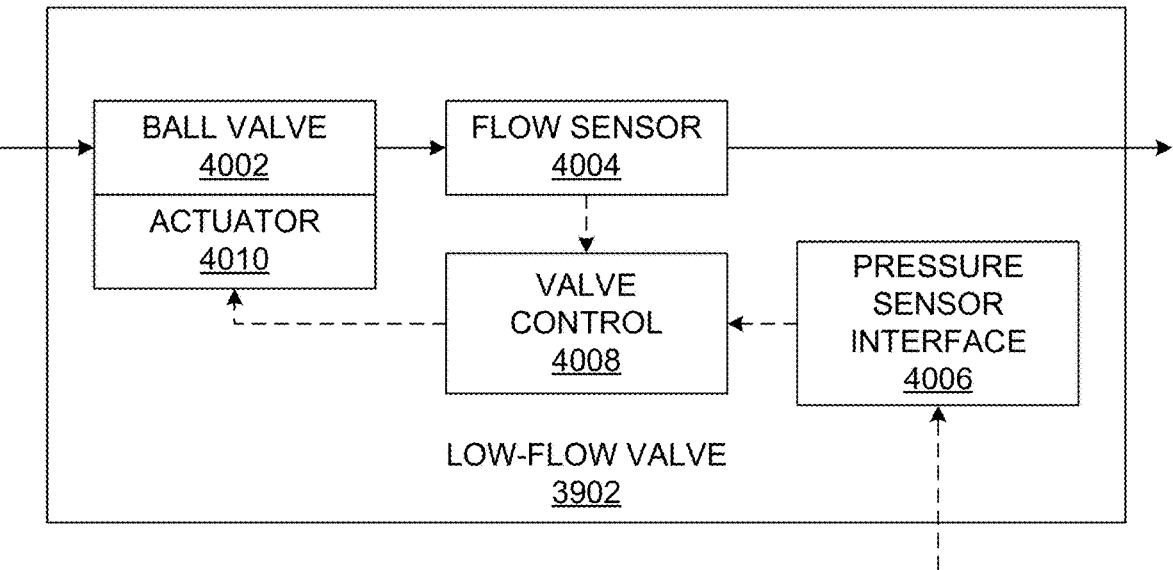
FIG. 40 illustrates a valve that controls coolant flow responsive to pressure measurements, in accordance with at least one embodiment.

FIG. 40 illustrates an exemplary embodiment of the low-flow valve 3902. As above, solid lines indicate a direction of coolant flow, while dashed lines indicate a direction of information flow. Although only the low-flow valve 3902 is shown in detail herein, the medium-flow valve 3904 and the high-flow valve 3906 may have a similar design.

An exemplary valve design is shown using a ball valve 4002, but it should be understood that any appropriate automatically controlled valve type may be used, in accordance with the properties of the coolant fluid. The low-flow valve 3902 accepts coolant input at the ball valve 4002, and measures a rate of coolant flow using flow sensor 4004. Although the flow sensor 4004 is shown as being positioned downstream from the ball valve 4002, the flow sensor 4004 may alternatively be placed before the ball valve 4002 in the coolant flow path.

The ball valve 4002 may be automatically controlled by valve control 4008 using an actuator 4010. The valve control 4008 may include any appropriate processor, such as a microprocessor or an application-specific integrated circuit. The actuator 4010 may operate by any appropriate mechanism, for example being air-actuated or electrically actuated. Valve control 4008 accepts coolant flow measurements from the flow sensor 4004 as well as pressure measurements from the pressure sensor interface 4006. The pressure information may come from separate pressure sensors 3908, measuring the pressure of coolant flows 3920 and 3922, or may be integrated with the low-flow valve 3902. The valve control 4008 sends a signal to the actuator 4010, for example providing instructions for a position of the ball valve 4002, which the actuator 4010 may then enact by rotating the ball valve to allow a specified coolant flow.

When the low-flow valve 3902 is enabled, the valve control 4008 uses pressure differential information from the pressure sensor interface 4006 to control a rate of flow. For example, valve control 4008 may include a lookup table with flow rates that correspond to respective pressure differential measurements. Thus, when the pressure differential measurement indicates an increased cooling load in the data center, then valve control 4008 may increase the flow through the ball valve 4002. When the pressure differential measurement indicates a decreased cooling load in the data center, then valve control 4008 may decrease the flow through the ball valve 4002. The values in the pressure differential lookup table may be determined empirically, for example by turning on a predetermined number of servers within the data center, measuring the pressure differential, and determining corresponding heat load and cooling needs. In at least some embodiments, proportional-integral-differential (PID) control may be used to regulate flow through the low-flow valve 3902.

In addition to pressure information, information from the flow sensor 4004 may be used by the valve control 4008. For example, the ball valve 4002 may have an upper limit to the coolant flow rate that it can handle. The flow sensor 4004 may detect when the coolant flow rate is approaching such a limit, and valve control 4008 may cause the ball valve 4002 to limit flow, for example to limit damage in the event of a downstream coolant leak. Information from the flow sensor 4004 may furthermore be passed back to the flow control logic 3910, where the information may be used to make determinations about how the valve system 3900 operates.

Figure 41:
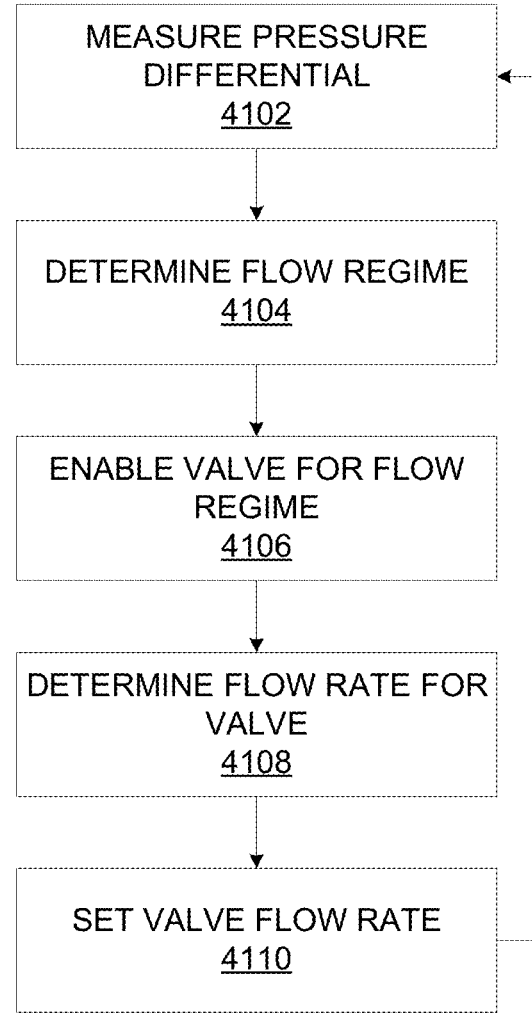
FIG. 41 illustrates a method for managing coolant flow through coolant valves responsive to pressure measurements, in accordance with at least one embodiment.

FIG. 41 illustrates an exemplary embodiment of a method for controlling flow to a CDU 3816. In particular, the flow control logic 3910 within a coolant flow control 3817 may measure a pressure differential between pressure sensors 3908 at block 4102, representing the difference in measured pressure in the coolant lines 3920 and 3922. Based on the measured pressure differential, block 4104 determines a corresponding flow regime (e.g., "high," "medium," or "low"). This may be performed by, e.g., comparing the pressure differential to one or more thresholds or by using the pressure differential as input to a lookup table.

Based on the determined flow regime, a corresponding valve of the valve system 3900 is enabled in block 4106. In examples where the valve system 3900 has a parallel valve arrangement, the non-enabled valves may be entirely shut off, while the enabled valve may open to a determined degree to control flow rate. In examples where the valve system 3900 has a serial valve arrangement, the non-enabled valves may be fully opened, while the enabled valve may open to a determined degree to control flow rate.

Based on the measured pressure differential, the valve's flow rate may be determined by valve control 4008 in block 4108. This flow rate may be determined by valve control 4008, which may include PID control logic. Block 4110 may then set the valve flow rate, for example by setting the position of ball valve 4002.

Figure 42:
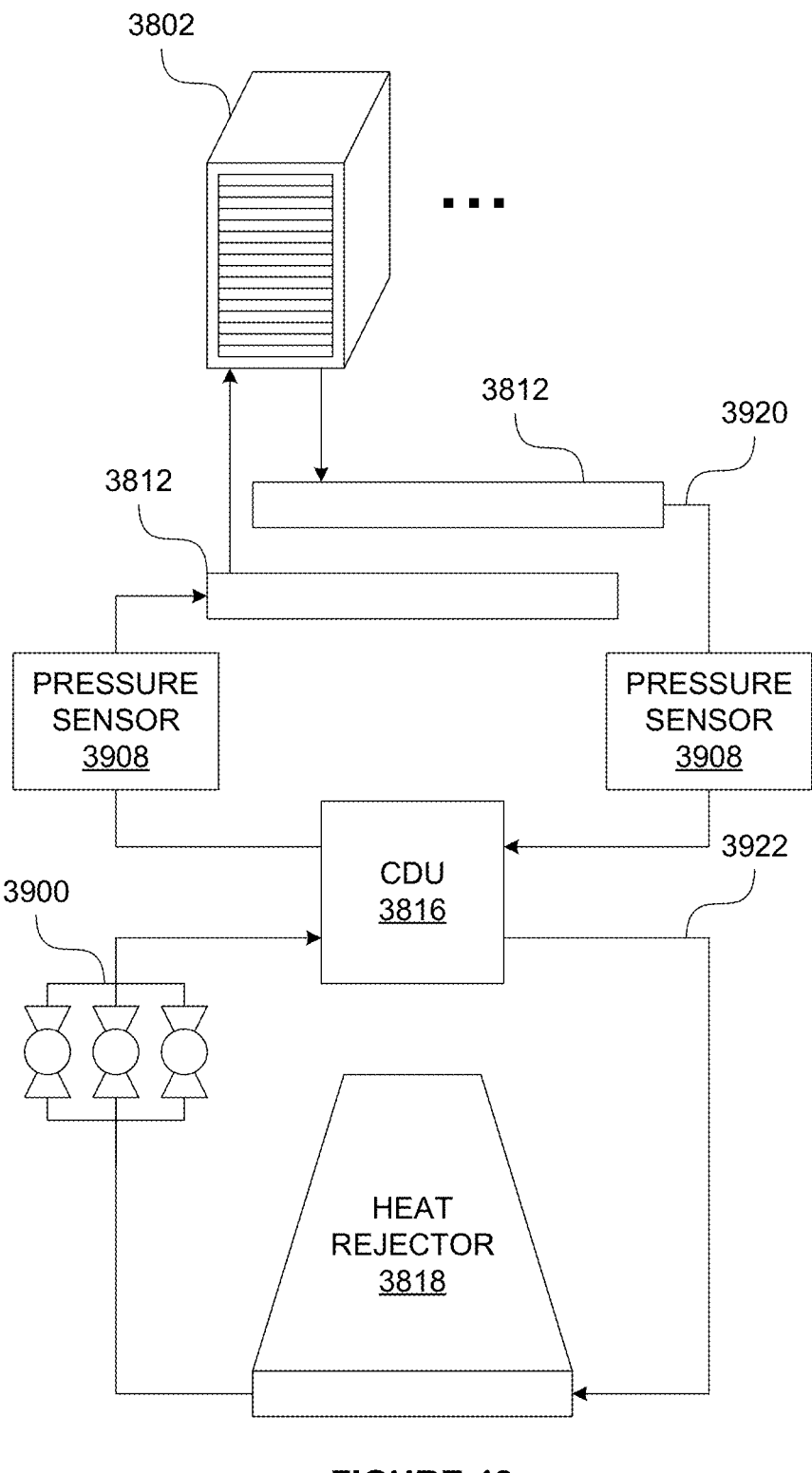
FIG. 42 illustrates a data center cooling system with a flow control valve system on a primary coolant loop, in accordance with at least one embodiment.

FIG. 42 illustrates an exemplary embodiment showing coolant pathways between the cooling manifold 3812 and the racks 3802. The cooling manifold 3812 may include a warm coolant manifold and a cool coolant manifold, with cool coolant being supplied to the racks 3802 and with warm coolant being received from the racks 3802.

Each rack 3802 may be associated with a respective pair of pressure sensors 3908, taking pressure measurements on a respective coolant line. Thus, for a given rack 3802, a first pressure sensor 3908 may measure the pressure of coolant flowing to the rack 3802 and a second pressure sensor 3908 may measure the pressure of coolant flowing from the rack 3802. In at least some embodiments, these pressure measurements may be provided to a local valve for each rack 3802, and may be used to control coolant flow through the respective rack 3802. In at least some embodiments, the pressure measurements may be provided to flow control logic 3910 in the coolant flow control 3817, where they may be used to control flow of primary coolant to the CDU 3816. In this way, flow through the coolant flow control 3817 may be made responsive to fine-grained changes in the heat load generated by the grouped computing resources 214, so that coolant flow to the CDU 3817 can be rapidly adjusted to compensate for changes in the heat load. In at least some embodiments, increasing the rate at which the coolant flow control 3817 responds to feedback from the pressure sensors 3908 can decrease fluctuations in the secondary coolant temperature, improving cooling performance.

During operation, this process may be repeated on a periodic basis. In at least some embodiments, updated pressure measurements may be taken at a rate of once every second, but any appropriate time interval may be used instead. The updated pressure information may be used to make updated determinations about the flow regime and the valve flow rate, so that changes to data center workload can be accommodated with little disruption to the internal coolant temperature.

During the determination of the appropriate flow regime at block 4104, there may be some consideration given to hysteresis when changing between flow regimes. For example, changing between flow regimes by disabling one valve and enabling another may cause transient fluctuations in temperature for the internal coolant, until the newly enabled valve can find the correct coolant flow rate. To minimize disruptions, overlapping flow rate ranges for the valves in the valve system 3900 may be used to reduce regime changes at intermediate values.

In at least some embodiments, as the load in the data center increases, and the cooling needs increase accordingly, the flow rate through the valve system 3900 may increase to enter a region where the flow rate ranges of two valves overlap. The flow control logic 3910 may wait until the upper limit of the lower-flow valve is reached before switching to the higher-flow valve. Then, should the load decrease, the flow control logic 3910 may wait until the lower limit of the higher-flow valve is reached before switching back to the lower-flow valve. In this way, unnecessary switching between valves may be avoided when the coolant flow rate is at a value where two valves' respective ranges overlap.

In some cases, determinations of the flow regime in block 4104 and determinations of the valve flow rate in block 4108 may be performed at different periods. For example, the valve flow rate 4108 may be updated more frequently to respond to fine-grained changes in the cooling needs of the data center.

Figure 43:
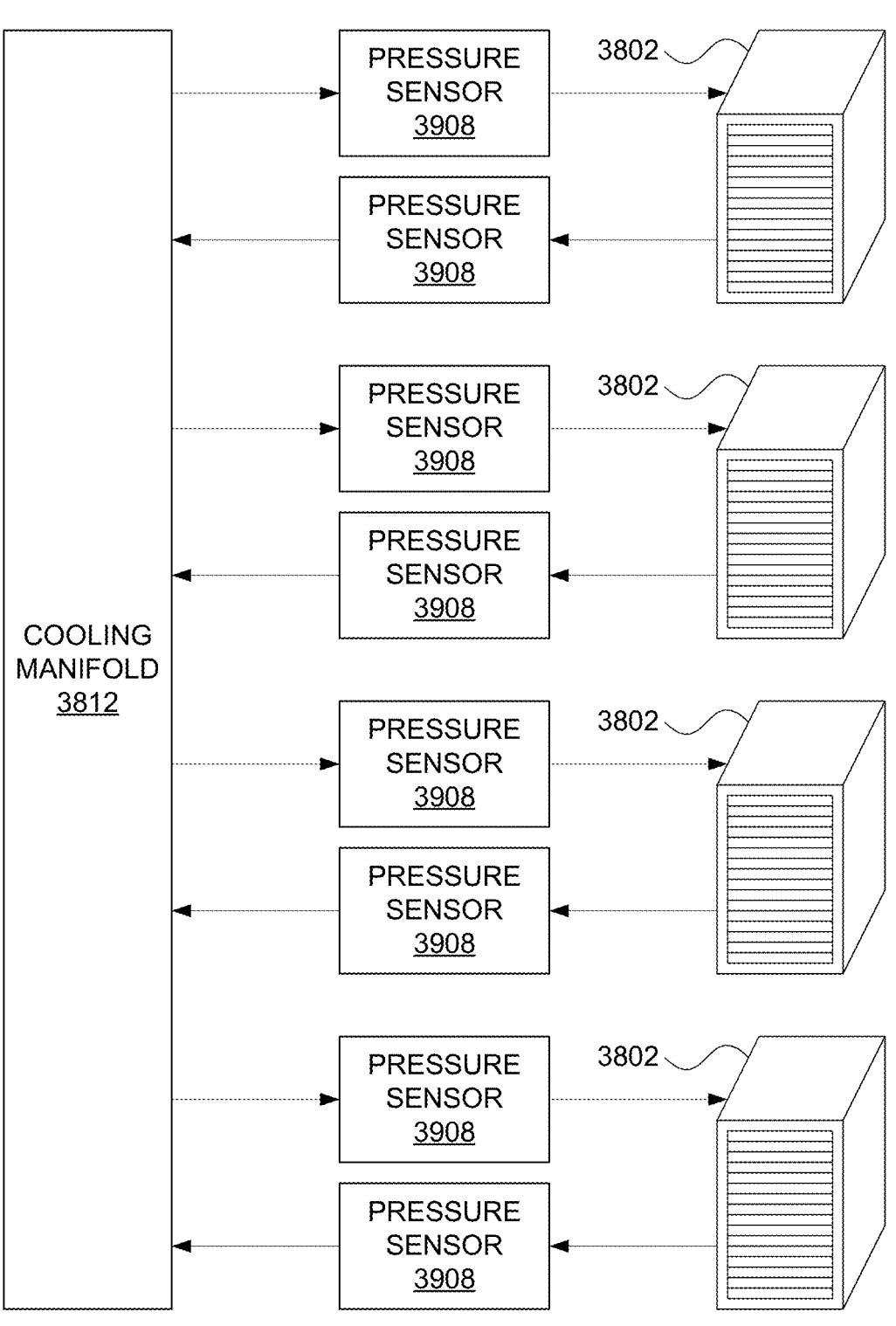
FIG. 43 illustrates cooling paths in a data center between a cooling manifold and server racks on a secondary coolant loop, in accordance with at least one embodiment.

FIG. 43 illustrates another view of the data center infrastructure layer 210. One or more racks may be cooled with internal coolant from manifolds 3812. The rack-side of the CDU 3816 forms a secondary cooling loop 3920 (also referred to herein as an "internal" loop). The secondary cooling loop pumps fresh, cool coolant from the CDU 3816 to an input manifold 3812. The input manifold 3812 distributes the cool coolant to the racks 3802, where it may take on waste heat from computing resources housed within the racks 3802. The coolant may leave the racks 3802 warmer than it entered, and is collected at an output manifold 3812. From the output manifold 3812, the warm coolant enters the CDU 3816, where the heat it carries is transferred to a primary cooling loop 3922 (also referred to herein as an "external" loop).

The primary cooling loop is shown between the CDU 3816 and the heat rejector 3818. The primary coolant transfers heat from the secondary cooling loop to heat rejector 3818. The heat rejector, such as a cooling tower or other form of chiller, may remove heat from the primary coolant and may transfer the heat to the environment. Cooled primary coolant leaves the heat rejector 3818 and returns to the CDU 3816.

Valve system 3900 controls the flow of primary coolant between the heat rejector 3818 and the CDU 3816. Although the valve system 3900 is shown as being positioned in the flow of cool coolant from the heat rejector 3818 on the way to the CDU 3816, the valve system 3900 may alternatively be positioned in the flow of warm coolant from the CDU 3816 to the heat rejector 3818.

The valve system 3900 may be controlled according to pressure differential information that is measured by the pressure sensors 3908. As shown, the pressure sensors 3908 may be positioned on the secondary coolant loop, with one pressure sensor 3908 measuring the pressure of coolant leaving the CDU 3816 and with the other pressure sensor measuring the pressure of coolant entering the CDU 3816. As described above, the difference between these two measurements may be correlated with the amount of heat that is being generated in the racks 3802, as coolant flow to non-operational computing resources may be turned off.

Thus, when the data center has relatively low loads and needs relatively little coolant flow, the valve system may select an appropriate flow control valve from the valve system (e.g., low-flow valve 3902) to manage primary coolant flow for the CDU 3816, even when the coolant flow rate may be lower than a range that the CDU 3816 is designed for.

Other variations are within spirit of present disclosure. Thus, while disclosed techniques are susceptible to various modifications and alternative constructions, certain illustrated embodiments thereof are shown in drawings and have been described above in detail. It should be understood, however, that there is no intention to limit disclosure to specific form or forms disclosed, but on contrary, intention is to cover all modifications, alternative constructions, and equivalents falling within spirit and scope of disclosure, as defined in appended claims.

Use of terms "a" and "an" and "the" and similar referents in context of describing disclosed embodiments (especially in context of following claims) are to be construed to cover both singular and plural, unless otherwise indicated herein or clearly contradicted by context, and not as a definition of a term. Terms "comprising," "having," "including," and "containing" are to be construed as open-ended terms (meaning "including, but not limited to,") unless otherwise noted. term "connected," when unmodified and referring to physical connections, is to be construed as partly or wholly contained within, attached to, or joined together, even if there is something intervening. Recitation of ranges of values herein are merely intended to serve as a shorthand method of referring individually to each separate value falling within range, unless otherwise indicated herein and each separate value is incorporated into specification as if it were individually recited herein. In at least one embodiment, use of term "set" (e.g., "a set of items") or "subset" unless otherwise noted or contradicted by context, is to be construed as a nonempty collection comprising one or more members. Further, unless otherwise noted or contradicted by context, term "subset" of a corresponding set does not necessarily denote a proper subset of corresponding set, but subset and corresponding set may be equal.

Conjunctive language, such as phrases of form "at least one of A, B, and C," or "at least one of A, B and C," unless specifically stated otherwise or otherwise clearly contradicted by context, is otherwise understood with context as used in general to present that an item, term, etc., may be either A or B or C, or any nonempty subset of set of A and B and C. For instance, in illustrative example of a set having three members, conjunctive phrases "at least one of A, B, and C" and "at least one of A, B and C" refer to any of following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present. In addition, unless otherwise noted or contradicted by context, term "plurality" indicates a state of being plural (e.g., "a plurality of items" indicates multiple items). In at least one embodiment, a number of items in a plurality is at least two, but can be more when so indicated either explicitly or by context. Further, unless stated otherwise or otherwise clear from context, phrase "based on" means "based at least in part on" and not "based solely on."

Operations of processes described herein can be performed in any suitable order unless otherwise indicated herein or otherwise clearly contradicted by context. In at least one embodiment, a process such as those processes described herein (or variations and/or combinations thereof) is performed under control of one or more computer systems configured with executable instructions and is implemented as code (e.g., executable instructions, one or more computer programs or one or more applications) executing collectively on one or more processors, by hardware or combinations thereof. In at least one embodiment, code is stored on a computer-readable storage medium. In at least one embodiment, in form of a computer program comprising a plurality of instructions executable by one or more processors. In at least one embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In at least one embodiment, code (e.g., executable code or source code) is stored on a set of one or more non-transitory computer-readable storage media having stored thereon executable instructions (or other memory to store executable instructions) that, when executed (i.e., as a result of being executed) by one or more processors of a computer system, cause computer system to perform operations described herein. A set of non-transitory computer-readable storage media, in at least one embodiment, comprises multiple non-transitory computer-readable storage media and one or more of individual non-transitory storage media of multiple non-transitory computer-readable storage media lack all of code while multiple non-transitory computer-readable storage media collectively store all of code. In at least one embodiment, executable instructions are executed such that different instructions are executed by different processors—in at least one embodiment, a non-transitory computer-readable storage medium store instructions and a main central processing unit ("CPU") executes some of instructions while a graphics processing unit ("GPU") executes other instructions. In at least one embodiment, different components of a computer system have separate processors and different processors execute different subsets of instructions.

Accordingly, in at least one embodiment, computer systems are configured to implement one or more services that singly or collectively perform operations of processes described herein and such computer systems are configured with applicable hardware and/or software that enable performance of operations. Further, a computer system that implements at least one embodiment of present disclosure is a single device and, in another embodiment, is a distributed computer system comprising multiple devices that operate differently such that distributed computer system performs operations described herein and such that a single device does not perform all operations.

Use of any and all examples, or exemplary language (e.g., "such as") provided herein, is intended merely to better illuminate embodiments of disclosure and does not pose a limitation on scope of disclosure unless otherwise claimed. No language in specification should be construed as indicating any non-claimed element as essential to practice of disclosure.

All references, including publications, patent applications, and patents, cited herein are hereby incorporated by reference to same extent as if each reference were individually and specifically indicated to be incorporated by reference and were set forth in its entirety herein.

In description and claims, terms "coupled" and "connected," along with their derivatives, may be used. It should be understood that these terms may be not intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification terms such as "processing," "computing," "calculating," "determining," or like, refer to action and/or processes of a computer or computing system, or similar electronic computing device, that manipulate and/or transform data represented as physical, such as electronic, quantities within computing system's registers and/or memories into other data similarly represented as physical quantities within computing system's memories, registers or other such information storage, transmission or display devices.

In a similar manner, term "processor" may refer to any device or portion of a device that processes electronic data from registers and/or memory and transform that electronic data into other electronic data that may be stored in registers and/or memory. As non-limiting examples, "processor" may be a CPU or a GPU. A "computing platform" may comprise one or more processors. As used herein, "software" processes may include, in at least one embodiment, software and/or hardware entities that perform work over time, such as tasks, threads, and intelligent agents. Also, each process may refer to multiple processes, for carrying out instructions in sequence or in parallel, continuously or intermittently. Terms "system" and "method" are used herein interchangeably insofar as system may embody one or more methods and methods may be considered a system.

In present document, references may be made to obtaining, acquiring, receiving, or inputting analog or digital data into a subsystem, computer system, or computer-implemented machine. In at least one embodiment, process of obtaining, acquiring, receiving, or inputting analog and digital data can be accomplished in a variety of ways such as by receiving data as a parameter of a function call or a call to an application programming interface. In some implementations, process of obtaining, acquiring, receiving, or inputting analog or digital data can be accomplished by transferring data via a serial or parallel interface. In another implementation, process of obtaining, acquiring, receiving, or inputting analog or digital data can be accomplished by transferring data via a computer network from providing entity to acquiring entity. References may also be made to providing, outputting, transmitting, sending, or presenting analog or digital data. In various examples, process of providing, outputting, transmitting, sending, or presenting analog or digital data can be accomplished by transferring data as an input or output parameter of a function call, a parameter of an application programming interface or interprocess communication mechanism.

Although discussion above sets forth example implementations of described techniques, other architectures may be used to implement described functionality, and are intended to be within scope of this disclosure. Furthermore, although specific distributions of responsibilities are defined above for purposes of discussion, various functions and responsibilities might be distributed and divided in different ways, depending on circumstances.

Furthermore, although subject matter has been described in language specific to structural features and/or methodological acts, it is to be understood that subject matter claimed in appended claims is not necessarily limited to specific features or acts described. Rather, specific features and acts are disclosed as exemplary forms of implementing the claims.

What is claimed is:

1. A system comprising:
a plurality of pressure sensors that measure a pressure differential of internal coolant between a first coolant line and a second coolant line;
a plurality of coolant flow control valves that control respective valve flow rates of external coolant for cooling the internal coolant; and
a processor that selects a valve from the plurality of coolant flow control valves to provide external coolant to an external coolant output, wherein the valve is selected based on the measured pressure differential exceeding a threshold pressure differential value corresponding to the selected valve.

2. The system of claim 1, further comprising a coolant distribution unit (CDU) and a heat rejector, wherein the external coolant output of the plurality of coolant flow control valves provides a coolant flow between the CDU and the heat rejector.

3. The system of claim 2, further comprising a dynamic heat load between the first coolant line and the second coolant line, wherein changes in the dynamic heat load correspond to changes in pressure differential.

4. The system of claim 3, wherein the dynamic heat load includes a plurality of processors which generate heat, wherein the dynamic heat load varies in accordance with a number of enabled processors of the plurality of processors.

5. The system of claim 3, wherein the CDU controls liquid-to-liquid heat transfer between an internal coolant that flows to the dynamic heat load and an external coolant that flows to the heat rejector.

6. The system of claim 5, wherein the plurality of pressure sensors measure pressures of the internal coolant and wherein the plurality of coolant flow valves control respective flow rates of the external coolant.

7. The system of claim 1, wherein the plurality of coolant flow control valves are arranged in parallel.

8. The system of claim 1, wherein coolant flow ranges of the plurality of coolant flow control valves overlap one another, and wherein the processor selects the valve from the plurality of coolant flow control valves with hysteresis on the measured pressure differential.

9. The system of claim 1, wherein the plurality of coolant flow control valves include a first valve that is enabled when the pressure differential is above a first threshold, a second valve that is enabled when the pressure differential is below a second threshold, and a third valve that is enabled when the pressure differential is between the first threshold and the second threshold.

10. A data center cooling system, comprising:
a plurality of racks, housing respective sets of selectively enabled processors, with an internal coolant;

a heat rejector with an external coolant;

a coolant distribution unit (CDU) that transfers heat from the internal coolant to the external coolant;

a plurality of coolant flow control valves that control respective valve flow rates of the external coolant;

a plurality of pressure sensors that measure a pressure differential of the internal coolant to the CDU and from the CDU; and a processor that selects a valve from the plurality of coolant flow control valves to control external coolant flow between the CDU and the heat rejector, wherein the valve is selected based on the measured pressure differential exceeding a threshold pressure differential value corresponding to the selected valve.

* * * * *